(12) United States Patent
Segawa et al.

(10) Patent No.: US 9,704,727 B2
(45) Date of Patent: Jul. 11, 2017

(54) EFEM

(71) Applicant: SINFONIA TECHNOLOGY CO., LTD., Tokyo (JP)

(72) Inventors: Mikio Segawa, Tokyo (JP); Yasushi Taniyama, Tokyo (JP); Mitsuo Natsume, Tokyo (JP); Atsushi Suzuki, Tokyo (JP); Toshihiro Kawai, Tokyo (JP); Kunihiko Sato, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 152 days.

(21) Appl. No.: 14/569,293

(22) Filed: Dec. 12, 2014

(65) Prior Publication Data
US 2015/0170945 A1   Jun. 18, 2015

(30) Foreign Application Priority Data

| Dec. 13, 2013 | (JP) | ................................ 2013-257817 |
| Dec. 27, 2013 | (JP) | ................................ 2013-270967 |
| Jan. 31, 2014 | (JP) | ................................ 2014-017820 |
| Jan. 31, 2014 | (JP) | ................................ 2014-017821 |

(51) Int. Cl.
H01L 21/677 (2006.01)
H01L 21/67 (2006.01)

(52) U.S. Cl.
CPC .. H01L 21/67017 (2013.01); H01L 21/67115 (2013.01); H01L 21/67766 (2013.01); H01L 21/67772 (2013.01); H01L 21/67778 (2013.01)

(58) Field of Classification Search
CPC ....................................................... B08B 5/00
See application file for complete search history.

(56) References Cited

U.S. PATENT DOCUMENTS

| 4,923,352 | A | * | 5/1990 | Tamura | .................. B25J 21/005 |
| | | | | | 29/722 |
| 5,303,482 | A | * | 4/1994 | Yamashita | ........ H01L 21/67769 |
| | | | | | 34/218 |
| 6,224,679 | B1 | | 5/2001 | Sasaki et al. | |
| 6,364,762 | B1 | * | 4/2002 | Kaveh | ............... H01L 21/67778 |
| | | | | | 454/187 |

(Continued)

FOREIGN PATENT DOCUMENTS

| JP | 11-251402 A | 9/1999 |
| JP | 2000-182949 A | 6/2000 |

(Continued)

*Primary Examiner* — Michael McCullough
*Assistant Examiner* — Mark Hageman
(74) *Attorney, Agent, or Firm* — Westerman, Hattori, Daniels & Adrian, LLP

(57) ABSTRACT

An EFEM includes a housing 3 that constitutes a wafer transport chamber 9 that is substantially closed by connecting load ports 4 to an opening 31*a* provided on a wall 31, and connecting a processing apparatus 6; a wafer transport apparatus 2, and transports a wafer between the processing apparatus 6 and the FOUPs 7 mounted on the load ports 4; a gas delivery port 11; a gas suction port 12; a gas feedback path 10; and a FFU 13 that includes a filter 13*b* that is provided in the gas delivery port 11, and eliminates particles contained in the delivered gas, wherein the gas in the wafer transport chamber 9 is circulated by generating a downward gasflow in the wafer transport chamber 9 and feeding back the gas through the gas feedback path 10.

17 Claims, 45 Drawing Sheets

(56) References Cited

U.S. PATENT DOCUMENTS

| | | | | |
|---|---|---|---|---|
| 7,065,898 B2 * | 6/2006 | Kim | ................... | H01L 21/67772 |
| | | | | 34/78 |
| 7,635,244 B2 * | 12/2009 | Sakiya | .............. | H01L 21/67017 |
| | | | | 414/217 |
| 8,186,927 B2 * | 5/2012 | Okabe | ............... | H01L 21/67276 |
| | | | | 414/217.1 |
| 9,105,673 B2 * | 8/2015 | Babbs | ................ | H01L 21/67201 |
| 2004/0105738 A1 | 6/2004 | Ahn et al. | | |
| 2006/0018736 A1 * | 1/2006 | Lee | ................... | H01L 21/67772 |
| | | | | 414/217 |

FOREIGN PATENT DOCUMENTS

| | | |
|---|---|---|
| JP | 2003-092244 A | 3/2003 |
| JP | 2012-049382 A | 3/2012 |

\* cited by examiner

Fig. 37
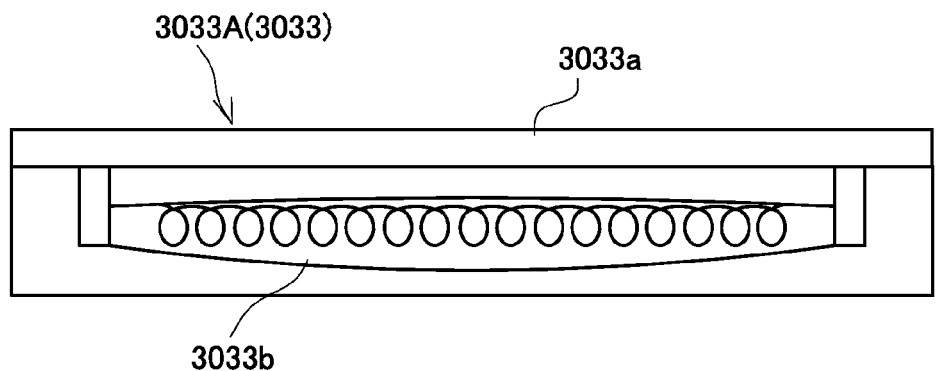
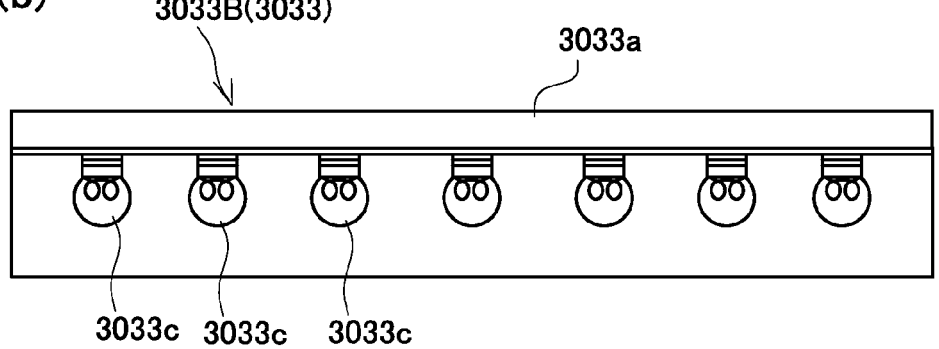
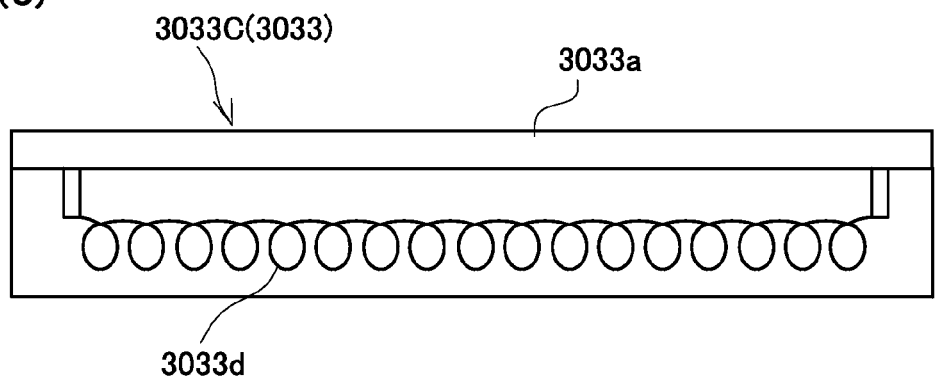

EFEM

CROSS-REFERENCE TO RELATED APPLICATIONS

This application claims priority of Japanese Patent Application No. 2013-257817 filed on Dec. 13, 2013, Japanese Patent Application No. 2013-270967 filed on Dec. 27, 2013, Japanese Patent Application No. 2014-017820 filed on Jan. 31, 2014, and Japanese Patent Application No. 2014-017821 filed on Jan. 31, 2014. The contents of the applications are incorporated herein by reference in their entirety.

BACKGROUND OF THE INVENTION

1. Field of the Invention

Embodiments of the present invention relate to an EFEM (Equipment Front End Module) capable of circulating gas in a wafer transport chamber without exposing a wafer to the outside air during transportation.

2. Description of the Related Art

Conventionally, production of semiconductors has been carried out by various processing steps performed on a wafer as a substrate. In recent years, circuit miniaturization and high integration of elements have been increasingly promoted. It has been required to maintain a high level of cleanliness around a wafer to prevent adhesion of water and particles to a surface of a wafer. Further, to prevent changes in properties of a surface of a wafer, such as oxidization, it has been performed to make a periphery of a wafer vacuum or nitrogen atmosphere that is an inert gas.

In order to properly maintain such an atmosphere around a wafer, a wafer is managed by placing in a sealable storage pod called a Front-Opening Unified Pod (FOUP), and nitrogen is filled inside the pod. Further, to transfer a wafer between a FOUP and a processing apparatus for processing a wafer, an equipment front end module (EFEM) as disclosed in Japanese Unexamined Patent Application Publication No. 2012-49382 is provided. An EFEM constitutes a wafer transport chamber that is substantially closed inside a housing, comprises a load port that functions as an interface unit between the FOUP on one of opposite wall surfaces, and is connected to a load lock chamber that is a part of a processing apparatus on the other of the wall surfaces. In a wafer transport chamber, a wafer transport apparatus for transporting a wafer is provided. By using a wafer transport apparatus, a wafer is loaded and unloaded between a load lock chamber and a FOUP connected to a load port.

In other words, a wafer is taken out of the FOUP (a load port) that is one transfer position by using the wafer transport apparatus, and transported to the load lock chamber that is the other transfer position. The processing apparatus performs processing for a wafer transported through the load lock chamber within a processing apparatus called a process chamber. After the processing is completed, the wafer is taken out through the load lock chamber, and returned to the FOUP.

The interior of the processing apparatus is set to a special atmosphere, a vacuum or the like in accordance with the processing, to enable quickly the processing for a wafer. The interior of the wafer transport chamber in the EFEM is kept in a clean air atmosphere at a high level of cleanliness by introducing the air cleaned through a chemical filter or the like, to prevent contamination due to adhesion of particles or the like to the surface of a wafer during transport.

In recent years, as the cleanliness has been advanced more and more, although the cleanliness is relatively high in the wafer transport chamber of EFEM, the influence of the air atmosphere different from the interior of a FOUP or a processing apparatus has been concerned.

In other words, the air atmosphere is likely to permit adhesion of moisture and oxygen to the surface of a substrate, causing corrosion and oxidation. Further, when a corrosive gas or the like used in the processing apparatus remains on the surface of a wafer, it may cause corrosion of a wiring material on the wafer surface and deterioration of yield. Further, a corrosion element accelerates a corrosion reaction, and when both moisture and corrosive gas are present, corrosion may develop faster.

In addition, in a configuration that when transferring a wafer, a purge unit provided in a load port supplies a FOUP with nitrogen or the like as an inert gas to pressurize the interior of the FOUP, thereby preventing the air atmosphere in the wafer transport chamber from entering the FOUP, it is necessary to continue the supply of nitrogen to the FOUP until the wafer transfer is completed. Thus, the supplied nitrogen flows out to the wafer transport chamber, causing a problem of an increase in the use amount of nitrogen and an increase in the cost.

To avoid such a problem, the interior of the wafer transport chamber may be set to a nitrogen atmosphere as in the FOUP. However, by simply setting a nitrogen atmosphere upon start of the wafer transportation, the cleanliness in the wafer transport chamber decreases as time passes, there occurs a possibility of adhesion of particles to the wafer surface during transportation in the chamber, and the influence of corrosive gas or the like used in the processing apparatus increases. Further, when the nitrogen is always supplied to the wafer transport chamber, the use amount of nitrogen increases further, and the cost increase is not solved.

In addition, the above problem arises similarly during transportation of substrates other than a wafer, as long as the transportation is done in an atmosphere different from the processing and storage location.

Embodiments of the present invention have been made to solve efficiently the above problems. In particular, it is an object of the invention to provide an EFEM that is able to suppress adhesion of particles to a wafer, and properly control the properties of the wafer surface without exposing a wafer during transportation to a change in the surface properties or an atmosphere that causes adhesion of particles, while avoiding an increase in the cost.

SUMMARY OF THE INVENTION

In order to achieve the above object, the present invention has taken the following measures.

An EFEM according to an embodiment of the invention comprises a housing that configures inside a wafer transport chamber that is substantially closed by respectively connecting a load port and a processing apparatus to openings provided on wall surface; a wafer transport apparatus that is provided in the wafer transport chamber, and transports a wafer between a FOUP mounted on the load port and the processing apparatus; a gas delivery port that is provided in an upper part of the wafer transport chamber, and delivers gas to the wafer transport chamber, a gas suction port that is provided in a lower part of the wafer transport chamber, and sucks the gas in the wafer transport chamber, a gas feedback path that feedbacks gas sucked through the gas suction port to the gas delivery port; and a filter that is provided in the gas delivery port, and eliminates particles included in the gas to be delivered, wherein the gas in the wafer transport chamber is circulated by generating a downward gasflow in the wafer transport chamber and feeding back the gas through the gas feedback path.

In such a configuration, by generating a downward gasflow in the wafer transport chamber and circulating gas through the gas feedback path, the wafer transport chamber is set to a substantially closed space, and can be maintained in an appropriate gas atmosphere. Thus, it is possible to transport a wafer without exposing to the outside air, and suppress adhesion of particles. Further, as a filter is provided in the gas delivery port, it is possible to eliminate the particles while circulating the gas. As the downward gasflow is being generated in the wafer transport chamber, it is possible to eliminate the particles adhered to the wafer surface, and prevent the particles from floating in the wafer transport chamber. It is also possible to suppress the consumption of gas, and reduce the cost by circulating the gas.

In order to ensure a large flow path area without changing the appearance, prevent an interference with apparatus such as a load lock chamber outside the EFEM, suppress an increase in the number of parts, and suppress an increase in the production cost, it is preferable that a space between a wall of the housing and a partition member provided inside the wall is made as a part of the gas feedback path, and the wafer transport chamber and the gas feedback path are separated by the partition member.

In order to effectively use a dead space outside a driving area of the wafer transport apparatus, and ensure the flow rate of gas while preventing an interference with wafer transportation, it is preferable to provide an opening that connects the load port and an opening that connects the processing apparatus at opposite positions in the housing, respectively, and to configure the gas feedback path to be continued to the gas delivery port via both sides of the opening that connects the gas suction port to the processing apparatus.

In order to smoothly perform the circulation of the gas flowing in the wafer transport chamber and gas feedback path, it is desirable that a first blowing means is connected to the gas delivery port, a second blowing means is connected to the gas suction port, the gas is delivered to the wafer transport chamber from the gas delivery port by the first blowing means, and the gas in the wafer transport chamber is sucked through the gas suction port by the second blowing means.

Further, in order to replace the inside of the wafer transport chamber to an appropriate gas atmosphere, prevent a decrease in yield caused by adhesion of oxygen gas, moisture and the like to the wafer surface disturbing the wafer processing, and maintain the state of the inside of the wafer transport chamber constant by supplying the flowed amount of gas when a part of the nitrogen in the wafer transport chamber flows out, it is effective to further provide a gas supply means that supplies gas to the wafer transport chamber, and a gas discharge means that discharges the gas from the wafer transport chamber.

In order to eliminate the molecular contaminants that are generated during processing or the like in the processing apparatus and flowed into the wafer transport chamber, it is desirable to provide a chemical filter in the gas suction port, and to flow the gas in the wafer transport chamber into the gas feedback path through the chemical filter.

In order to place the wafer transport apparatus and the gas suction port without interfering with each other, and to prevent the particles from floating due to a gasflow turbulence caused by failing to prevent a downward gasflow in the wafer transport chamber, it is preferable to support the wafer transport chamber on the wall of the housing.

In order to suppress a change in the properties of the wafer surface caused by oxygen, moisture and the likes, and to prevent a decrease in yield, it is preferable to use an inert gas as the gas.

According to the invention described above, it is possible to provide an EFEM that is able to suppress adhesion of particles to a wafer, and to properly control the properties of the wafer surface, without exposing a wafer during transportation to a change in the surface properties or an atmosphere that causes adhesion of particles, while avoiding an increase in the cost.

BRIEF DESCRIPTION OF THE DRAWINGS

FIGS. 37(a)-(c) are explanatory diagrams schematically showing a configuration of a heater of the substrate transport apparatus.

MODES FOR CARRYING OUT THE INVENTION

Hereinafter, embodiments of the present invention will be described with reference to the drawings.

First Embodiment

Figure 1:
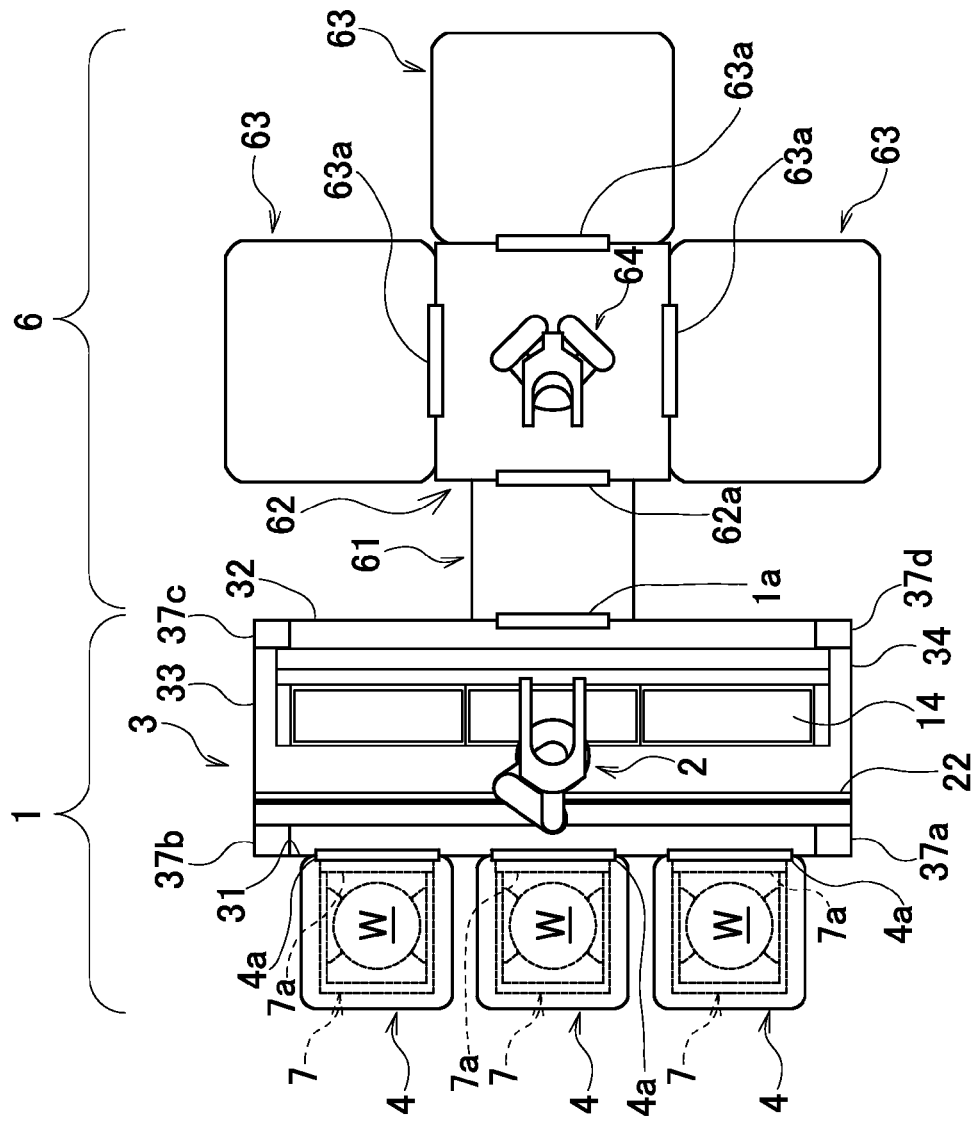
FIG. 1 is a plan view schematically showing a relationship between an EFEM according to a first embodiment of the present invention, and a processing apparatus.
Figure 2:
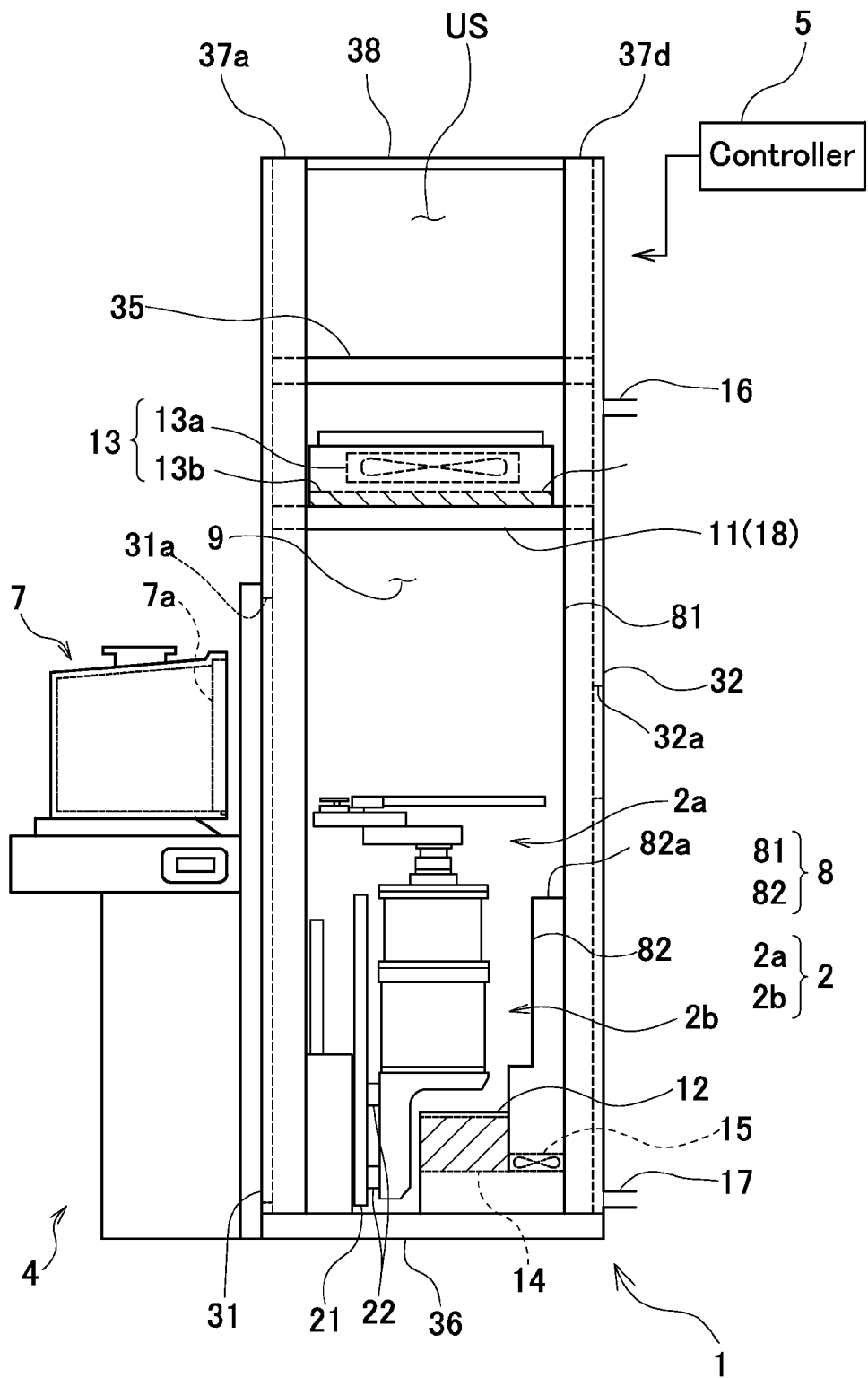
FIG. 2 is a side view showing the state that a sidewall of the EFEM is removed.

FIG. 1 is a plan view schematically showing the relationship between an EFEM 1 according to a first embodiment of the invention and a processing apparatus 6 connected thereto, in which a top panel or the like is removed to reveal the interior. FIG. 2 is a side view of the EFEM 1, in which a sidewall is removed to reveal the interior. As shown in FIGS. 1 and 2, the EFEM 1 comprises a wafer transport apparatus 2 that transports a wafer W between predetermined transfer positions, a box-shaped housing 3 that is provided so as to surround the wafer transport apparatus 2, a plurality of load ports 4 (three in the drawing) that is connected to the outside of a wall of the front side (a front wall 31) of the housing 3, and a controller 5.

In the present application, when viewed from the housing 3, a direction of the side connected to the load port 4 is defined as a front, a direction of a rear wall 32 opposite to the front wall 31 is defined as a rear, and a direction perpendicular to the longitudinal and vertical directions is defined as a side. In other words, three load ports 4 are arranged side by side on the side.

The EFEM 1 is, as shown in FIG. 1, configured to be connected to a load lock chamber 61, that configures a part of a processing apparatus 6, adjacent to the outside of a rear wall 32. It is possible to communicate the inside of the EFEM 1 and the load lock chamber 61 by opening a door 1a provided between the EFEM 1 and the load lock chamber 61. A variety of devices can be used as the processing apparatus 6, generally a transport chamber 62 is provided adjacent to the load lock chamber 61, and a plurality of processing units 63 (three in the drawing) for processing a wafer W is provided adjacent to the transport chamber 62. Doors 62a and 63a are provided between the transport chamber 62, the load lock chamber 61, and the processing units 63. It is possible to communicate the transport chamber, the load lock chamber, and the processing units by opening the doors. It is possible to move a wafer W between the load lock chamber 61 and the processing units 63 by using a transport robot 64 provided in the transport chamber 62.

The wafer transport apparatus 2 is, as shown in FIG. 1 and FIG. 2, comprises an arm part 2a having a pick for mounting and transporting a wafer W, and a base part 2b having a driving mechanism and a lifting mechanism that support the arm part 2a from below for operating the arm part. The base part 2b is supported on the front wall 31 via a support part 21 and a guide rail 22. The wafer transport apparatus 2 is configured to be movable along the guide rail 22 extending in the width direction within the housing 3. The controller 5 controls the operation of the wafer transport apparatus 2, thereby transporting a wafer W housed in a FOUP 7 mounted on the load ports 4 provided side by side in the lateral direction to the load lock chamber 61, and transporting the wafer W again to the FOUP 7 after being processed by the processing unit 63.

Figure 3:
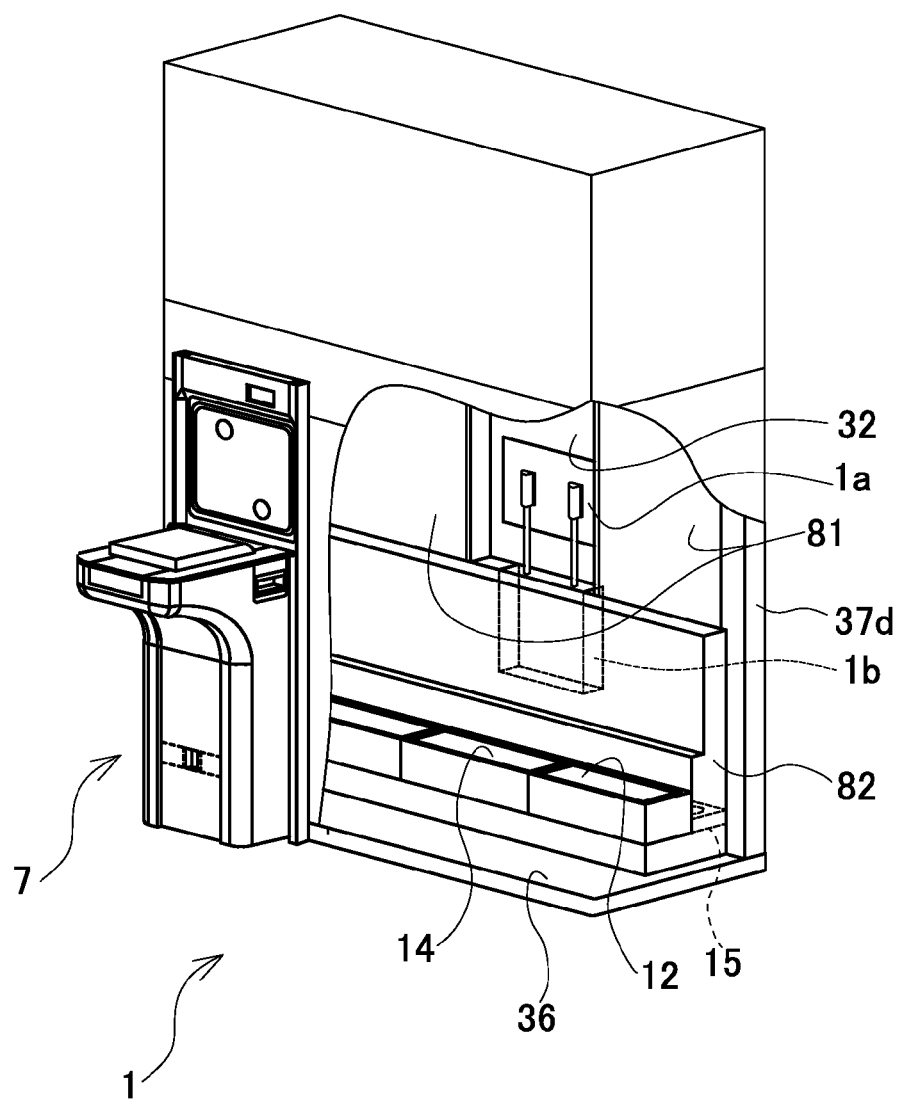
FIG. 3 is a perspective view of the EFEM with a part broken away.

The housing 3 comprises a front wall 31, a rear wall 32, sidewalls 33 and 34 surrounding the four sides of the wafer transport apparatus 2, a ceiling wall 35, a bottom wall 36, and columns 37a to 37d supporting the housing walls 31 to 35. A substantially closed space CS is formed inside the housing by that the load ports 4 are connected to the opening 31a provided in the front wall 31 and the load lock chamber 61 is connected to the rectangular opening 32a provided in the rear wall 32. The members described above are precisely mounted so as not to produce a gap between the members through which gas flows out. It may be configured to enhance airtightness in the housing 3 by providing a sealing member between the members. The opening 32a provided in the rear wall 32 has a drive mechanism 1b, and is able to close the door 1a (refer to FIG. 3) called a gate valve that is driven up and down. Although illustration and description are omitted, openings are also provided in the sidewalls 33 and 34. One opening is connected to an aligner that is used for adjusting the position of a wafer W, and the other is usually closed for maintenance.

The load port 4 has a door 4a. The door 4a connects and moves with a lid part 7a provided in the FOUP 7, and the FOUP 7 is opened to a substantially closed space CS. The FOUP 7 includes a number of mounting parts in the vertical direction for storing a number of wafers W. Further, the FOUP is usually filled with nitrogen, and the atmosphere in the FOUP 7 can be replaced to nitrogen through the load port 4 under the control of the controller 5.

The controller 5 is configured as a controller unit provided in an upper space US located between the ceiling wall 35 of the housing 3 and a top panel 38 above the ceiling wall, and controls the driving of the wafer transport apparatus 2, the replacement of nitrogen of the FOUP 7 by the load ports 4, the opening and closing of the doors 1a and 4a, and the circulation of nitrogen or the like in the housing 3. The controller 5 is comprises a common microprocessor or the like comprising a CPU, a memory, and an interface. The memory previously stores programs necessary for the processing, and the CPU sequentially retrieves and executes the necessary programs, and achieves intended functions in cooperation with peripheral hardware resources. The nitrogen circulation control will be described later.

Figure 4:
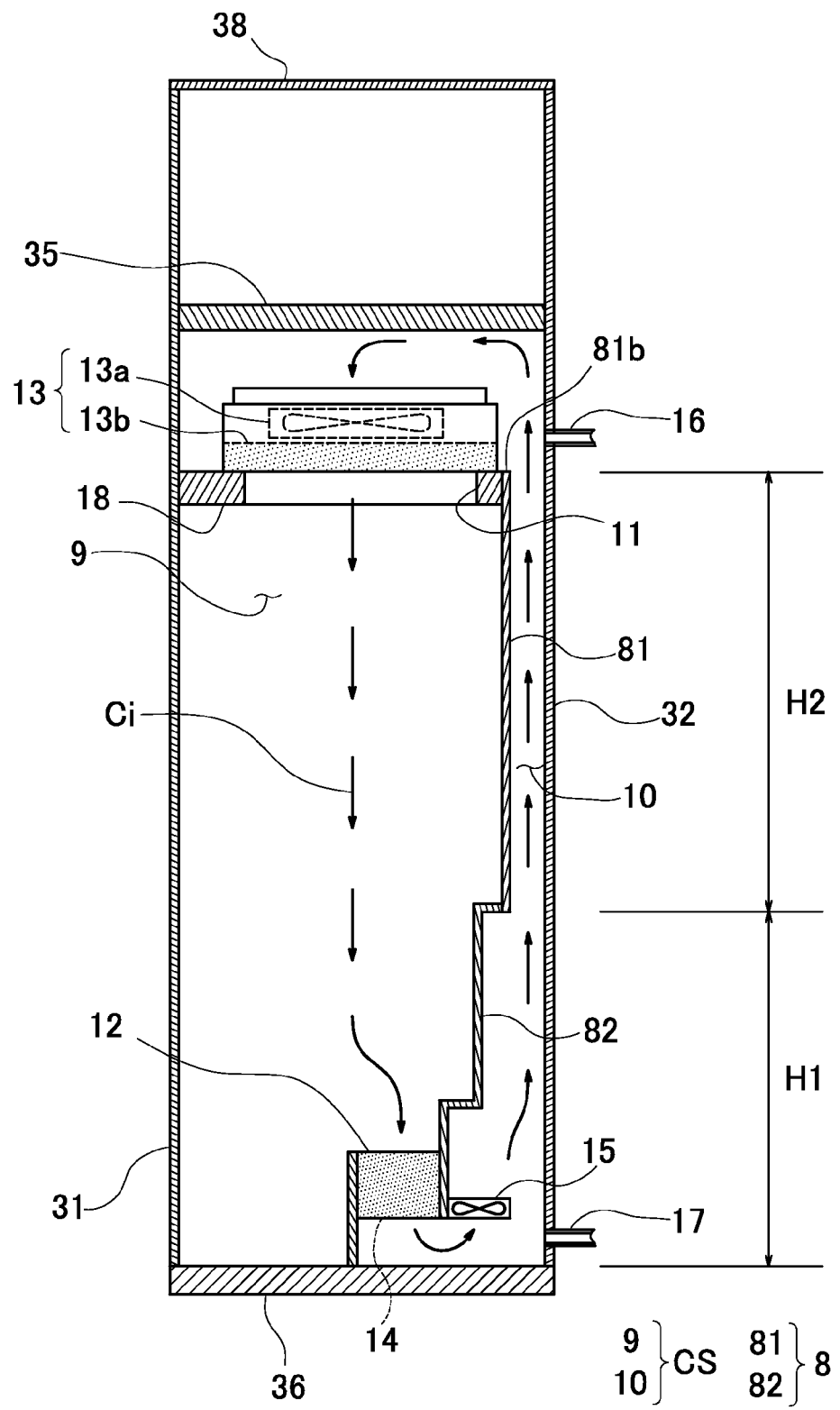
FIG. 4 is a schematic diagram showing the flow of gas in a circulation path of the EFEM.

The substantially closed space CS is, as shown in FIG. 4, divided into a wafer transport chamber 9, that is a space where the wafer transport apparatus 2, and a gas feedback path 10 by a partition member 8. The wafer transport chamber 9 and the gas feedback path 10 communicate in a gas delivery port 11 provided extending in the width direction in the upper part of the wafer transport chamber 9, and a gas suction port 12 provided extending in the width direction in the lower part of the wafer transport chamber 9. The gas delivery port 11 and the gas suction port 12 generate a downward gasflow in the wafer transport chamber 9, and cause an upward gasflow in the gas feedback path 10, thereby forming a circulation path Ci that is indicated in FIG. 4 by the arrow in the substantially closed space CS to permit the circulation of gas. At this time, the wafer transport chamber 9 becomes a space closed by the front wall 31, the rear wall 32 (including the door 1a, refer to FIG. 3), the load port 4 (including the door 4a), the sidewalls 33 and 34, the bottom wall 36, and the partition member 8. In this embodiment, nitrogen as an inert gas is circulated in the substantially closed space CS, but the circulating gas is not limited to this, and other gases can be used.

Next, a configuration of the gas feedback path 10 will be described in detail. As shown in FIG. 4, the gas feedback path 10 is a space closed by the bottom wall 36, the rear wall 32, the ceiling wall 35, and the partition member 8, and is provided to feedback the gas is sucked through the gas suction port 12 in the lower part of the wafer transport chamber 9 to the gas delivery port 11 in the upper part of the wafer transport chamber 9.

A gas supply means 16 for introducing nitrogen into the substantially closed space CS is connected to the upper part on the rear side of the feedback path 10, and it is possible to control stop of supply and supply of nitrogen based on an instruction from the controller 5 (refer to FIG. 2). Thus, when a part of nitrogen flows out of the substantially closed space CS, it is possible to maintain the nitrogen atmosphere in the substantially closed space CS constant by the gas supply means 16 supplying the flowed amount of gas. Further, a gas discharge means 17 for discharging the gas in the substantially closed space CS is connected to the lower part on the rear side, and it is possible to communicate the interior of the substantially closed space CS with a gas discharge destination provided outside by opening a not-shown shutter based on an instruction from the controller 5. It is possible to replace the substantially closed space CS to a nitrogen atmosphere by using in combination with the nitrogen supply of the gas supply means 16. In this embodiment, as nitrogen is used as the gas for circulating through the circulation path Ci, the gas supply means 16 supplies nitrogen, but when circulating other gases, the gas supply means 16 supplies the circulating gas.

In the gas delivery port 11, a fan filter unit 13 (FFU 13) comprising a filter 13b and a fan 13a as a first blowing means is provided to eliminate the particles contained in the gas circulating in the substantially closed space CS, and cause a downward gasflow in the wafer transport chamber 9 by blowing gas downward in the wafer transport chamber 9. The FFU 13 is supported by a support member 18 that is connected to the partition member 8, and extends in the horizontal direction.

On the other hand, a chemical filter 14 is connected to the gas suction port 12, so that the gas in the wafer transport chamber 9 flows into the gas feedback path 10 through the chemical filter 14. As described above, since the wafer transport apparatus 2 (refer to FIG. 2) is configured to be supported on the front wall 31 of the housing 3 via the support part 21 and the guide rail 22, the gas suction port 12 can be opened widely upward without interfering with the wafer transport apparatus 2. Further, as described above, since the gas suction port 12 is provided extending in the width direction, it is possible to effectively eliminate particles generated when the wafer transport apparatus 2 is driven along the guide rails 22 provided extending likewise in the width direction. By providing the chemical filter 14 in the gas suction port 12, it is possible to eliminate molecular contaminants that are generated by the processing or the like in the processing apparatus 6 (refer to FIG. 1), and flowed into the wafer transport chamber 9. Further, a fan 15 as a second blowing means is provided in the width direction behind the chemical filter 14 in the gas feedback path 10 (refer to FIG. 5), so that when the fan 15 blows gas downward in the gas feedback path 10, that is, upward in FIG. 4, a gas suction force is generated in the gas suction port 12, the gas passing through the chemical filter 14 is sent upward, causing an upward gasflow in the gas feedback path 10.

By the fan 15 and the aforementioned fan 13a of the FFU 13, the gas in the substantially closed space CS is circulated by flowing downward in the wafer transport chamber 9 and flowing upward in the gas feedback path 10. As the gas delivery port 11 opens downward, the FFU 13 delivers the gas downward. As the suction port 12 opens upward, it can suck the gas downward without disturbing the downward gasflow generated by the FFU 13. Thus, it is possible to create a smooth gas flow. Further, as a downward gasflow occurs in the wafer transport chamber 9, it is possible to eliminate the particles adhered to the surface of wafer W, and to prevent the particles from floating in the wafer transport chamber 9.

Figure 6:
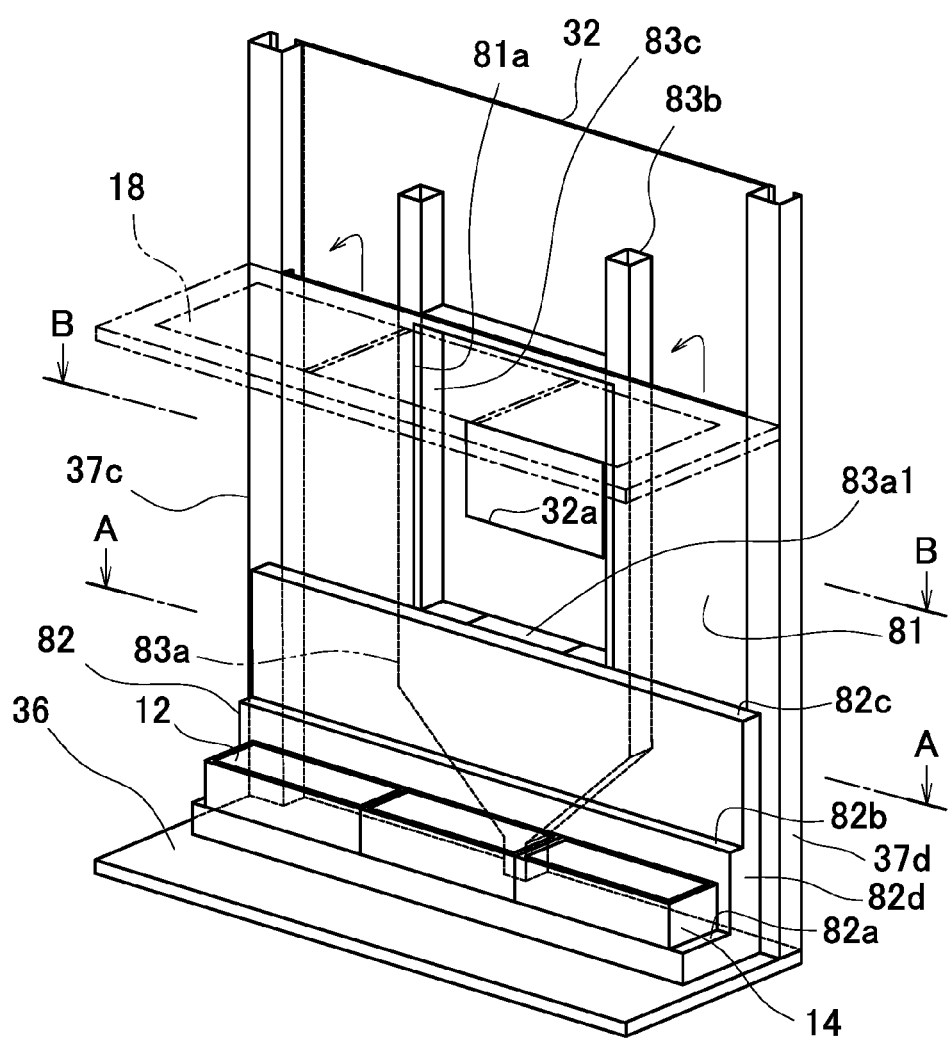
FIG. 6 is an enlarged perspective view of an essential part showing component members of a gas feedback path of the EFEM.
Figure 7:
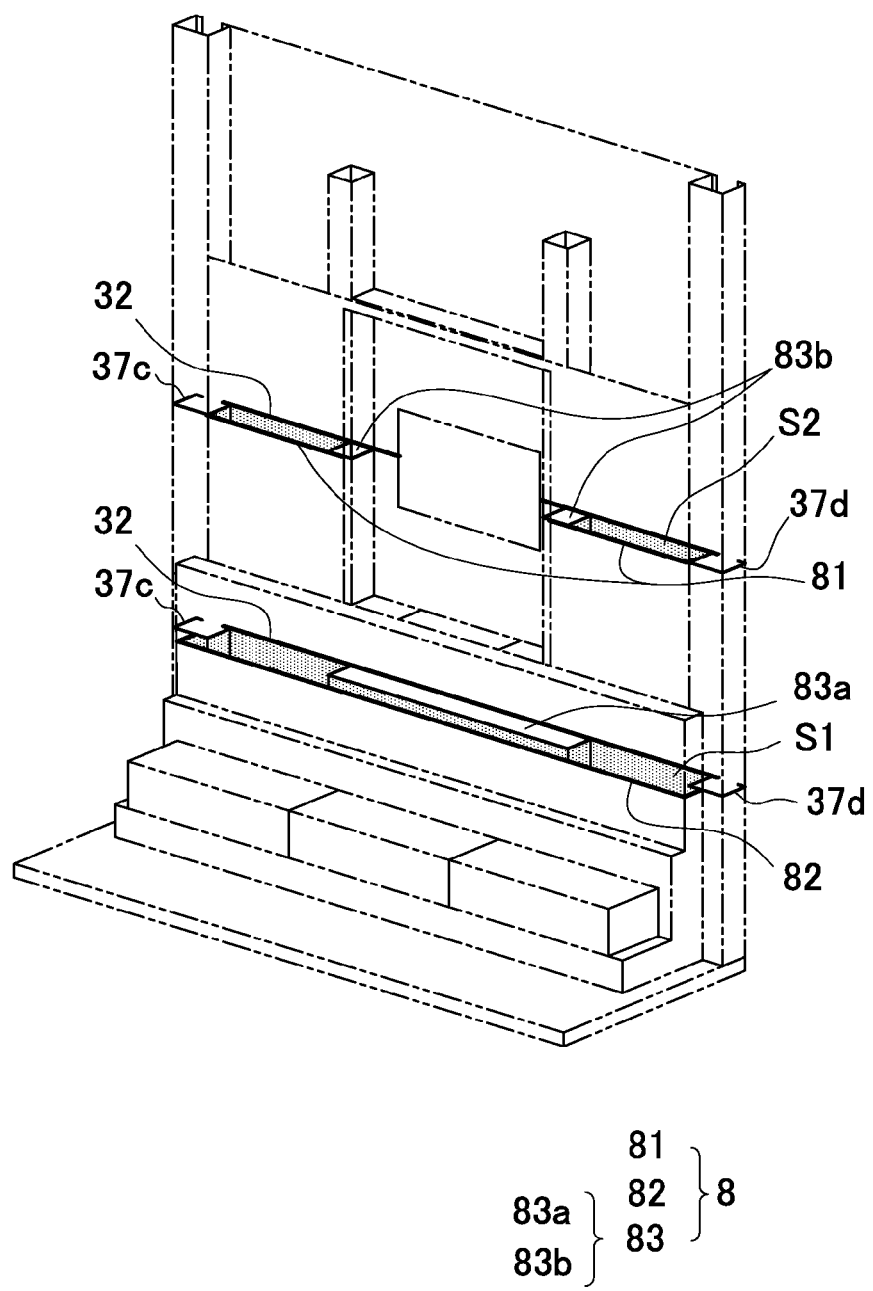
FIG. 7 is a perspective view showing a cross section of a gas feedback path in A-A position and B-B position of FIG. 6

A gas flow route in the gas feedback path 10 will be described in detail using FIG. 6 and FIG. 7. FIG. 6 is an enlarged perspective view of the gas feedback path 10. FIG. 7 is a perspective view showing the cross sections in the positions A-A and B-B shown in FIG. 6.

As shown in FIG. 6, the partition member 8 comprises three members, an upper partition member 81, a lower partition member 82, and a middle member 83. In particular, the upper partition member 81 is a flat plate-shaped member having a rectangular opening 81a larger than the opening 32a of the rear wall 32 at the center, that is provided inside the rear wall 32 so as to along therewith, whose side end is adjacent to the columns 37c and 37d, and an upper end is connected to the aforementioned support member 18 (refer to FIG. 4).

The lower partition member 82 is a step-like member having three steps rearward, a lower step 82a, a middle step 82b, and an upper step 82c, that is formed across the width direction so as to contact the columns 37c and 37d from the front on the bottom wall 36, and is provided with a side plate 82d at both ends in the width direction, thereby forming a closed space inside. In the upper part of the lower step 82a, the chemical filter 14 is connected, and the gas suction port 12 is formed. The upper step 82c contacts the lower end of the upper partition member 81 (refer to FIG. 4).

The middle member 83 is shaped to have the same thickness as the columns 37c and 37d in the longitudinal direction, and located below the opening 32a of the rear wall 32. The middle member is connected to a shunt portion 83a that has a section whose width increases as going upward in the front view, and an H-shaped portion 83b that is configured in an H-shape by being arranged on the left and right sides and above the opening 32a so as to avoid the opening 32a of the rear wall 32, thereby forming an opening 83c approximately the same size of the opening 81a of the upper partition member 81. The interior of the shunt portion 83a is hollow, and provided with the drive mechanism 1b, that opens and closes the opening 32a by moving up and down the door 1a (refer to FIG. 3) through an opening 83a1 provided on the upper surface. The upper surface of the shunt portion 83a is the same height as the upper step 82c of the lower partition member 82, and the upper end of the H-shaped portion 83b contacts the ceiling wall 35.

Figure 5:
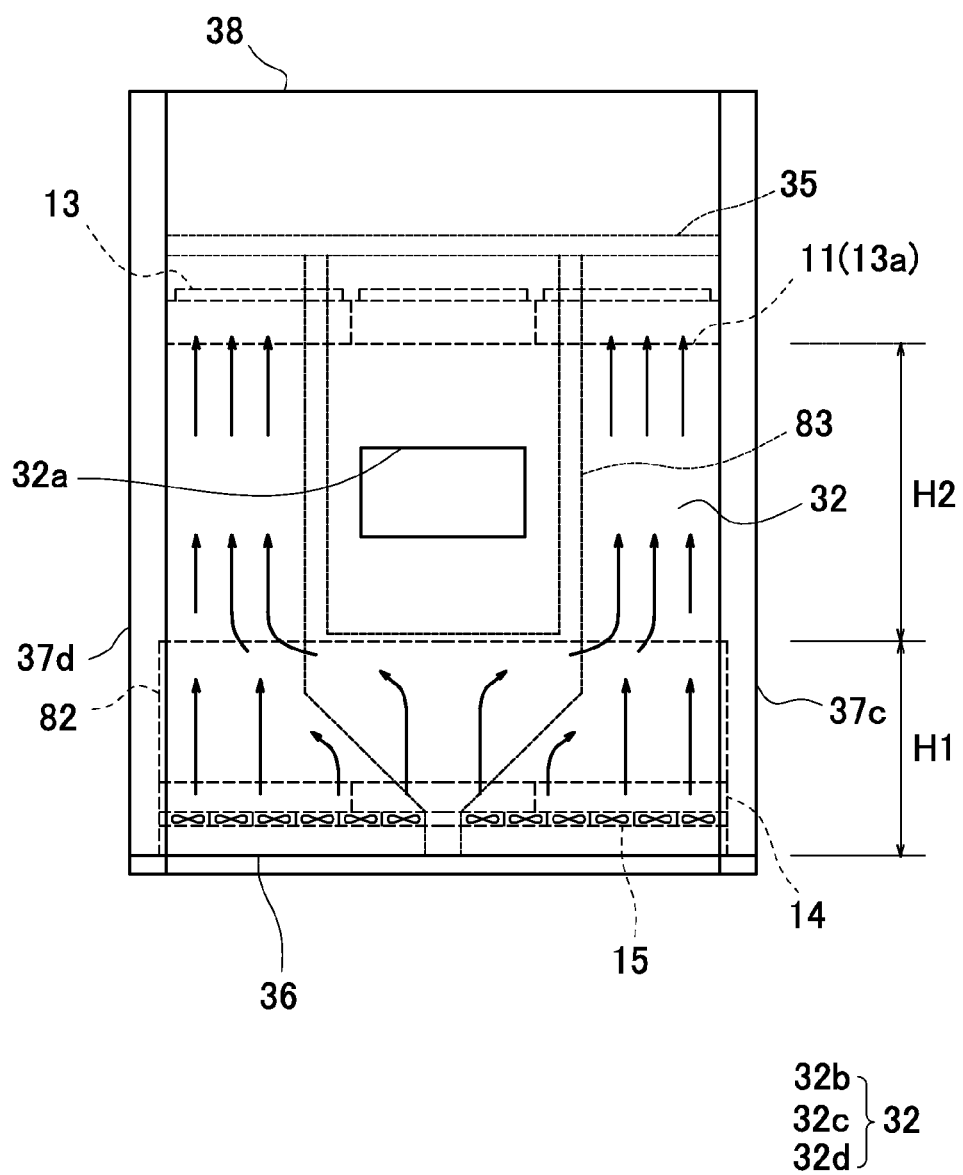
FIG. 5 is a rear view of the EFEM seen from a processing apparatus.

By the partition member 8 configured as described above, the gas being sent upward by the fan 15 (refer to FIG. 4) provided inside the lower partition member 82 flows in a path surrounded by the lower partition member 82, the rear wall 32, the shunt portion 83a of the middle member 83, and the columns 37c and 37d, on the lower side of the upper step 82c of the lower partition member 82, as indicated by the cross section S1 in FIG. 7. On the upper side of the upper step 82c of the lower partition member 82 (refer to FIG. 6), as indicated by the cross section S2 in FIG. 7, the gas flows by branching to a path surrounded by the upper partition member 81, the rear wall 32, the H-shaped portion 83b of the middle member 83, and the column 37c (a path on the left side in FIG. 7), and a path surrounded by the upper partition member 81, the rear wall 32, the H-shaped portion 83b of the middle member 83, and the column 37c (a path on the right side in FIG. 7). In other words, as shown in FIG. 5, the gas can flow over the width direction in the section H1, and can flow on both sides of the middle member 83 in the section H2.

In such a configuration, it is possible to provide a dead space outside the driving area of the wafer transport apparatus 2 in the housing 3, while ensuring a large flow path area of the gas feedback path 10. Thus, it is unnecessary to change the appearance, and it is possible to prevent the members constituting the gas feedback path 10 from interfering with the devices outside the EFEM 1 such as the load port 4 and the load lock chamber 61. In particular, as shown in FIG. 2, since the area under the upper step 82a of the lower partition member 82, that is the section H1 in FIG. 4 and FIG. 5, is located under the area where the arm part 2a of the wafer transport apparatus 2 moves, in cooperation with the wafer transport apparatus 2 being supported on the front wall 31 of the housing 3 through the support part 21 and the guide rail 22, the lower partition member 82 is allowed to project forward stepwise along the shape of the base part 2b, the gas suction port 12 can open widely upward, and the flow path area of the gas feedback path 10 can be ensured. On the other hand, although the section H2 in FIG. 4 and FIG. 5 includes a height area where the arm part 2a of the wafer transport apparatus 2 moves, since the arm part 2a avoids the space around the opening 32a required to transport a wafer W, particularly, a flow path of the gas feedback path 10 is set using the left and right space of the opening 32a, a moving space of the arm 2a is ensured, while avoiding interference with the wafer W transport path. Further, the flow path provided on the left and right sides of the opening 32a is provided in the thickness range in the longitudinal direction of the columns 37c and 37d, avoiding the door 1a (refer to FIG. 3) for closing the opening 32a and the drive mechanism 1b that opens and closes the door 1a (refer to FIG. 7). As the gas feedback path 10 is formed using the rear wall 32 as a part of the housing 3 and the columns 37c and 37d, it is possible to impart strength to the structure constituting the gas feedback path 10, and suppress an increase in the production cost without increasing the number of parts.

Next, in the EFEM 1 configured as described above, the nitrogen circulation control for circulating nitrogen will be described using FIG. 4.

First, as an initial step, the controller 5 causes a gas discharge means 17 to discharge gas, and causes a gas supply means 16 to supply nitrogen to the substantially closed space CS, thereby purging the substantially closed space CS of the EFEM 1 to a nitrogen atmosphere. After this step, when the nitrogen in the circulation path Ci leaks outside, the controller 5 causes the gas supply means 16 to supply the leaked amount of nitrogen.

In the substantially closed space CS that has been set in a nitrogen atmosphere as described above, the controller 5 drives the fan 13a of the FFU 13 and the fan 15, thereby causing a circulation of gas in the circulation path Ci. At this time, the filter 13b of the FFU 13 and the chemical filter 14 eliminate the particles and molecular contaminants contained in the gas, and a downward flow of clean nitrogen always occurs in the wafer transport chamber 9.

In the EFEM 1 that has been set to the above state, the wafer transport chamber 9 communicates with the FOUP 7 that is mounted on the load port 4 and purged to a nitrogen atmosphere, and when loading and unloading the wafer W, the wafer transport chamber 9 and FOUP 7 are in the same nitrogen atmosphere, and the nitrogen in the wafer transport chamber 9 is kept clean. Thus, it is unnecessary to set the interior of the FOUP 7 to a positive pressure with respect to the wafer transport chamber 9 to prevent ingress of particles and molecular contaminants into the FOUP 7, and it is possible to suppress the consumption of nitrogen to purge the FOUP 7.

Further, by opening the door 1a provided between the wafer transport chamber 9 and load lock chamber 61 (refer to FIG. 1), the wafer transport chamber 9 communicates with the load lock chamber 61. When loading and unloading the wafer W into/from the load lock chamber 61, although there is a possibility that the particles and molecular contaminants adhered to the wafer W during the processing in the processing apparatus 6, or the particles and molecular contaminants present in the load lock chamber 61 enter the wafer transport chamber 9, these particles and molecular contaminants are flowed downward by the downward gasflow in the wafer transport chamber 9, and cleaned by the chemical filter 14 and the filter 13b of the FFU 13 while passing through the gas feedback path 10. The particles and molecular contaminants do not reenter the wafer transport chamber 9, and it is possible to effectively reduce the adverse effects on the wafer W during transportation.

As described above, the EFEM 1 in this embodiment comprises a housing 3 that constitutes inside a wafer transport chamber 9 that is substantially closed by connecting load ports 4 to an opening 31a provided on a front wall 31 that is a wall surface, and connecting a processing apparatus 6 to an opening 32a provided on a rear wall 32 that is a wall surface; a wafer transport apparatus 2 that is disposed in the wafer transport chamber 9, and transports a wafer between the processing apparatus 6 and the FOUPs 7 mounted on the load ports 4; a gas delivery port 11 that is provided in the upper part of the wafer transport chamber 9, and delivers gas to the wafer transport chamber 9; a gas suction port 12 that is provided in the lower part of the wafer transport chamber 9, and sucks the gas in the wafer transport chamber 9; a gas feedback path 10 that feeds back the gas sucked through the gas suction port 12 to the gas delivery port 11; and a FFU 13 that includes a filter 13b that is provided in the gas delivery port 11, and eliminates the particles contained in the delivered gas, wherein the gas in the wafer transport chamber 9 is circulated by generating a downward gasflow in the wafer transport chamber 9 and feeding back the gas through the gas feedback path 10.

In such a configuration, the wafer transport chamber 9 is set to a substantially closed space by generating a downward gasflow in the wafer transport chamber 9 and circulating gas through the gas feedback path 10, and the interior of the wafer transport chamber 9 can be maintained in a nitrogen atmosphere. Thus, it is possible to transport a wafer W without exposing to the outside air, and suppress adhesion of particles. Further, since the FFU 13 having a filter 13b is provided in the gas delivery port 11, it is possible to eliminate particles while circulating nitrogen. Since a downward gasflow is generated in the wafer transport chamber 9, it is possible to eliminate the particles adhered to the wafer W surface, and prevent the particles from floating in the wafer transport chamber 9. It is possible to suppress the consumption of nitrogen by circulating nitrogen, and reduce the cost.

Since the space between the rear wall 32 of the housing 3 and the partition member 8 provided inside the rear wall 32 forms a part of the gas feedback path 10, and the wafer transport chamber 9 and the gas feedback path 10 are separated by the partition member 8, it is possible to ensure a large flow path area without changing the appearance, prevent interference with the devices outside the EFEM 1, such as the load lock chamber 61, and suppress an increase in the production cost by decreasing the number of parts.

Further, the opening 31a for connecting the load ports 4 and the opening 32a for connecting the processing apparatus 6 are provided in the opposite positions in the housing 3, and the gas feedback path 10 is configured to be continued to the gas delivery port 11 from the gas suction port 12 via both sides of the opening 32a for connecting the processing apparatus 6. Thus, it is possible to effectively use the dead space outside the driving area of the wafer transport apparatus 2, and ensure the flow rate of gas while preventing interference with the transport of the wafer W.

The FFU 13 having the fan 13a as a first blowing means is connected to the gas delivery port 11, the fan 15 as a second blowing means is connected to the gas suction port 12, so that the FFU 13 sends gas to the wafer transport chamber 9 through the gas delivery port 11, and the fan 15 sucks the gas in the wafer transport chamber 9 through the gas suction port 12. Thus, it is possible to smoothly circulate the gas flowing through the wafer transport chamber 9 and the feedback path.

In addition, the gas supply means 16 for supplying nitrogen to the wafer transport chamber 9, and the gas discharge means 17 for discharging the gas from the wafer transport chamber 9 are provided. It is possible to replace the interior of the wafer transport chamber 9 to an appropriate gas atmosphere, and prevent a decrease in yield caused by adhesion of oxygen gas, moisture or the like to the wafer W surface disturbing the processing of the wafer W. Further, when a part of the nitrogen in the wafer transport chamber 9 flows out to the outside, it is possible to maintain the state in the wafer transport chamber 9 constant by supplying the flowed-out amount of nitrogen.

The chemical filter 14 is provided in the gas suction port 12, so that the gas in the wafer transport chamber 9 flows into the gas feedback path 10 through the chemical filter 14. Thus, it is possible to eliminate the molecular contaminants that are generated by the processing or the like in the processing apparatus 6, and flowed into the wafer transport chamber 9.

Further, since the wafer transport apparatus 2 is supported on the front wall 31 of the housing 3, it is possible to arrange the wafer transport apparatus 2 and the gas suction port 12 having the chemical filter 14 without interfering each other, and prevent the particles from floating due to an gasflow turbulence, without disturbing the downward gasflow in the wafer transport chamber 9.

As the gas circulating in the wafer transport chamber 9 is a nitrogen gas that is an inert gas, it is possible to suppress a change in the surface properties of the wafer W due to oxygen, humidity or the like, and prevent a decrease in yield.

The specific configuration of each part is not limited only to the embodiment described above.

For example, in the above embodiment, a wafer W is transported between the FOUPs 7 provided on the load ports 4 and the load lock chamber 61, but a wafer W may be transported between the FOUPs 7.

A wafer W is assumed to be a transport object of the wafer transport apparatus 2. However, the embodiment of the invention can be used for the EFEM 1 that handles various precision processed products such as a glass substrate.

In the above embodiment, the guide rail 22 configuring a predetermined track is supported on the front wall 31 of the housing 3. However, it may be supported in any part of the housing 3, as long as not interfering with the gas suction port 12. For example, the guide rail 22 may be provided on the bottom wall 36 so that the wafer transport apparatus 2 is supported on the bottom wall 36. When a moving direction of the wafer transport apparatus 2 can be controlled, it is also possible to configure the track by other means such as a guide roller and a wire.

Further, it is possible to use a variety of devices as the wafer transport apparatus 2, not limited to a link type arm robot and a SCRA type multi-joint robot.

In the above embodiment, the gas supply means 16 is provided in the upper part on the rear side of the gas feedback path 10, and the gas discharge means 17 is provided in the lower part on the rear side of the gas feedback path 10. The positions of the gas supply means 16 and the gas discharge means 17 are not limited, and they can be provided in any location in the circulation path Ci.

Further, in the above embodiment, the gas discharge means 17 discharges gas simultaneously with the nitrogen supply of the gas supply means 16. However, first the gas discharge means 17 having a suction mechanism may discharge gas to set the substantially closed space CS to a negative pressure, and then the gas supply means 16 may supply nitrogen to the substantially closed space CS, thereby setting the substantially closed space Cs being in an air atmosphere to a nitrogen atmosphere. By doing so, the nitrogen can be purged more efficiently.

In the above embodiment, the EFEM 1 is connected to one load lock chamber 61, but it may be connected to two or more load lock chambers 61. In this case, two or more openings 32a are provided on the rear wall 32 depending on the number of load lock chambers 61 connected, and the gas feedback path 10 may be branched into three or more avoiding the openings 32a.

In the above embodiment, the gas feedback path 10 is provided inside the housing 3 of the EFEM 1. The gas feedback path 10 may be configured by providing a duct outside the housing 3. In this case, also, it is preferable to branch a duct into left and right sides of the opening 32a connecting the load lock chamber 61 for ensuring a wide flow path while preventing interference with the load lock chamber 61. The gas feedback path 10 can take the other various shapes depending on the shapes of the surrounding devices.

In the above embodiment, nitrogen is used as the gas for replacing the atmosphere around the wafer W. A variety of gases such as dry air and argon may be used depending on the processing.

It is also possible to further improve the environment in the wafer transport chamber 9 by providing the EFEM 1 of the above embodiment with a dryer for reducing humidity in the substantially closed space CS, a cooler for lowering a temperature, and an ionizer for removing the electricity of the wafer W.

Other configurations may be variously modified without departing from the scope of the invention.

Second Embodiment

A plurality of EFEMs is usually installed in a clean room. Thus, if nitrogen is supplied to each EFEM, the use amount of nitrogen greatly increases. When a device for supplying nitrogen is provided for each EFEM, the installation area of the entire equipment increases, and the cost required for installation and management of the equipment increases.

Therefore, when a plurality of EFEMs is operated, it is an object of the second embodiment is to provide an EFEM system that suppresses adhesion of particles to a wafer, and realize proper management of the surface properties of a wafer with a simple structure, without exposing a wafer during transport to a change in the surface properties and an atmosphere causing adhesion of particles, thereby reducing the cost and installation area.

Figure 8:
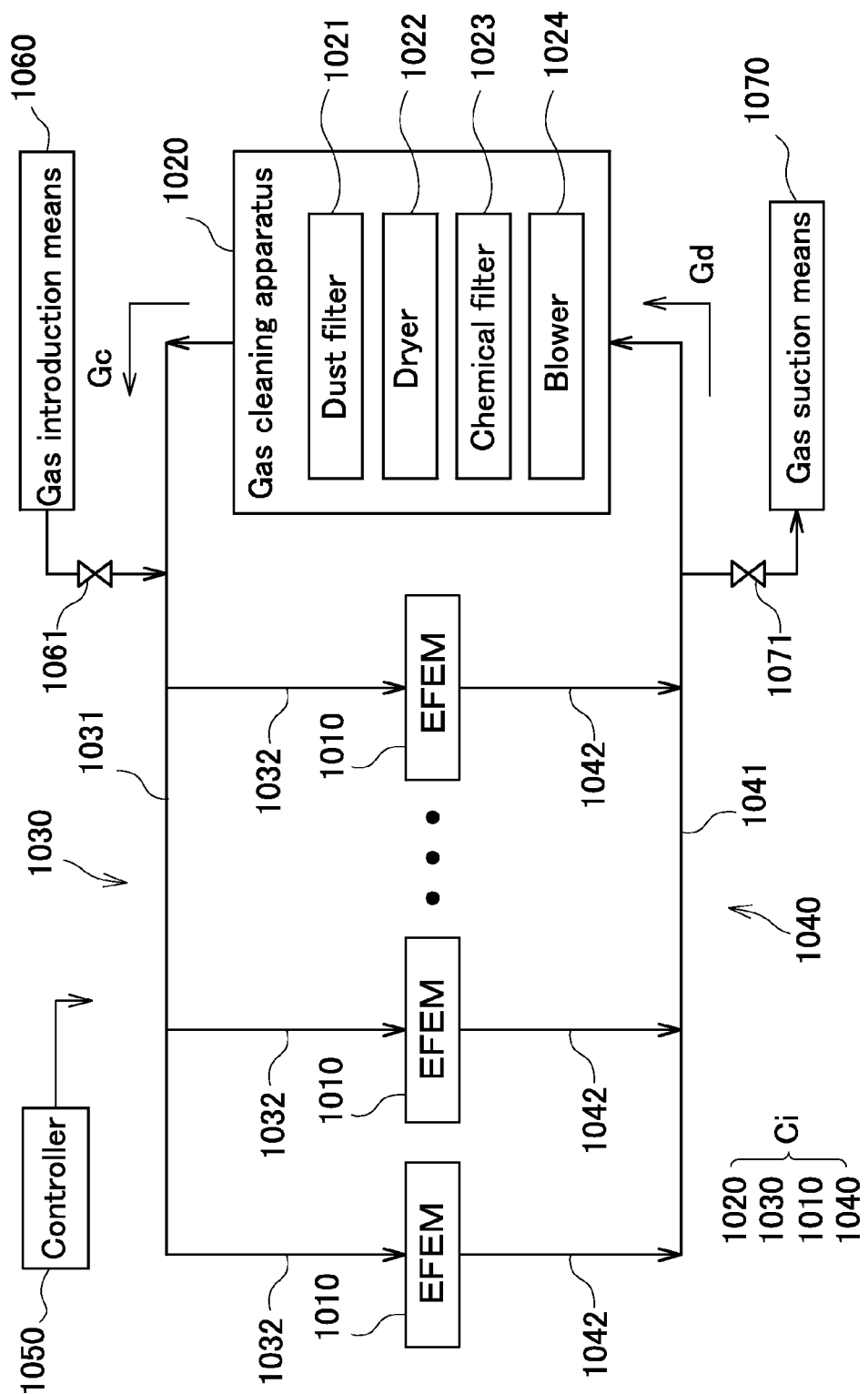
FIG. 8 is an explanatory drawing schematically showing an EFEM system according to an embodiment of the invention.

An EFEM system according to the second embodiment is, as shown in FIG. 8, comprises two or more EFEMs 1010 having the same internal volume, that are installed in a clean room, and used when the same processing is performed for a wafer W; a gas cleaning apparatus 1020 that is provided outside the EFEM 1010; a gas supply path 1030 that distributes a cleaning gas Gc cleaned by the gas cleaning apparatus 1020, and supplies the gas to a wafer transport chamber 1011 provided in each EFEM 1010 (refer to FIG. 9 and FIG. 10); a gas feedback path 1040 that feeds back a discharge gas Gd emitted from the wafer transport chamber 1011 to the gas cleaning apparatus 1020; a controller 1050; a gas introduction means 1060 that introduces a nitrogen gas into the gas supply path 1030; and a gas suction means 1070 that sucks the gas in the gas feedback path 1040. The gas cleaning apparatus 1020, the gas supply path 1030, the wafer transport chambers 1011, and the gas feedback path 1040 are communicated, and set in a nitrogen atmosphere. Nitrogen is circulated among them by configuring a circulation path Ci. In other words, a plurality of EFEMs 1010 shares the gas cleaning apparatus 1020. The gas cleaning apparatus 1020, the gas supply path 1030, the wafer transport chambers 1011, and the gas feedback path 1040, forming the circulation path Ci, are each sealed except for the connecting portion, so that the nitrogen does not flow out of the circulation path Ci in the state that they are being connected. In this embodiment, nitrogen as an inert gas is circulated in the circulation path Ci. The circulation gas is not limited to this, and the other gasses can be used.

Figure 9:
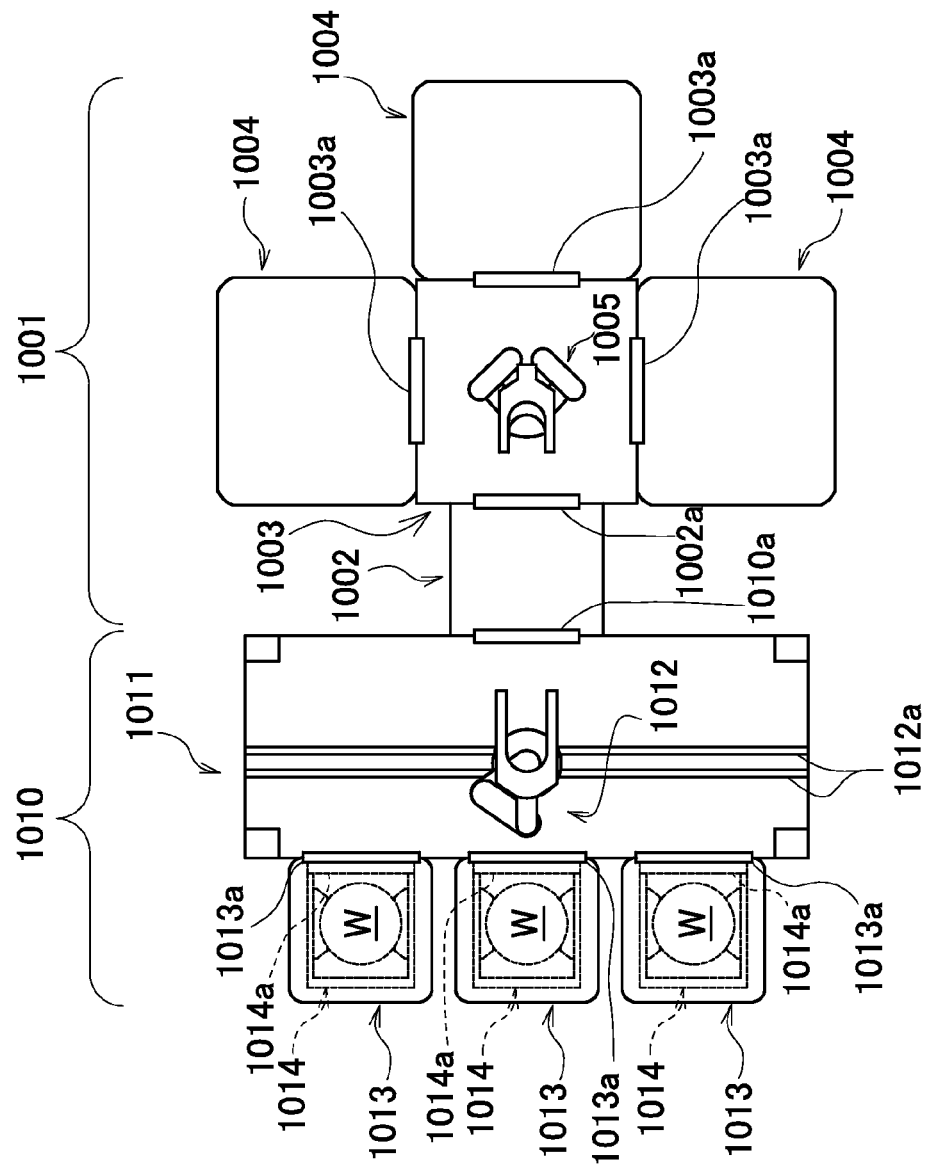
FIG. 9 is a plan view schematically showing the relationship between an EFEM constituting the EFEM system and a processing apparatus.
Figure 10:
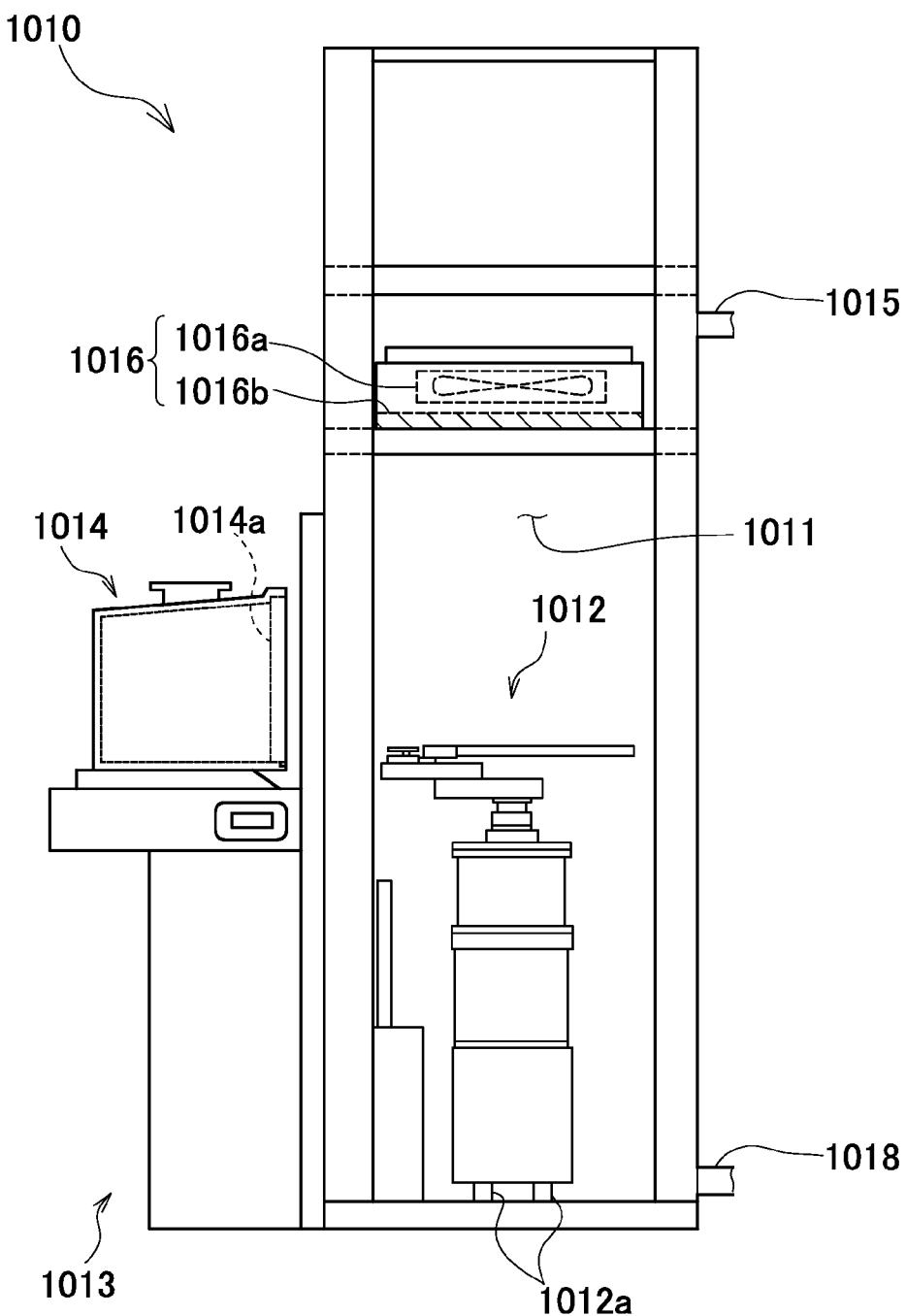
FIG. 10 is a side view showing a state that a sidewall of the EFEM is removed.

The EFEM 1010 comprises, as shown in FIG. 9 and FIG. 10, a wafer transport apparatus 1012 that transports a wafer W between predetermined transfer positions, a box-shaped wafer transport chamber 1011 that is provided so as to surround the wafer transport apparatus 1012, and a plurality of load ports 1013 (three in the drawing) that is connected to one of the opposing wall surfaces of the transfer chamber 1011.

A FOUP 1014 is mounted on the load port 1013. A lid 1014a of the FOUP 1014 and a door 1013a of the load port 1013 are combined and moved together, and the FOUP 1014 communicates with the wafer transport chamber 1011. The FOUP 1014 includes a number of mounting parts in the vertical direction for storing a number of wafers W. The FOUP 1014 is usually filled with nitrogen, and the atmosphere in the FOUP 1014 can be replaced to nitrogen through the load port 1013.

As shown in FIG. 9, each EFEM 1010 is configured to be connected to a processing apparatus 1001 for processing a wafer W, adjacent to the outside of the wall surface opposite to the wall surface to be connected to the load port 1013. Thus, it is possible to communicate the wafer transport chamber 1011 of the EFEM 1010 with the load lock chamber 1002 of the processing apparatus 1001 by opening a door 1010a called a gate valve that is provided between the EFEM 1010 and the processing apparatus 1001. A variety of devices can be used as the processing apparatus 1001, generally a transport chamber 1003 is provided adjacent to the load lock chamber 1002, and a plurality of processing units 1004 (three in the drawing) is provided adjacent to the transport chamber 1003. Doors 1002a and 1003a are provided between the transport chamber 1003, the load lock chamber 1002, and the processing units 1004. It is possible to communicate these parts by opening the doors. It is possible to move a wafer W between the load lock chamber 1002 and the processing units 1004 using a transport robot 1005 provided in the transport chamber 1003. In this embodiment, the processing apparatus 1001 connected to the EFEM 1010 performs the same kind of processing.

The wafer transport chamber 1011 is a space where the wafer transport apparatus 1012 is driven, and is made airtight in order to prevent an outflow of the circulating nitrogen. As shown in FIG. 10, in the upper part of the wafer transport chamber 1011, a gas supply port 1015 connected to the gas supply path 1030 (refer to FIG. 8), and a fan filter unit (FFU) 1016 comprising a dust filter 1016b and a fan 1016a as a blowing means are provided. The dust filter 1016b eliminates the particles contained in the gas supplied through the gas supply port 1015, and the fan 1016a blows gas to the wafer transport chamber 1011, thereby generating a downward gasflow in the wafer transport chamber 1011. In the lower part of the wafer transport chamber 1011, a gas delivery port 1018 connected to the gas feedback path 1040 (refer to FIG. 8) is provided, and the gas passing through the wafer transport chamber 1011 as a downward flow is fed back to the gas cleaning apparatus 1020 through the gas feedback path 1040, and reused. As described above, by generating a downward gasflow in the wafer transport chamber 1011, it is possible to eliminate the particles adhered to the wafer W surface, and prevent floating of the particles, residual gas, and impurities generated by the processing apparatus 1001 in the wafer transport chamber 1011.

The wafer transport apparatus 1012 is, as shown in FIG. 9 and FIG. 10, supported on the bottom of the wafer transport chamber 1011 through the guide rail 1012a, and can move along the guide rail 1012a extending in the width direction of the bottom surface of the wafer transport chamber 1011. Thus, it is possible to transport the wafers W, housed in the FOUPs 1014 mounted on three load ports 1013 aligned sideways, to the load lock chamber 1002, and to transport again the wafers W to the FOUPs 1014 after being processed by the processing units 1004.

The gas cleaning apparatus 1020 is, as shown in FIG. 8, an apparatus that cleans the discharge gas Gd fed back from the gas feedback path 1040, containing particles and molecular contaminants while flowing through the wafer transport chamber 1011 (refer to FIG. 9) of each EFEM 1010, for reusing it, sends the cleaned clean gas Gc to the gas supply path 1030, and supplies the clean gas Gc to the wafer transport chamber 1011, thereby circulating the gas. In particular, the gas cleaning apparatus is configured with a dust filter 1021, a dryer 1022, a chemical filter 1023, and a blower 1024 as a blowing means. These components of the gas cleaning apparatus 1020 are, in FIG. 8, arranged in the order of the blower 1024, the chemical filter 1023, the dryer 1022, and the dust filter 1021, from the downstream side to the upstream side of the circulating path Ci. The arrangement order is not limited to this, and may be appropriately changed. The gas cleaning apparatus 1020 may be placed in the clean room where the EFEMs 1010 are installed, or may be placed outside the clean room by providing ducts of the gas supply path 1030 and the gas feedback path 1040 on the wall surface of the clean room, or can be provided in an appropriate position depending on the layout of the devices in the clean room.

The dust filter 1021 is a device to eliminate the particles contain in the discharge gas Gd. As a dust filter, a HEPA filter, ULPA filter or the like are selectively used depending on the situations of the EFEM 1010 and the processing apparatus 1001 connected thereto, the particles contained in the discharge gas Gd, the pressure of the circulating gas, and the likes. As described above, other than the dust filter 1021, the dust filter 1016b is provided in each EFEM 1010 (refer to FIG. 10). It is thus possible to supply the gas cleaned in the wafer transport chamber 1011 by cooperating with the dust filter 1021 of the gas cleaning apparatus 1020. Compared with the case of eliminating the particles only by the dust filter 1016b provided in the EFEM 1010, it is possible to reduce the number of exchanging the dust filter 1016, and reduce the cost of replacing the dust filter 1016b for each EFEM 1010.

The dryer 1022 is used to remove the moisture in the discharge gas Gd generated in the processing apparatus 1001 connected to the EFEM 1010, and is generally composed of equipment called a dehumidifier or a dehumidifying machine. By removing the moisture in the discharge gas Gd, it is possible to prevent degradation of the wafer W caused by the moisture in the wafer transport chamber 1011. When moisture does not occur in the connected processing apparatus 1001 and the humidity does not increase in the wafer transport chamber 1011, it is also possible to stop the operation by the control of the controller 1050.

The chemical filter 1023 is a device to eliminate molecular contaminants such as residual gas, that is the gas used for the processing in the processing apparatus 1001 (refer to FIG. 9) or generated by the processing, and flowed into the wafer transport chamber 1011 accompanying with the wafer W. Depending on the kinds of molecular contaminants, a cationic filter or an anionic filter that removes contaminants by ion exchange reaction, or an activated carbon filter that physically absorbs contaminants.

The blower 1024 is a device to blow gas to the gas supply path 1030 from the gas feedback path 1040 in order to accelerate the circulation of gas through the circulation path Ci, and has a function of sucking the gas in the gas feedback path 1040, and a function of sending the gas to the supply path 1030. The controller 1050 can adjust the flow rate of the blower 1024. A not-shown pressure sensor or a flow meter is provided in the circulation path Ci. The controller 1050 adjusts the flow rate of the blower 1024 based on the numerical value of the pressure sensor or flow meter, thereby equalizing the flow of gas in the circulation path Ci.

The gas supply path 1030 is a duct for sending the clean gas Gc cleaned by the gas cleaning apparatus 1020 to the wafer transport chamber 1011 (refer to FIG. 10) of the EFEM 1010. The gas supply path 1030 comprises a first supply path 1031 that is connected to the gas cleaning apparatus 1020, and acts as a main flow path to flow the gas to a plurality of EFEMs 1010; and a plurality of second supply paths 1032 that is branched from the first supply path 1031 toward a single EFEM 1010, and connected to the gas supply port 1015 (refer to FIG. 10) of the respective wafer transport chamber 1011.

The gas feedback path 1040 is a duct for feeding back the discharge gas Gd emitted from the wafer transport chamber

1011 (refer to FIG. 10) of the EFEM 1010 to the gas cleaning apparatus 1020. The gas feedback path 1040 comprises a plurality of second feedback paths 1042 that is connected to the gas delivery port 1018 (refer to FIG. 10) of each wafer transport chamber 1011; and a first feedback path 1041 that is connected to the second feedback paths, joins the discharge gas Gd from the wafer transport chamber 1011, connects the gas cleaning apparatus 1020, and acts as a main flow path to feed back the joined discharge gas Gd to the gas cleaning apparatus 1020.

As the gas supply path 1030 and the gas feedback path 1040, various shapes of ducts such as square and round ducts are used depending on the clean room environment, in which the system is installed. They may be made of, in addition to a general galvanized iron plate, suitable materials depending on the components contained in the gas to be circulated, such as a stainless steel plate and a vinyl chloride coated steel plate having excellent gas resistance. Since the cleanliness is different in the clean gas Gc flowing through the gas supply path 1030 and the discharge gas Cd flowing through the gas feedback path 1040, it is possible to reduce the material cost by changing the material of the gas supply path 1030 and the gas feedback path 1040.

The controller 1050 is a device, which operates the gas cleaning apparatus 1020, and performs a nitrogen circulation control, circulating the nitrogen in the circulation path Ci while cleaning. The controller 1050 comprises an ordinary microprocessor or the like, including a CPU, a memory, and an interface. The memory previously stores a program necessary for the processing, and the CPU sequentially retrieves and executes the necessary program, realizing an intended function by cooperating with peripheral hardware resources. The nitrogen circulation control will be described later.

The gas introduction means 1060 is connected to the first supply path 1031 through a valve 1061, and sends nitrogen to the first supply path 1031. The controller 1050 controls opening and closing of the valve 1061, thereby controlling stop of supply and supply of nitrogen to the gas supply path 1030. When supplying nitrogen, it is possible to control the supply amount per unit time.

The gas suction means 1070, being connected to the first feedback path 1041 through a valve 1071, operates based on an instruction from the controller 1050, and communicates the first feedback path 1041 with a gas discharge destination provided outside by opening and closing the valve 1061. It is possible to replace the interior of the circulation path Ci to a nitrogen atmosphere by cooperating with the nitrogen supply of the gas introduction means 1060. In this embodiment, nitrogen is used as the gas circulating through the circulation path Ci, and the gas introduction means 1060 supplies nitrogen. However, when circulating other gases, the gas introduction means 1060 may supply the circulating gas.

Next, refer to FIG. 8 a description will be given on the operation of the nitrogen circulation control for circulating nitrogen in the EFEM system that is configured as described heretofore.

First, as an initial step, the controller 1050 opens the valves 1071 and 1061, causes a gas suction means 1070 to suck and discharge the gas in the gas feedback path 1040, and causes a gas introduction means 1060 to supply nitrogen to the gas supply path 1030, thereby purging the circulation path Ci in an air atmosphere, including the gas feedback path 1040 and the gas supply path 1030, to a nitrogen atmosphere. After the purging is completed, the valves 1071 and 1061 are closed to configure a closed circulation path Ci.

After this step, when the nitrogen in the circulation path Ci leaks to the outside, the controller 1050 opens the valve 1071, and causes the gas introduction means 1060 to supply the leaked amount of nitrogen. In order to perform the above operation automatically, it is preferable to provide an oximeter in each EFEM 1010, and control the valves 1061 and 1071 to supply a new nitrogen to the circulation path Ci, when the oxygen density detected by the oximeter increases to a predetermined value or higher.

Next, in the circulation path Ci that has been set in a nitrogen atmosphere, the controller 1050 drives the blower 1024 of the gas cleaning apparatus 1020 to thereby cause the circulation of nitrogen. At this time, the controller drives also the fan 1016*a* (refer to FIG. 10) that constitutes the FFU 1016 of the EFEM 1010, generating a downward gasflow in the wafer transport chamber 1011, and accelerating the circulation of nitrogen in the circulation path Ci. Such a configuration effectively prevents the discharge gas Gd in the gas feedback path 1040 from flowing back to the EFEM 1010.

While nitrogen is circulating through the circulation path Ci, the dust filter 1021 and chemical filter 1023 provided in the gas cleaning apparatus 1020, and the dust filter 1016*b* (refer to FIG. 10) constituting the FFU 1016 provided in the EFEM 1010 eliminate the particles and molecular contaminants contained in the circulating gas. Thus, clean nitrogen always flows in the circulation path Ci, particularly in the wafer transport chamber 1011.

In the EFEM 1010 that has been set to the above state, the wafer transport chamber 1011 shows in FIG. 9 communicates with the FOUP 1014 mounted on the load port 1013 and purged to a nitrogen atmosphere, and when loading and unloading the wafer W, the wafer transport chamber 1011 and FOUP 1014 are in the same nitrogen atmosphere, and the nitrogen in the wafer transport chamber 1011 is maintained clean. Thus, it is unnecessary to set the interior of the FOUP 1014 to a positive pressure with respect to the wafer transport chamber 1011 to prevent ingress of the particles and molecular contaminants into the FOUP 1014, and it is possible to suppress the consumption of nitrogen to purge the FOUP 1014.

Further, by opening the door 1010*a* provided between the wafer transport chamber 1011 and load lock chamber 1002, it is possible to communicate the wafer transport chamber 1011 and load lock chamber 1002. When loading and unloading the wafer W into/from the load lock chamber 1002, although there is a possibility that the particles and molecular contaminants adhered to the wafer W during the processing in the processing apparatus 1001 or those present in the load lock chamber 1002 enter the wafer transport chamber 1011, these particles and molecular contaminants flow downward by the downward gasflow in the wafer transport chamber 1011, flow back as a discharge gas Gd to the gas cleaning apparatus 1020 through the gas feedback path 1040, and cleaned by the dust filter 1021 and chemical filter 1023. The cleaned gas is sent as a clean gas Gc to the wafer transport chamber 1011 through the gas supply path 1030. But, the particles are further removed by the dust filter 1016*b* of the FFU 1016 in the EFEM 1010, and the particles and molecular contaminants do not substantially enter the wafer transport chamber 1011. Thus, it is possible to effectively reduce the adverse effects on the wafer W being transported in the wafer transport chamber 1011.

As described above, the EFEM system in this embodiment comprises a plurality of EFEM 1010, each including a wafer transport chamber 1011 for transporting a wafer W; a gas cleaning apparatus 1020 that is provided outside the EFEM 1010, and provided with a dust filter 1021 for cleaning gas; a gas supply path 1030 that distributes a clean gas Gc, that is the gas cleaned by the gas cleaning apparatus 1020, and supplies the gas to the wafer transport chamber 1011; and a gas feedback path 1040 that feeds back a discharge gas Gd, that is the gas discharged from the wafer transport chamber 1011, wherein gas is circulated between the wafer transport chamber 1011 and the gas cleaning apparatus 1020.

In such a configuration, the dust filter 1021 of the gas cleaning apparatus 1020 eliminates the particles contained in the discharge gas Gd from the wafer transport chamber 1011, thereby cleaning the gas, and the cleaned clean gas Gc is supplied to the wafer transport chamber 1011, thereby maintaining the wafer transport chamber 1011 in a clean gas atmosphere. Further, a plurality of EFEMs 1010 share the gas cleaning apparatus 1020, and eliminates the necessity of providing the gas cleaning apparatus 1020 for each EFEM 1010. Thus, it is possible to simplify the structure of the EFEM 1010, and to reduce the installation area and the cost.

Since the gas cleaning apparatus 1020 is configured with a blower 1024 as a blowing means for sending gas to the gas supply path 1030 from the gas feedback path 1040, it is possible to effectively circulate the gas between the gas cleaning apparatus 1020 and the wafer transport chamber 1011.

Further, the gas cleaning apparatus 1020 is configured with a chemical filter 1023 for eliminating the molecular contaminants contained in the fed back gas, and it is possible to prevent circulation of the molecular contaminants entered from the processing apparatus 1001 that is connected to the wafer transport chamber 1011, and to maintain the wafer transport chamber 1011 in an appropriate gas atmosphere.

Since the gas cleaning apparatus 1020 is configured with a dryer 1022 for eliminating moisture in a gas, it is possible to effectively prevent a decrease in the quality of a wafer W caused by the moisture in the wafer transport chamber 1011.

In addition, the gas cleaning apparatus 1020 is configured with a gas introduction means 1060 for introducing nitrogen at a midpoint of the gas supply path 1030, and a gas suction means 1070 for sucking gas from a midpoint of the gas feedback path 1040. Thus, it is possible, by replacing the gas in the circulation path Ci to a nitrogen atmosphere, to prevent a change in the surface properties of the wafer W caused by adhesion of oxygen or residual gas or the like generated by the processing in the wafer transport chamber 1011, and prevent a decrease in yield. When a part of the gas in the wafer transport chamber 1011 flows out to the outside, it is also possible to maintain the state in the wafer transport chamber 1011 by supplying the flowed amount of gas.

The EFEM 1010 is configured with a gas supply port 1015 that is provided in the upper part of the wafer transport chamber 1011, and connected to the gas supply path 1030; and a gas delivery port 1018 that is provided in the lower part of the wafer transport chamber 1011, and connected to the gas feedback path 1040, so as to generate a downward gasflow from the gas supply port 1015 to the gas delivery port 1018 in the wafer transport chamber 1011. Thus, it is possible to eliminate the particles adhered to the wafer W surface, and prevent floating of the particles in the wafer transport chamber 1011.

In addition, the gas supply port 1015 is configured to be connected to a fan filter unit 1016 that comprises a fan 1016*a* as a blowing means for sending the nitrogen supplied through the gas supply path 1030 into the wafer transport chamber 1011, and a dust filter 1016 for cleaning the nitrogen supplied through the gas supply path 1030. Thus, it is possible to effectively generate a downward gasflow in the wafer transport chamber 1011, and prevent further adhesion of the particles to the wafer W.

Since the gas circulating in the circulation path Ci is an inert gas, it is possible to suppress a change in the surface properties of the wafer W by oxygen, moisture or the like, and prevent a decrease in yield.

A specific configuration of each part is not limited only to the second embodiment described above.

For example, in the second embodiment, the EFEM 1010 has the same internal volume, and the processing apparatus 1001 connected to the EFEM 1010 performs the same kind of processing steps. The EFEM 1010 and the processing apparatus 1001 in the EFEM system may have a different configuration, and may perform different processing steps to the wafer W.

Figure 11:
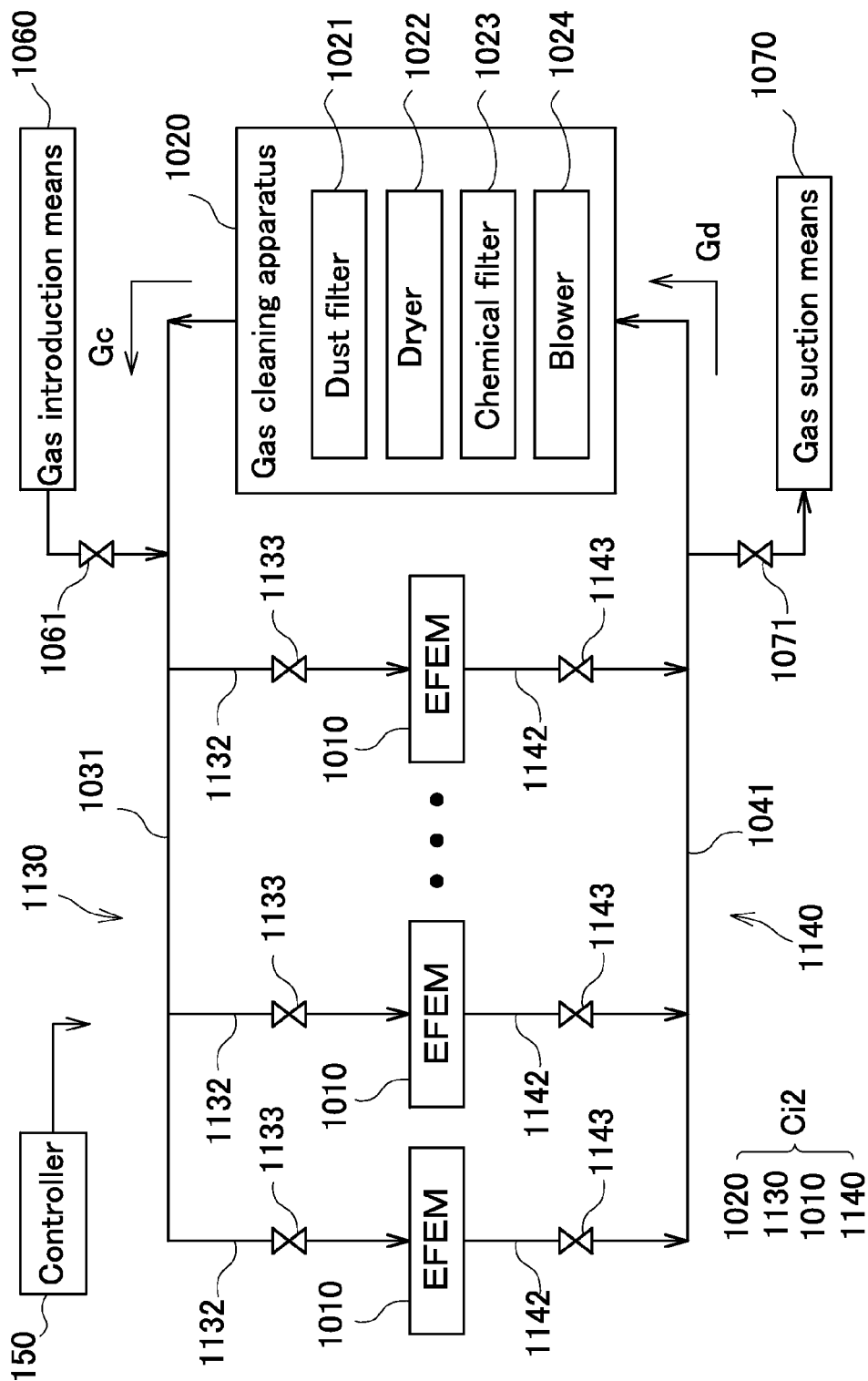
FIG. 11 is an explanatory drawing schematically showing a modification of the EFEM system according to the invention.

Based on the configuration described above, it is possible to modify the configuration as shown in FIG. 11. In the drawing, the same parts as the second embodiment are denoted by the same reference numerals, and a description thereof will be omitted. Different from the embodiment described above, in this modification, a gas supply path 1130 is configured with the first supply path 1031, a valve 1133 is provided at a midpoint of a second supply path 132 connecting the first supply path 1031 and EFEM 1010. A gas feedback path 1140 is configured with the first feedback path 1041, and a valve 1143 is provided at a midpoint of the second feedback path 142 connecting the first feedback path 1041 and EFEM 1010. In this case, in addition to the control in the embodiment described above, a controller 1150 controls the opening and closing of the valves 1133 and 1143.

In such a configuration, the controller 1150 closes the valve 1133 provided in the second supply path 132 connected to the EFEM 1010 being stopped, and the valve 1143 provided in the second feedback path 142 connected to the same EFEM 1010, thereby preventing a clean gas Gc from flowing into the EFEM 1010 being stopped, and decreasing the supply amount of nitrogen by the gas introduction means 1060. Since the circulation area in a circulation path Ci 2 is decreased, it is possible to reduce the amount of gas blow of the blower 1024, and reduce the cost. In particular, when the wafer transport chamber 1011 is set non-airtight for the maintenance of the EFEM 1010, a large amount of nitrogen flows out without the valves 1133 and 1143 connected to the wafer transport chamber. However, since the valves 1133 and 1143 are provided, it is possible to perform the maintenance of a specific EFEM 1010 while operating the other EFEMs 1010. Further, it is considerable to configure the controller 1150 to adjust a flow rate of the gas flowing through the valves 1133 and 1143. In such a configuration, particularly, when the EFEM 1010 in the EFEM system has a different configuration, or when the EFEM 1010 is connected to the processing apparatus 1001 that performs different processing steps to the wafer W, it is possible to reduce the use amount of gas by adjusting the gas flow rate depending on the environment in the wafer transport chamber 1011 of the EFEM 1010.

Figure 12:
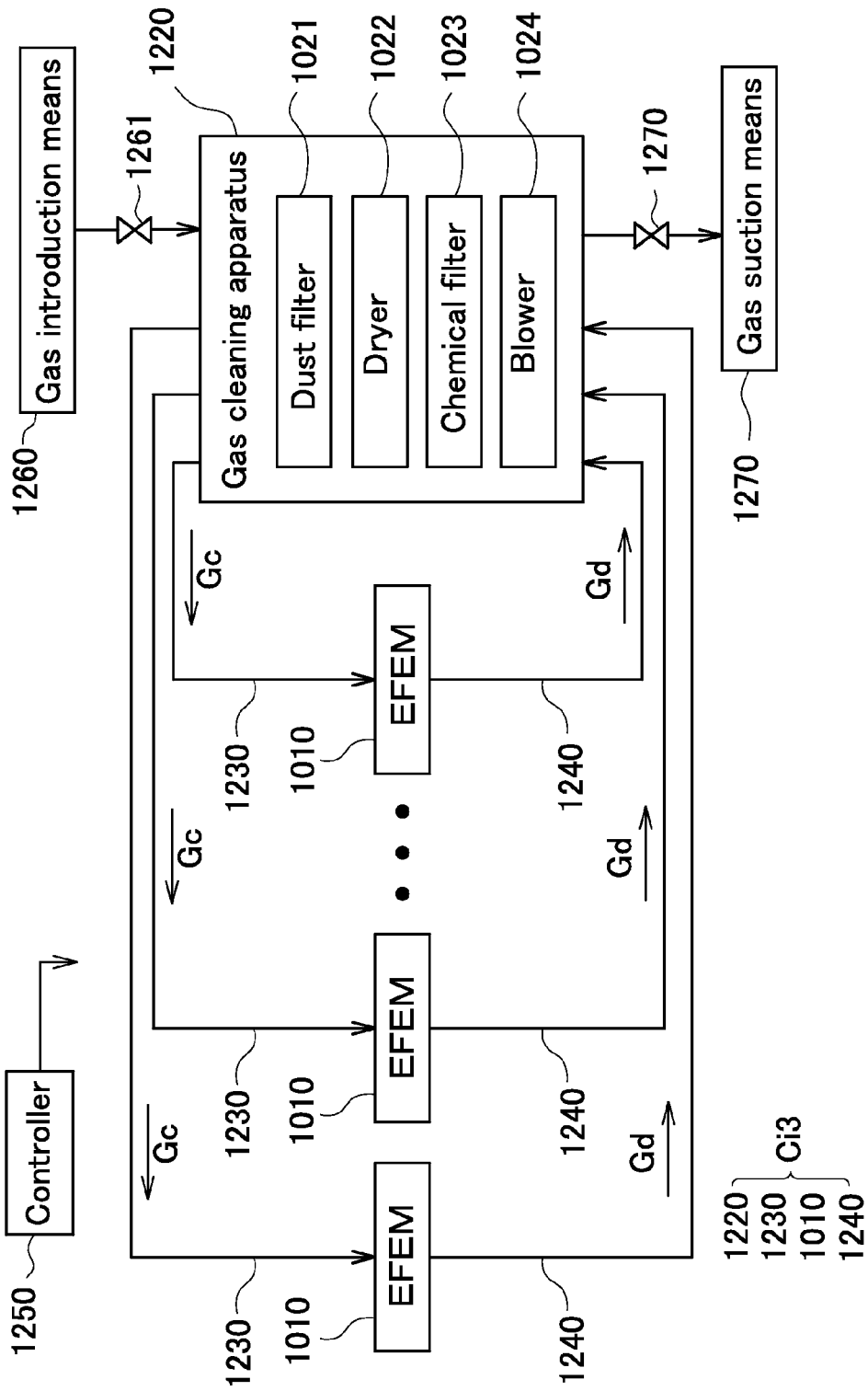
FIG. 12 is an explanatory drawing schematically showing another modification of the EFEM system according to the invention.

As another modification, it is possible to modify the configuration as shown in FIG. 12. In the drawing, the same parts as the second embodiment are denoted by the same reference numerals, and a description thereof will be omitted. In this modification, a gas cleaning apparatus 1220 and EFEM 1010 are connected to an individual gas supply path 1230 and a gas feedback path 1240, and a controller 1250 controls the circulation through a plurality of circulation paths Ci3. In this case, it is preferable that a gas introduction means 1260 and a gas suction means 1270 are directly connected to the gas cleaning apparatus 1220 through valves 1261 and 1271. In such a configuration, gas is not communicated between the EFEMs 1010, and when a large amount of particles or molecular contaminants occurs in a certain EFEM 1010, for example, it is possible to certainly prevent the gas containing the particles or molecular contaminants from flowing into the other EFEMs 1010 not through the gas cleaning apparatus 1220.

In the second embodiment, the wafer W is transported between the load lock chamber 1002 and the FOUP 1014 provided on the load port 1013. It is possible to transport the wafer between the FOUPs 1014.

Further, in the second embodiment, the wafer W is assumed to be a transport object of the wafer transport apparatus 1012. However, the embodiment of the invention can be used for the EFEM system applied to the EFEM 1010 that handles various precision processed products such as a glass substrate.

In the second embodiment, the gas introduction means 1060 is provided in the first supply path 1031, and the gas suction means 1070 is provided in the first feedback path 1041. The installation positions of the gas introduction means 1060 and gas suction means 1070 are not limited. It is possible to install them in any location in the circulation path Ci. Further, when a nitrogen supply means of purging nitrogen in the FOUP 1014 is provided in the load port 1013 of the EFEM 1010, it is possible to introduce nitrogen into the circulation path Ci by the nitrogen supply means that supplies nitrogen in the state that the FOUP 1014 and the wafer transport chamber 1011 are being communicated. In this case, it is possible to purge the nitrogen in the circulation path Ci by using conventional equipment without providing the gas introduction means 1060.

Further, in the second embodiment, as an initial step of the nitrogen circulation control, the discharge of gas by the gas discharge means 1070 is performed simultaneously with the supply of nitrogen by the gas introduction means 1060. However, first the gas suction means 1070 may sets the circulation path Ci to a negative pressure by discharging gas, and then the gas introduction means 1060 may set the circulation path Ci in an air atmosphere to a nitrogen atmosphere by supplying nitrogen to the circulation path Ci. By doing so, it is possible to efficiently purge the nitrogen.

In the second embodiment, nitrogen is used as gas for replacing the atmosphere in the circulation path Ci. A variety of gases such as dry air and argon may be used depending on the processing.

It is also possible to improve the environment of a circulating gas, that is the environment in the wafer transport chamber 1011 to be suitable for the processing of wafer W, by providing a dryer for reducing a humidity in the circulation path Ci, a cooler for lowering a temperature, and an ionizer for removing the electricity of the wafer W, in the gas cleaning apparatus 1020 of the second embodiment.

To further improve the gas environment, a fan may be provided in an appropriate location in the gas supply path 1030 and the gas feedback path 1040 in the second embodiment.

Other configurations may be variously modified without departing from the scope of the invention.

Third Embodiment

In the first and second embodiment described heretofore, when the volume of the wafer chamber 9, 1011 increases, the cost of the filling gas increases by that amount, and a long time is required to replace the gas. In the third to ninth embodiments, attention is paid to a substrate transport apparatus applied to an EFEM. It is an object of the embodiments to provide a substrate transport apparatus that is configured to suppress adhesion of particles to a substrate, and appropriately manage the properties of a substrate surface, without exposing a substrate during transport to an atmosphere that causes adherence of particles or changes in the surface properties, and an EFEM that is provided with the substrate transport apparatus.

Figure 13:
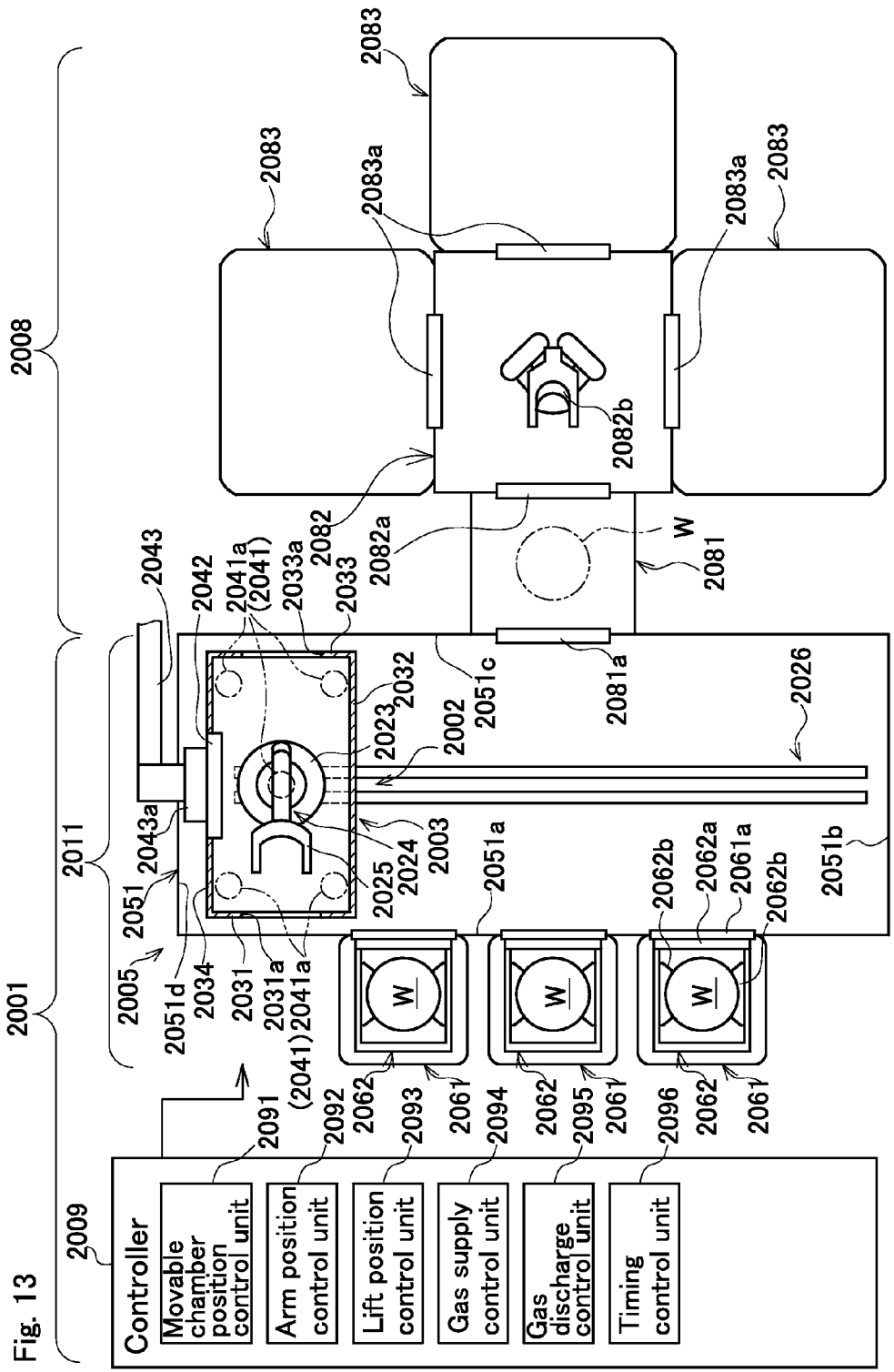
FIG. 13 is an explanatory diagram schematically showing the relationship between an EFEM comprising a substrate transport apparatus according to a third embodiment of the invention, and a processing apparatus.

A substrate transport apparatus applied to an EFEM of the third embodiment is configured as a wafer transport apparatus 2002 that transports a wafer W as a substrate, and forms one of the components of an EFEM 2001 shown in FIG. 13. The EFEM 2001 comprises a main body 2011 that is a mechanical part, and a controller 2009 for controlling the operation of the main body. The main body 2011 includes a wafer transport apparatus 2002 inside, and is able to transport a wafer W between predetermined transport positions by using it. A housing 2051 is provided so as to surround the wafer transport apparatus 2002. The housing 2051 includes housing walls 2051a to 2051d surrounding the four sides of the wafer transport apparatus 2002, and a ceiling wall 2051e (refer to FIG. 16), thereby forming a wafer transport chamber 2005 having a substantially closed space inside. A plurality of load ports 2061 (three in the drawing) is provided adjacent to the outside of one housing wall 2051a, configuring the main body 2011 of the EFEM 2001 together with the wafer transport chamber 2005, and the wafer transport apparatus 2002 provided therein.

The drawing shows schematically the state that the FOUP 2062 is mounted on the load port 2061. The load port 2061 has a door 2061a. When the door 2061a connects and moves with a lid 2062a of the FOUP 2062, the FOUP 2062 is opened to the wafer transport chamber 2005. Inside the FOUP 2062, a number of mounting parts 2062b supporting one wafer W in pairs are provided in the vertical direction inside the FOUP 2062, thereby storing a number of wafers W. Further, the FOUP 2062 is usually filled with nitrogen, and the atmosphere in the FOUP 2062 can be replaced to nitrogen through the load port 2061.

A load lock chamber 2081 configuring a part of the processing apparatus 2008 can be connected adjacent to the outside of a housing wall 2051c opposite to the load port 2061. Thus, it is possible to communicate the wafer transport chamber 2005 and a load lock chamber 2081 by opening a door 2081a of the load lock chamber 2081. A variety of devices can be used as the processing apparatus 2008, generally a transport chamber 2082 is provided adjacent to the load lock chamber 2081, and a plurality of processing units 2083 (three in the drawing) is provided adjacent to the transport chamber 2082. Doors 2082a and 2083a are provided between the transport chamber 2082, the load lock chamber 2081, and the processing units 2083. It is possible to communicate the load lock chamber and the processing units by opening the doors. It is possible to move a wafer W between the load lock chamber 2081 and the processing units 2083 using a transport robot 2082b provided in the transport chamber 2082.

Figure 14:
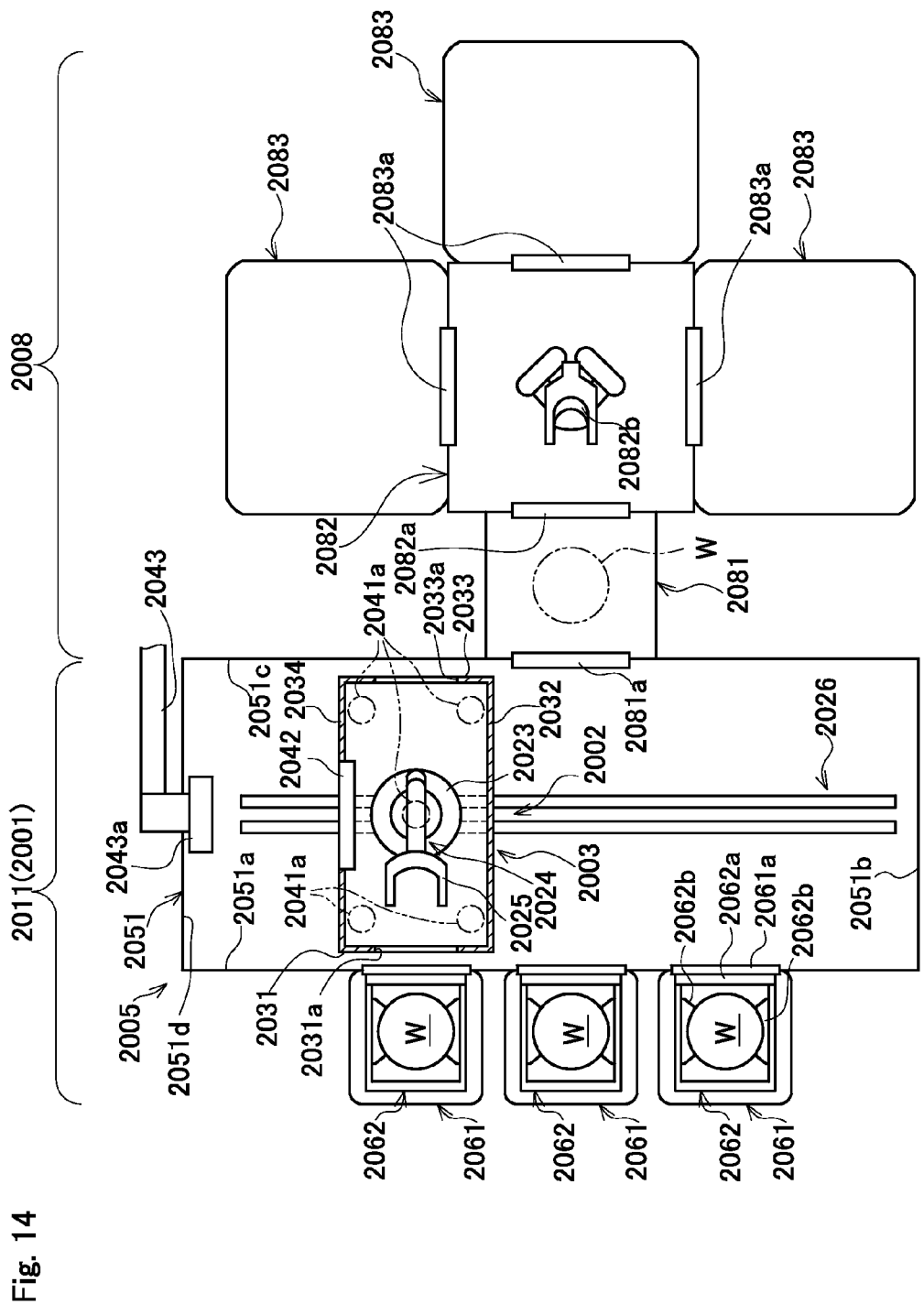
FIG. 14 is a plan view showing a state that a movable chamber of the substrate transport apparatus is moved from the state of FIG. 13.

The wafer transport apparatus 2002 generally comprises a guide rail 2026 constituting a predetermined track, a movable chamber 2003 movable along the guide rail 2026 as shown in FIG. 14, and a transport arm 2024 provided in the movable chamber.

Figure 15:
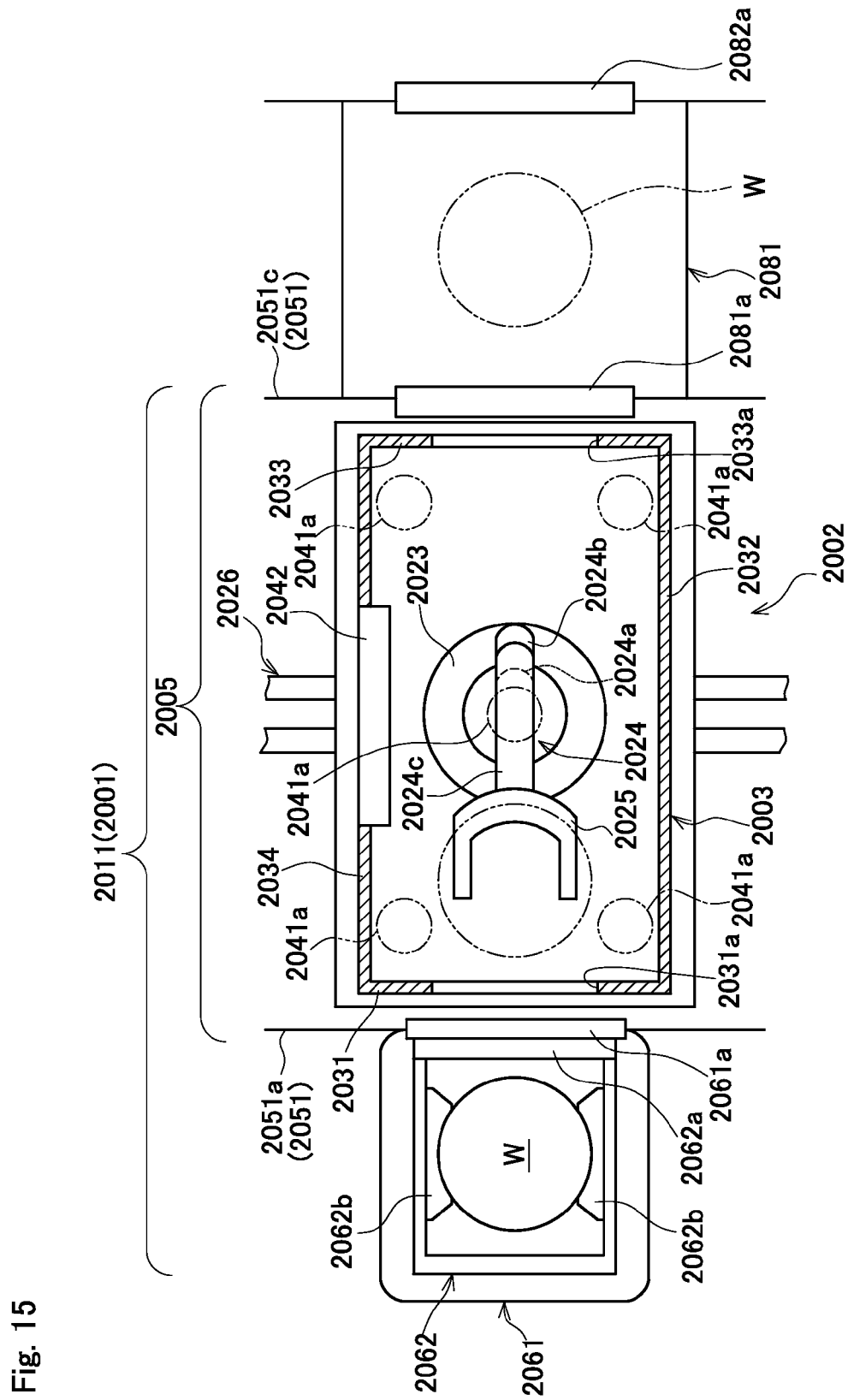
FIG. 15 is a plan view showing an enlarged essential part of the substrate transport apparatus.
Figure 16:
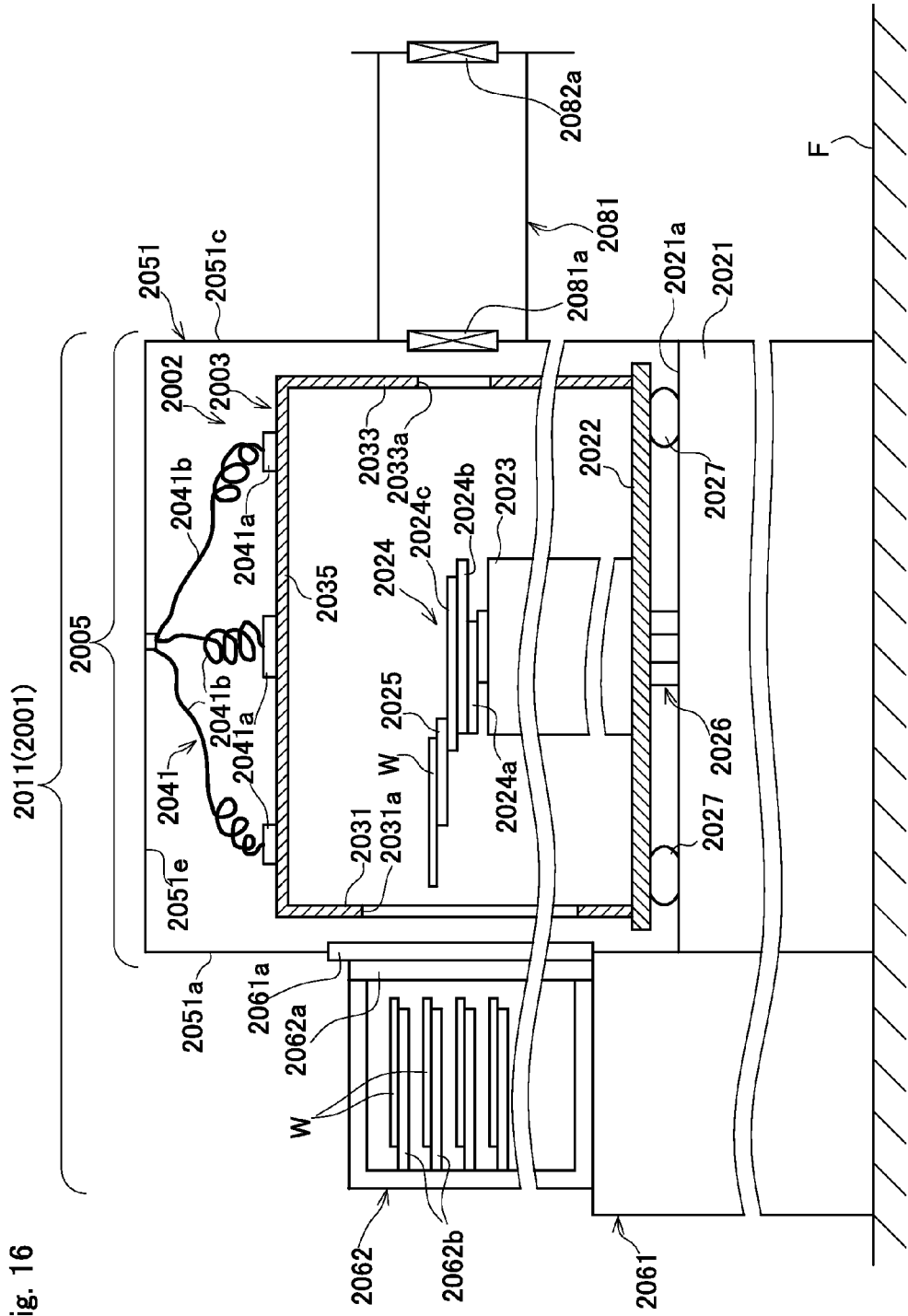
FIG. 16 is a front view schematically showing a state of the substrate transport apparatus as viewed from the extending direction of a guide rail.

FIG. 15 is a plan view schematically showing an enlarged vicinity of a movable chamber 2003 of the wafer transport apparatus 2002. FIG. 16 is a front view schematically showing the chamber as viewed from the extending direction of the guide rail 2026. Hereinafter, a description will be given to the detailed structure of the wafer transport apparatus 2002 with reference to FIG. 15 and FIG. 16.

First, in the housing 2051, a fixed base 2021 is provided on the floor F over between the housing wall 2051a on the load port 2061 side and the housing wall 2051c on the load lock chamber 2081 side. A movable table 2022 formed in a square plate shape is supported on the fixed base 2021 via the guide rail 2026 and rollers 2027. The fixed base 2021 is used to bottom up the height of the movable table 2022, and can be adjusted in height if necessary. The guide rail 2026 is arranged linearly to be parallel to the housing walls 2051a and 2051c (refer to FIG. 13), thereby configuring a linear track. The movable table 2022 can be moved along the guide rail 2026 by a not-shown driving means.

In the center of the movable table 2022, a base 2023 formed in a substantially cylindrical shape is provided, and a transport arm 2024 is supported on the base 2023. The transport arm 2024 can be of generally known various structures, for example, a SCRA type multi-joint robot and a link type arm robot can be preferably used. In this embodiment, the transport arm 2024 comprises a plurality of arm elements 2024a to 2024c, and by relatively moving them, the whole arm element 2022 can be extended. A U-shaped plate-like pick 2025 is provided at the end of the arm element 2024c to enable to mount a wafer W thereon. The transport arm 2024 is able to horizontally revolve with respect to the base 2023, enabling to turn the pick 2025 in either direction of the housing walls 2051a and 2051c.

In the above configuration, the wafer transport apparatus 2002 can move the wafer W mounted on the pick 2025 constituting the transport arm 2024 in two axes, a direction parallel to the housing walls 2051a and 2051c, and a direction orthogonal to them. Further, the base 2023 is able to move up and down. Combining these operations, it is possible to lift the wafer W by the pick 2025, and to move the wafer W placed on the pick 2025 to a predetermined transfer position. In the EFEM 2001 of this embodiment, the FOUP 2062 mounted on the plurality of load ports 2061 and the load lock chamber 2081 opposite thereto (refer to FIG. 13) are set as transfer positions for transferring the wafer W, and it is possible to transfer the wafer W between them using the wafer transport apparatus 2002.

Further, on the movable table 2022, wall parts 2031 to 2034 are arranged so as to surround the four sides of the transport arm 2024, and a ceiling wall 2035 is provided so as to connect thereto. The wall parts 2031 to 2034, the ceiling wall 2035, and the movable table 2022 constitute a rectangular parallelepiped movable chamber 2003. The movable chamber 2003 is substantially closed inside, forming a substantially closed space, and houses the transport arm 2024 and the base 2033 inside, and is movable therewith along the guide rail 2026. The height of the inside space of the movable chamber 2003 is sized to the extent necessary to lift the transport arm 2024, and the length in the extending direction of the guide rail 2026 is sized to the extent necessary to turn the transport arm 2024 holding the wafer W on the pick 2025. The inside space volume is not more than necessary.

Of the wall parts 2031 to 2034 constituting the movable chamber 2003, the wall part 2031 on the load port 2061 side and the wall part 2033 on the load lock chamber 2081 side have openings 2031a and 2033a, respectively, to come in and out the pick 2025 at the tip of the transport arm 2024 holding the wafer. These openings 2031a and 2033a are sized to the extent required to come and out the transport arm 2024, and not unnecessarily large. Thus, it is possible to make the movable chamber 2003 a substantially closed space.

The wall parts 2031 and 2033 formed with the openings 2031a and 2033a, respectively, are provided close to the insides of the housing wall 2051a that is provided adjacent to the load port 2061 and the housing wall 2051c that is provided adjacent to the load lock chamber 2081. Thus, it is possible to maintain the state closed to the housing wall 2051a or 2051c even while moving along the guide rail 2026. Therefore, regardless of the position and operation of the movable chamber 2003, it is possible to suppress ingress of gas and particles toward the inside rather than the outside of the movable chamber 2003. In other words, the movable chamber 2003 forms a substantially closed space having a higher degree of closeness by cooperating with the housing walls 2051a and 2051c.

In the upper part of the ceiling wall 2035 constituting the movable chamber 2003, gas support ports 2041a are provided in five locations, the center and four corners. These gas supply ports 2041a are connected to a not-shown gas supply source by a flexible tube 2041b that is a piping. The flexible tube 2041b is partially coiled, and is able to extend and contract along with the movement of the movable chamber 2003. These gas supply sources, gas supply port 2041a, and flexible tube 2041b constitute a gas supply means 2041, and are able to control stop of supply and supply of gas, and gas flow rate based on the instruction from the controller 2009 (refer to FIG. 13). By supplying gas, inside the movable chamber 2003, the gas ejects downward from the gas supply port 2041a, and pushes out the gas stayed inside, thereby increasing the concentration of the newly supplied gas. In this embodiment, a nitrogen gas is supplied by the gas supply means 2041, but the gas is not limited to this, and other gases can be used.

Further, on the wall part 2034 constituting the movable chamber 2003, an exhaust damper 2042 is provided as a gas discharge means for discharging gas. The exhaust damper 2042 includes a not-shown shutter, and is able to communicate the interior of the moving chamber 2003 with the outside by opening the shutter by operating based on the instruction from the controller 2009. In this case, by combining with the gas supply by the gas supply means 2041, it is possible to efficiently purge the gas in the movable chamber 2003 by exclusively discharging the gas by the exhaust damper 2042.

Further, as shown in FIG. 13, when the movable chamber 2003 moves to a standby position set on one end side of the guide rail 2026, it is possible to connect the exhaust damper 2042 to an exhaust duct 2043 provided on the housing wall 2051d of the housing 2051. In this state, by opening an opening and closing valve 2043a provided in the exhaust duct 2043, it is possible to communicate the interior of the moving chamber 2003 with the outside of the wafer transport chamber 2005. By doing so, it is possible to directly discharge the gas in the movable chamber 2003 to the outside of the EFEM 2001 by the gas purging, and discharge the gas to the outside without contaminating the internal space of the wafer transport chamber 2005, in the initial state or the like that the internal cleanliness of the movable chamber 2003 is low. Of course, when the internal cleanliness of the movable chamber 2003 is more preferable than the internal cleanliness of the wafer transport chamber 2005, it is permitted to discharge the gas toward the interior of the wafer transport chamber 2005 through the exhaust duct 2043 of the movable chamber 2003.

To control the main body 2011 of the EFEM 2001 including the wafer transport apparatus 2002, the EFEM 2001 has a controller 2009 as shown in FIG. 13. The controller 2009 comprises an ordinary microprocessor or the like, including a CPU, a memory, and an interface. The memory previously stores a program necessary for the processing, the CPU sequentially retrieves and executes the necessary program, and realizes an intended function by cooperating with peripheral hardware resources.

The controller 2009 is configured with a movable chamber position control unit 2091, an arm position control unit 2092, a lift position control unit 2093, a gas supply control unit 2094, a gas discharge control unit 2095, and a timing control unit 2096.

The movable chamber position control unit 2091 can move the movable chamber 2003 along the guide rail 2026 and stop at any position, by giving a driving instruction to a not-shown driving means. The arm position control unit 2092 changes the direction of the transport arm 2024, and performs extension and contraction to any length, by giving a driving instruction to an actuator (not shown) provided in the base 2023. The lift position control unit 2093 performs a lifting operation, and can set the transport arm 2024 at any height position, by giving a driving instruction to an actuator for lifting (not shown) incorporated in the base 2023. The gas supply control unit 2094 controls supply of gas by giving an instruction to the gas supply means 2041, and can change the flow rate of gas, in addition to start and stop of gas supply. The gas discharge control unit 2095 can open and close the shutter of the exhaust damper 2042 provided in the movable chamber 2003, and open and close the opening and closing valve 2043a of the exhaust duct 2043 provided in the housing 2051, by outputting a driving instruction. The timing control unit 2096 gives an operation instruction to the gas supply control unit 2094 and the gas discharge control unit 2095 to perform supply and discharge of gas at a predetermined timing based on the timing data stored inside. The gas supply control unit 2094 and the gas discharge control unit 2095 start and stop the control, or change the control contents, according to a given operation instruction, enabling an interlocked control.

By operating the wafer transport 2002 configured as described above by the control of the controller 2009, it is possible to transport the wafer W as described below.

Here, as an example, a description will be given to the case where the wafer W is transported to the load lock chamber 2081 from the FOUP 2062 connected to the load port 2061 that is one transfer position.

First, as shown in FIG. 13, the wafer transport apparatus 2002 moves the movable chamber 2003 to a standby position close to one end of the guide rail 2026 (the upper side in the drawing), based on the driving instruction from the movable chamber position control unit 2091. Then, the gas supply means 2041 supplies a nitrogen gas based on the operation instruction from the gas supply control unit 2094. Further, according to the instruction from the timing control unit 2096, the gas discharge control unit 2095 outputs a driving instruction, thereby opening the shutter of the exhaust damper provided in the movable chamber 2003 and the opening and closing valve 2043a of the exhaust duct provided in the housing 2051. By doing so, a nitrogen gas is supplied to the movable chamber 2003, and the gas stayed in the movable chamber 2003 is discharged to the outside of the housing 2051 through the discharge dumber 2042, thereby purging the gas in the movable chamber 2003.

When predetermined time has passed, and the concentration of nitrogen gas has increased to a certain level or higher based on the driving instruction from the gas discharge control 2095, the shutter of the exhaust damper 2042 and the exhaust duct 2043 are closed. As described above, since the volume of the movable chamber 2003 is sufficiently small, the use amount of nitrogen gas required to purge the gas is much smaller as compared with the case of purging the entire wafer transport chamber 2005, and it is possible to save the cost of gas and time for gas purging.

When the shutter of the exhaust damper 2042 and the exhaust duct 2043 are closed, as the movable chamber 2003 is a substantially closed space, it is possible to set the internal pressure of the movable chamber 2003 to a positive pressure higher than the outside by continuing the supply of nitrogen gas. By doing so, it is possible to suppress ingress of particles and air containing moisture into the movable chamber 2003 through the openings 2031a and 2033a. Although the supply of nitrogen gas from the gas supply means 2041 is continued, based on the operation instruction from the gas supply control unit 2094, the flow rate is reduced to the extent to maintain the positive pressure in the movable chamber 2003. By doing so, it is possible to further reduce the use amount of nitrogen gas. The timing of the above-mentioned control of the gas supply control unit 2094 and the gas discharge control unit 2095 is determined by the timing control unit 2096. The timing is not limited to this, and can be configured using a timer or the like.

After increasing the nitrogen gas concentration in the movable chamber 2003 has been increased as described above, the movable chamber 2003 is moved based on the driving instruction from the movable chamber position control unit 2091, and as shown in FIG. 14, opposed to the load port 2061, on which the FOUP 2062 that contains the wafer W as a transport object is mounted.

Figure 17:
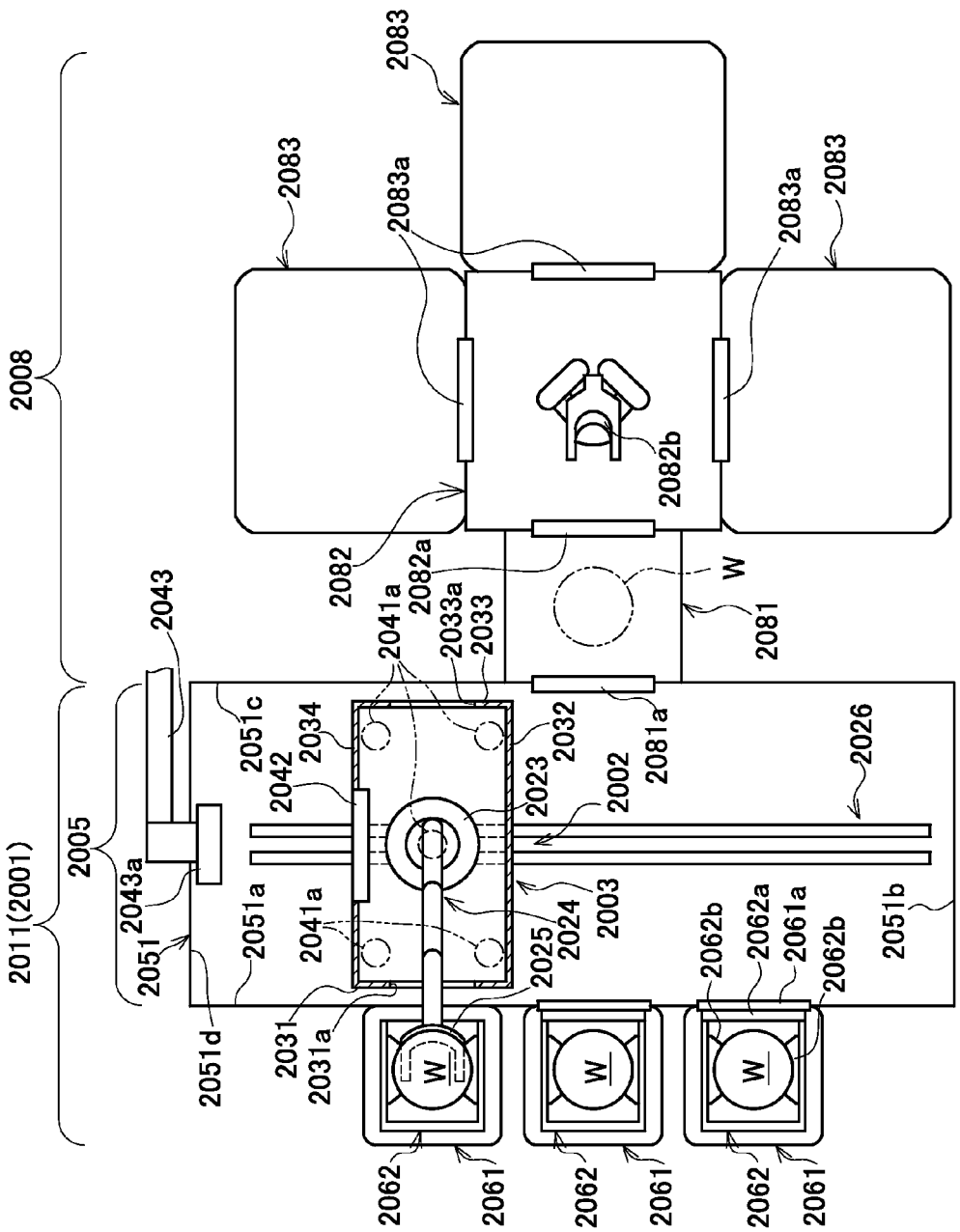
FIG. 17 is a plan view schematically showing a state that a pick enters a FOUP from the state of FIG. 14.

Next, according to the instruction from the controller 2009 (refer to FIG. 13), the door 2061a of the load port 2061 and the lid 2062a of the FOUP 2062 are opened, and the lift position control unit 2093 (refer to FIG. 13) positions the pick 2025 at the end of the transport arm 2024 slightly lower than the wafer W as a transport object. And, as shown in FIG. 17, the arm position control unit 2092 (refer to FIG. 13) extends the transport arm 2024, thereby projecting the tip of the transport arm 2024 from the opening 2031a and entering into the FOUP 2062. At this time, the pick 2025 enters with a slight gap immediately below the wafer W. Further, the lift position control unit 2093 (refer to FIG. 13) raises the transport arm 2024, thereby the wafer W is raised and supported on the pick 2025.

Figure 18:
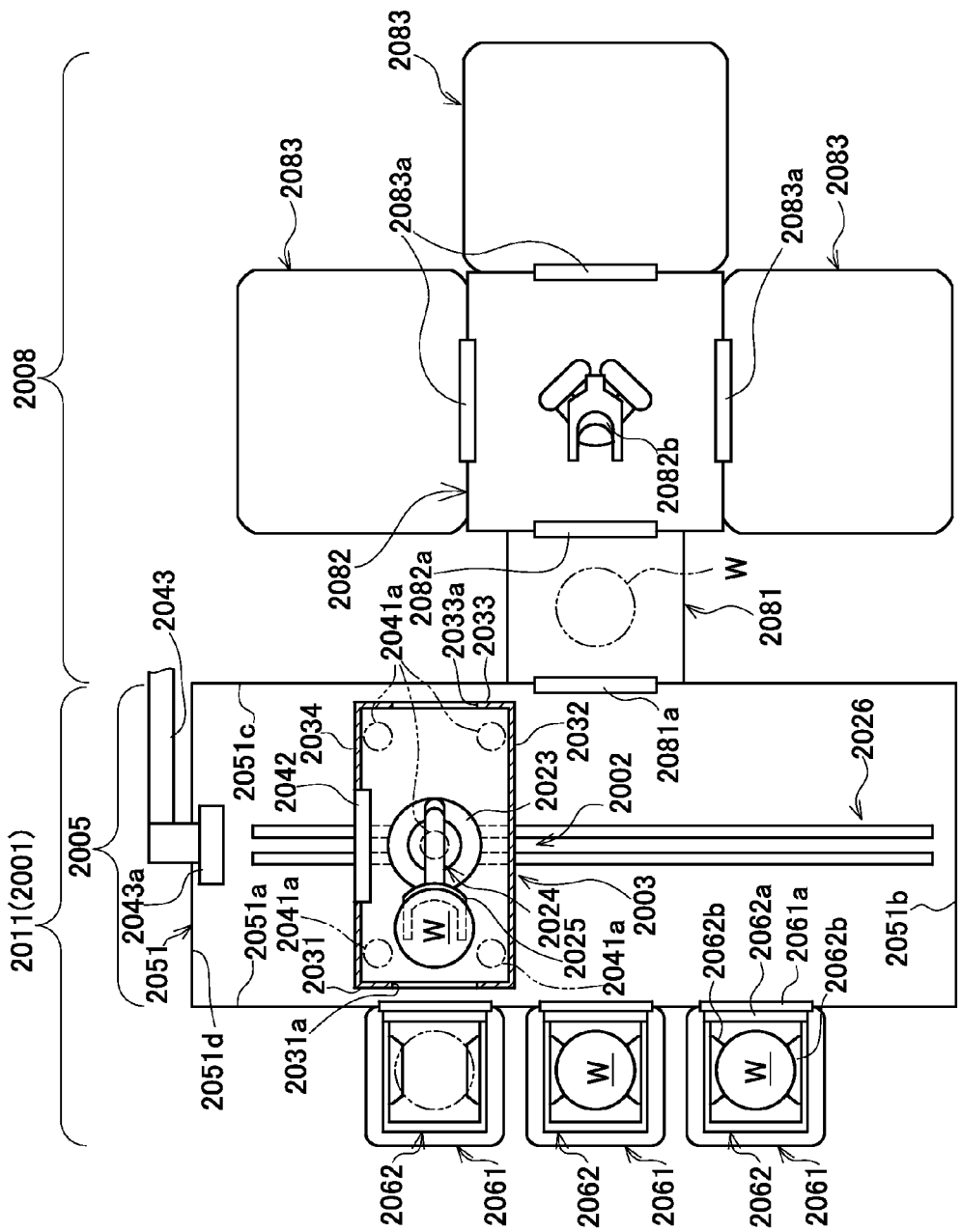
FIG. 18 is a plan view schematically showing a state that a pick returns to the movable chamber from the state of FIG. 17.

From this state, the arm position control unit 2092 (refer to FIG. 13) contracts the transport arm 2024, and as shown in FIG. 18, it is possible to bring the pick 2025 and the wafer W mounted thereon into the movable chamber 2003 through the opening 2031a, and to house it in the chamber. As the wafer W is housed in the movable chamber 2003 immediately after leaving the FOUP 2062, it is not substantially exposed to the air atmosphere in the housing 2051. Therefore, it is possible to suppress adhesion of particles to the wafer W surface, and adhesion of moisture or oxidation by the air atmosphere. After housing the wafer W in the movable chamber 2003, the door 2061a of the load port 2061 and the lid 2062a of the FOUP 2062 are closed, and the inside of the FOUP 2062 is maintained as clean as possible. Further, in order to compensate for the nitrogen flowed out from the FOUP 2062, it is preferable to supply a new nitrogen gas from the load port 2061 after closing the lid 2062a.

Figure 19:
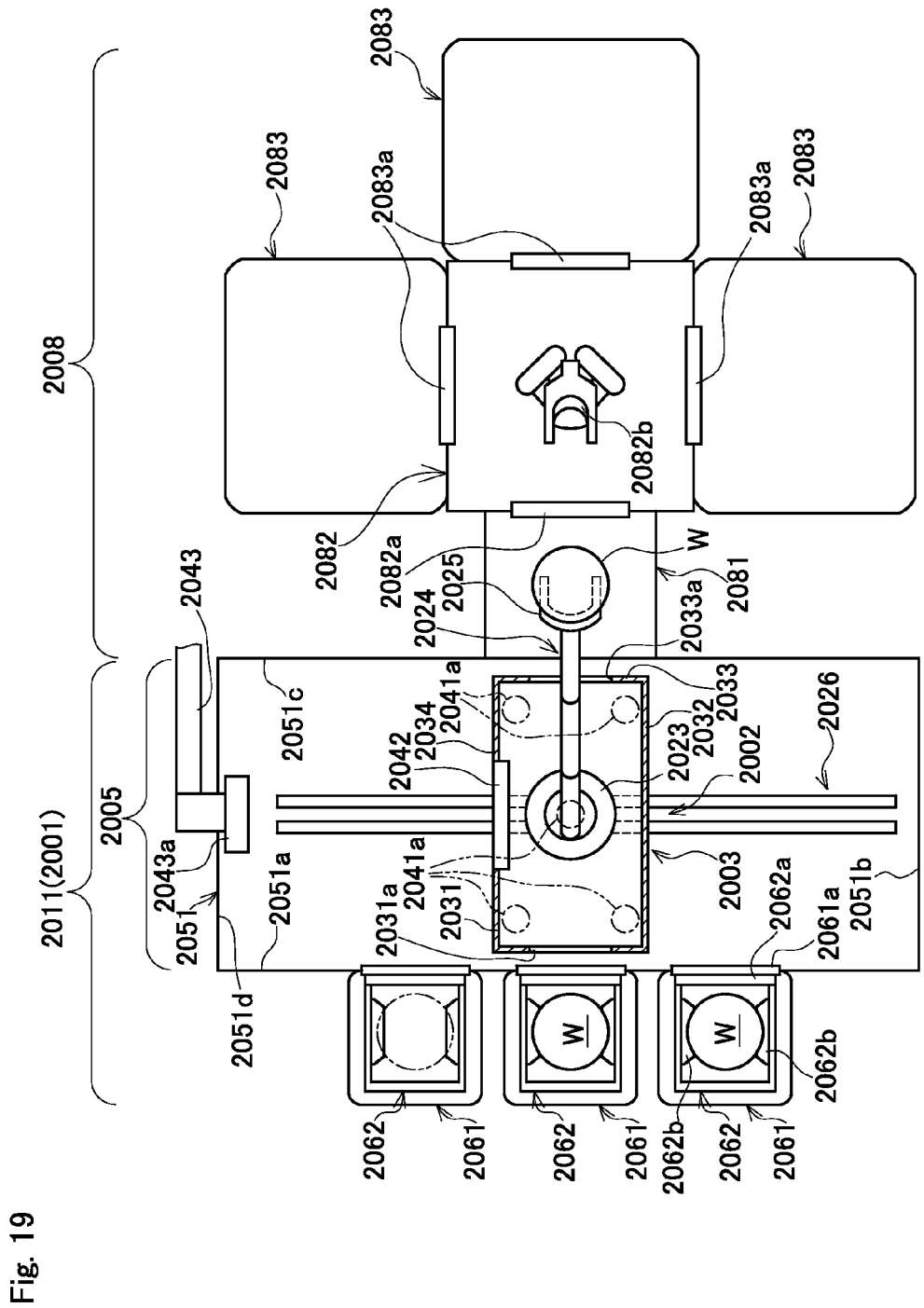
FIG. 19 is a plan view schematically showing a state that a pick enters a load lock chamber from the state of FIG. 18.

Next, according to a driving instruction from the movable chamber position control unit 2091 (refer to FIG. 13), the movable chamber 2003 is moved along the guide rail 2026, and opposed to the load lock chamber 2081, and the door 2081a of the load lock chamber 2081 is opened. Further, as shown in FIG. 19, based on the driving instruction from the arm position control unit 2092 (refer to FIG. 13), the transport arm 2024 is turned and extended to the load lock chamber 2081. And, the pick 2025 at the end of the transport arm 2024 and the wafer W project from the opening 2033a, and enter the load lock chamber 2081. Further, according to the instruction from the lift position control unit 2093 (refer to FIG. 13), the transport arm 2024 moves down, and the wafer W is transferred from the pick 2025 to a not-shown mounting base in the load lock chamber 2081.

As described above, when the wafer W is transported to the load lock chamber 2081 from the FOUP 2062, by using the wafer transport apparatus 2002, it is possible to maintain the surface state of the wafer W suitable by replacing a local atmosphere in the movable chamber 2003 configured to cover the transport arm 2024, without replacing the entire internal atmosphere of the wafer transport chamber 2005.

Further, when the wafer W is transported to the FOUP 2062 from the load lock chamber 2081, by doing the above operations in reverse, it is likewise possible to replace a local atmosphere around the wafer W.

As described heretofore, the wafer transport apparatus 2002 as a substrate transport apparatus in this embodiment is configured to transport the wafer W as a substrate between the load port 2061 and the load lock chamber 2081 that constitute a plurality of transfer positions. The wafer transport apparatus comprises a movable chamber 2003, that is a substantially closed space surrounded by wall parts 2031 to 2034, and moved along the guide rail 2026 constituting a predetermined track, to be able to oppose to the load port 2061 and the load lock chamber 2081; and the transport arm 2024 that is able to hold the wafer W by the pick 2025 at the end thereof, wherein the pick 2025 can be housed in the movable chamber 2003 together with the wafer W, and the pick 2025 is allowed to come in and out the movable chamber through the openings 2031a and 2033a formed the wall parts 2031, 2033, thereby enabling the transfer of the wafer W between the load port 2061 and the load lock chamber 2081 being opposite to the movable chamber 2003.

In such a configuration, it is possible to receive the wafer W by the pick 2025 at the end of the transport arm 2024 through the openings 2031a and 2033a in the state that the movable chamber 2003 is opposed to one of the load port 2061 and the load lock chamber 2081, to house the pick 2025 in the movable chamber 2003 together with the wafer W, and to move the movable chamber 2003 so as to oppose to the other load ports 2061 or load lock chamber 2081, and to transfer the wafer W from the transport arm 2024 through the openings 2031a and 2033a. Since the movable chamber 2003 is a substantially closed space, it is possible to transfer the wafer W without almost exposing the wafer W to the outside air, and it is possible to suppress adhesion of the particles contained in the outside air. Further, since the movable chamber 2003 is purged with a nitrogen gas, it is possible to use as a control of property changes on the wafer surface, or as a preparation step for the processing to be done for the wafer W after the transfer. As it is sufficient to perform gas purge only in the substantially closed movable chamber 2003 by changing the periphery of the wafer W to a nitrogen atmosphere, it is possible to reduce the supply amount of gas, and reduce the cost and time.

Being provided with the gas supply means 2041 for supplying gas to the movable chamber 2003, and the exhaust damper 2042 as a gas exhaust means for exhausting the gas from the movable chamber 2003, it is possible to set the movable chamber 2003 in a nitrogen gas atmosphere with an increased concentration of nitrogen gas, by exhausting the gas in the movable chamber 2003 using the exhaust damper 2042, and supplying a nitrogen gas to the movable chamber 2003 using the gas supply means 2041, thereby performing a gas purge of the movable chamber 2003, and further suppressing a change in the surface properties of the wafer W during transport.

Since the atmospheric pressure in the movable chamber 2003 has been set higher than the external pressure, it is possible to prevent ingress of particles into the movable chamber 2003 from the outside, and adhesion to the wafer W surface, by suppressing the inflow of gas into the movable chamber 2003 from other than the gas supply means 2041.

Further, the EFEM 2001 in this embodiment comprises the wafer transport apparatus 2002, and the housing 2051 covering the periphery of the wafer transport apparatus 2002, wherein the load port 2061 and the load lock chamber 2081, as transfer positions, are set adjacent to the outside of the housing walls 2051a and 2051c constituting the housing 2051, and the movable chamber 2003 of the wafer transport apparatus 2002 is movable along the guide rail 2026, while maintaining the state that the wall parts 2031 and 2033 having the openings 2031a and 2033a, respectively, are close to the inside of the housing walls 2051a and 2051c constituting the housing 2051. Thus, the movable chamber 2003 constituting the wafer transport apparatus 2002 moves in the state that the wall parts 2031 and 2033 having the openings 2031a and 2033a, respectively, are close to the inside of the housing walls 2051a and 2051c, and it is also possible to prevent ingress of gas and particles into the movable chamber 2003 through the openings 2031a and 2033a, and to save the supply amount of gas by suppressing a flow-out of the nitrogen gas supplied to the movable chamber 2003.

Fourth Embodiment

Figure 20:
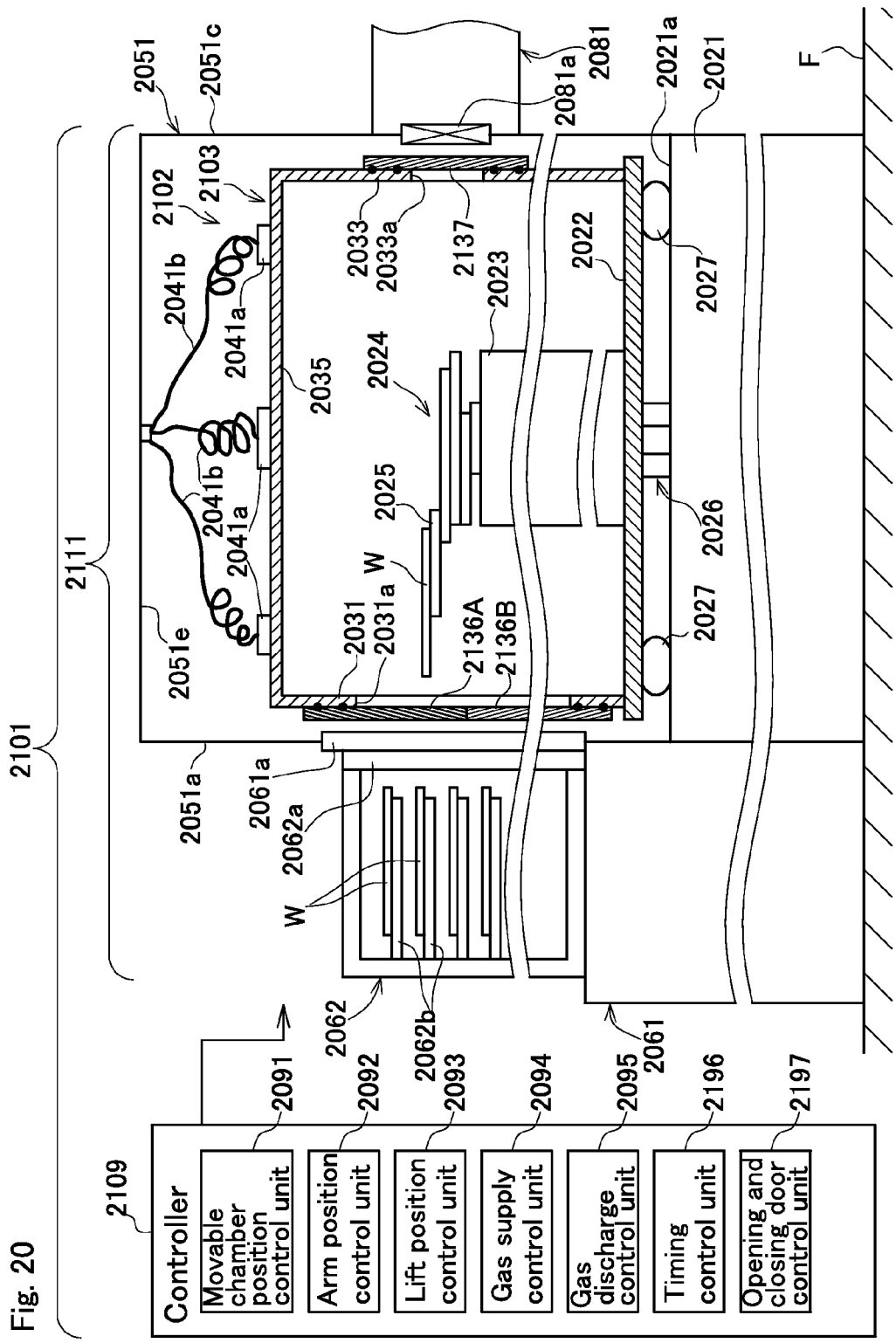
FIG. 20 is an explanatory diagram schematically showing an EFEM comprising a substrate transport apparatus according to a fourth embodiment of the invention.

FIG. 20 is a schematic diagram showing a wafer transport apparatus 2102 as a substrate transport apparatus of the fourth embodiment, and an EFEM 2101 including the same. In this diagram, the same parts as the third embodiment are denoted by the same reference numerals, and a description thereof will be omitted.

The EFEM 2101 comprises a main body 2111, and a controller 2109 that controls the same. The main body 2111 comprises a wafer transport apparatus 2102 including a movable chamber 2103. The wafer transport apparatus 2102 in this embodiment is characterized in that opening and closing doors 2136A and 2136B are provided on a wall part 2031 of a load port 2061 that constitutes the movable chamber 2103, and an opening and closing door 2137 that enables to open and close an opening 2033a is provided on a wall part 2033 of a load lock chamber 2081.

The opening and closing doors 2136A, 2136B, and 2137 are enabled to slide independently in the extending direction of the guide rail 2026 by a not-shown actuator. The opening and closing doors 2136A, 2136B, and 2137 can be configured to slide in the other directions, as long as the openings 2031a and 2033a can be opened and closed, or may be configured to rotate instead of sliding, or to perform more complex movement using a link mechanism or the like.

The controller 2109 comprises an opening and closing door control unit 2197, and is able to slide the opening and closing doors 2136A, 2136B, and 2137, thereby opening or losing the opening 2031a and 2033a, by outputting a driving instruction to the actuator from an opening and closing door control unit 2197. A timing control unit 2196 of the controller 2109 controls the operation timing of the opening and closing doors 2136A, 2136B, and 2137, in addition to control the control timing of the gas supply control unit 2094 and the gas discharge control unit 2095 descried in the third embodiment.

Since the airtightness of the movable chamber 2103 can be enhanced by closing the openings 2031a and 2033a using the opening and closing doors 2136A, 2136B, and 2137, when the transport arm 2024 needs not to project from the openings 2031a and 2033a, it is possible to increase the concentration of nitrogen gas in the movable chamber 2103, or reduce the use amount thereof.

Even in the above configuration, it is possible to obtain the same effects as the third embodiment.

Further, since the wafer transport apparatus 2102 as a substrate transport apparatus in this embodiment is configured to include the opening and closing doors 2136A, 2136B, and 2137 for opening and closing the openings 2031a and 2033a, when the end of the transport arm 2024 needs not to project from the openings 2031a and 2033a, it is possible to increase the airtightness of the movable chamber 2103, and suppress ingress of gas and particles from the outside. It is also possible to increase the concentration of the nitrogen gas supplied to the movable chamber 2103, and reduce the use amount of the nitrogen gas.

Fifth Embodiment

Figure 21:
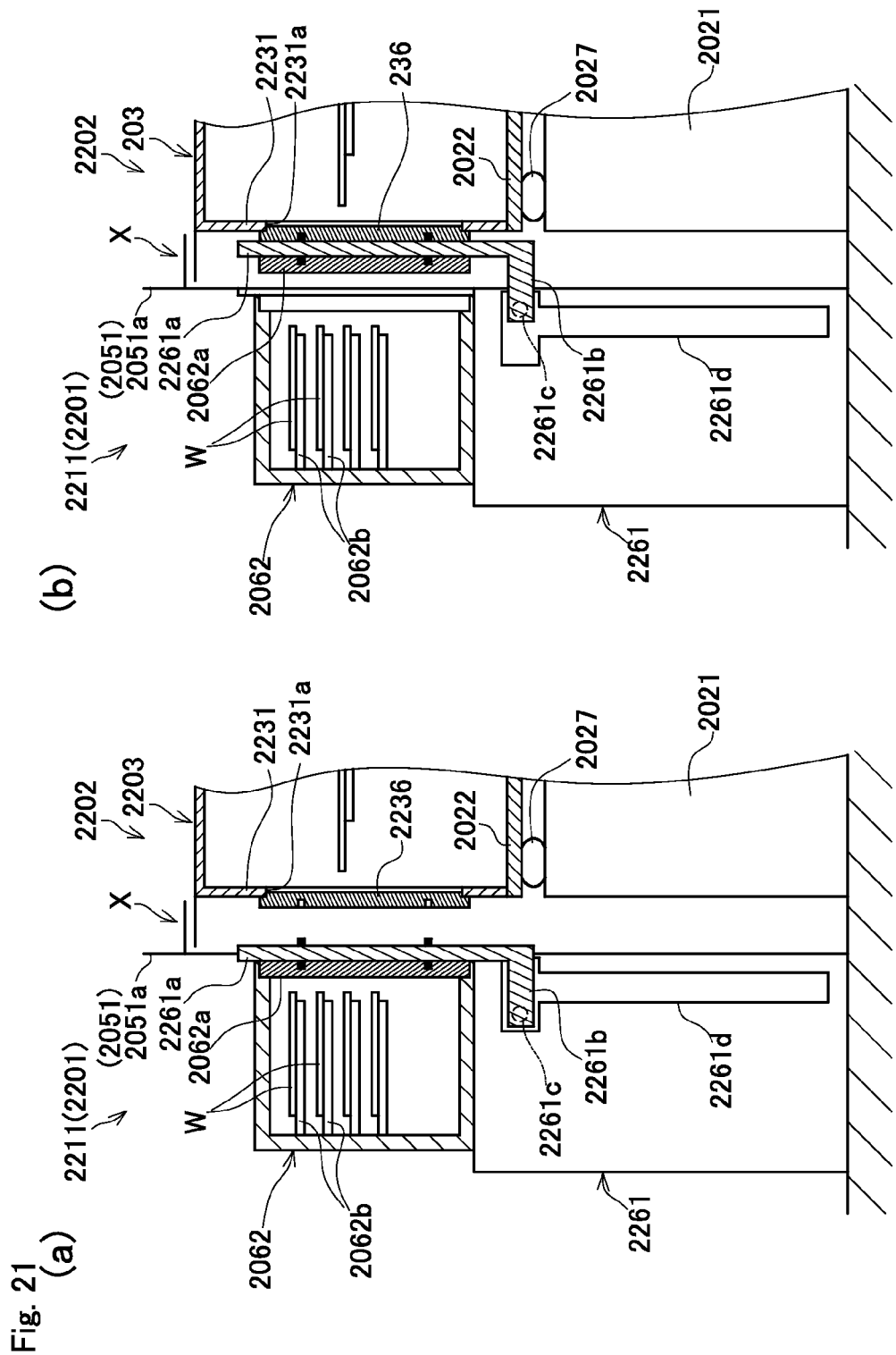
FIGS. 21(a) and (b) are explanatory diagrams for explaining a structure and operation of an EFEM comprising a substrate transport apparatus according to a fifth embodiment of the invention.
Figure 22:
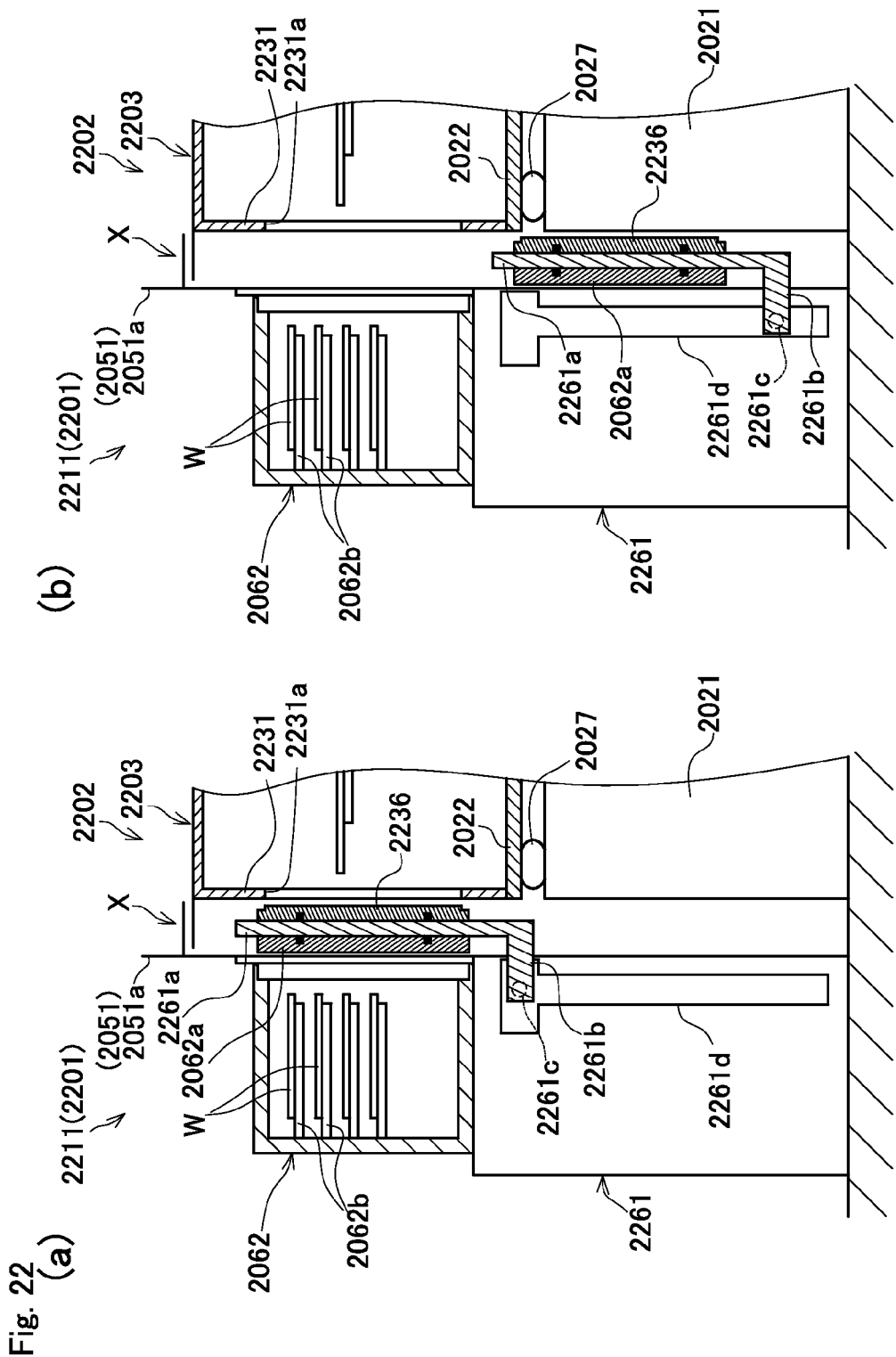
FIGS. 22(a) and (b) are explanatory diagrams for explaining a structure and operation of an EFEM provided with the substrate transport apparatus, following FIG. 21.

FIG. 21 and FIG. 22 are schematic diagrams showing a wafer transport apparatus 2202 as a substrate transport apparatus of the fifth embodiment, and an EFEM 2201 including the same. In these diagrams, the same parts as the third and fourth embodiments are denoted by the same reference numerals, and a description thereof will be omitted.

The EFEM 2201 comprises a main body 2211, and a controller 2009 (refer to FIG. 13) that controls the same. The main body 2211 comprises a wafer transport apparatus 2202 including a movable chamber 2203. The wafer transport apparatus 2202 in this embodiment is characterized in that an opening and closing door 2236, that enables the opening and closing of the opening 2231a, is provided on a wall part 2231 of a load port 2261 that constitutes the movable chamber 2203.

As shown in FIG. 21 (*a*), the load port 2261 includes a door 2261a that can be connected to a lid 2062a of a FOUP 2062. In the lower part of the door 2261a, a support base 2261b extending in the horizontal direction is integrally provided. A roller 2261c is provided in the end portion thereof. The roller 2261c engages with a rail 2261d formed into a T-shape, thereby moving along the rail 2261d while the position is controlled. Further, a not-shown actuator is connected to the support base 2261b, and it is possible to move the lid 2261a together with the support base 2261b according to the instruction from the controller 2009 (refer to FIG. 13). An appropriate connection means is provided in the door 2261a, and it is possible to connect the lid 2062a of the FOUP 2062 on one side thereof, and to connect the opening and closing door 2236 on the other side.

The door 2261a operates as follows, thereby enabling to open the lid 2062 of the FOUP 2062 and the opening and closing door 2236. First, as shown in FIG. 21 (*a*), the FOUP 2062 is mounted on the load port 2261, whereby the lid 2062a of the FOUP 2062 contacts one side of the door 2261a and connected thereto. And, as show in FIG. 21 (*b*), the door 2261a moves in the direction separating away from the FOUP 2062 (the right direction in the drawing), thereby separating the lid 2062a from the main body of the FOUP 2062, and bringing the other side of the door 2261a into contact with the opening and closing door 2236, and connecting them. Then, as shown in FIG. 22 (*a*), the opening and closing door 2236 is separated from the opening 2231a by slightly separating away from the wall part 2231 of the movable chamber 2203. And, as shown in FIG. 22 (*b*), the door 2261a is moved down in the state that the lid 2062 and the opening and closing door 2236 are connected between the housing wall 2051a of the wafer transport chamber 2005 and the wall part 2231 of the movable chamber 2203. Thus, the opening 2231 and the interior of the FOUP 2062 are opened to each other.

When the above structure is adopted, in order to ensure a space for pulling down the door 2261a, depending on the design, the distance between the housing wall 2051a of the wafer transport chamber 2005 and the wall part 2231 of the movable chamber 2203 may increase. In such a case, a seal part X may be formed by projecting a plate-shaped lid member from one or both of the movable chamber 2203 and the housing wall 2051a.

Even in such a configuration, it is possible to obtain the same effects as the third and fourth embodiments. Further, it is possible to realize the opening and closing of the opening and closing door 2236 by a simple structure, and reduce the cost. It is also possible to suppress further ingress of gas and particles from the outside by opening the opening and closing door 2236 in conjunction with the opening of the lid 2062a of the FOUP 2062.

Sixth Embodiment

Figure 23:
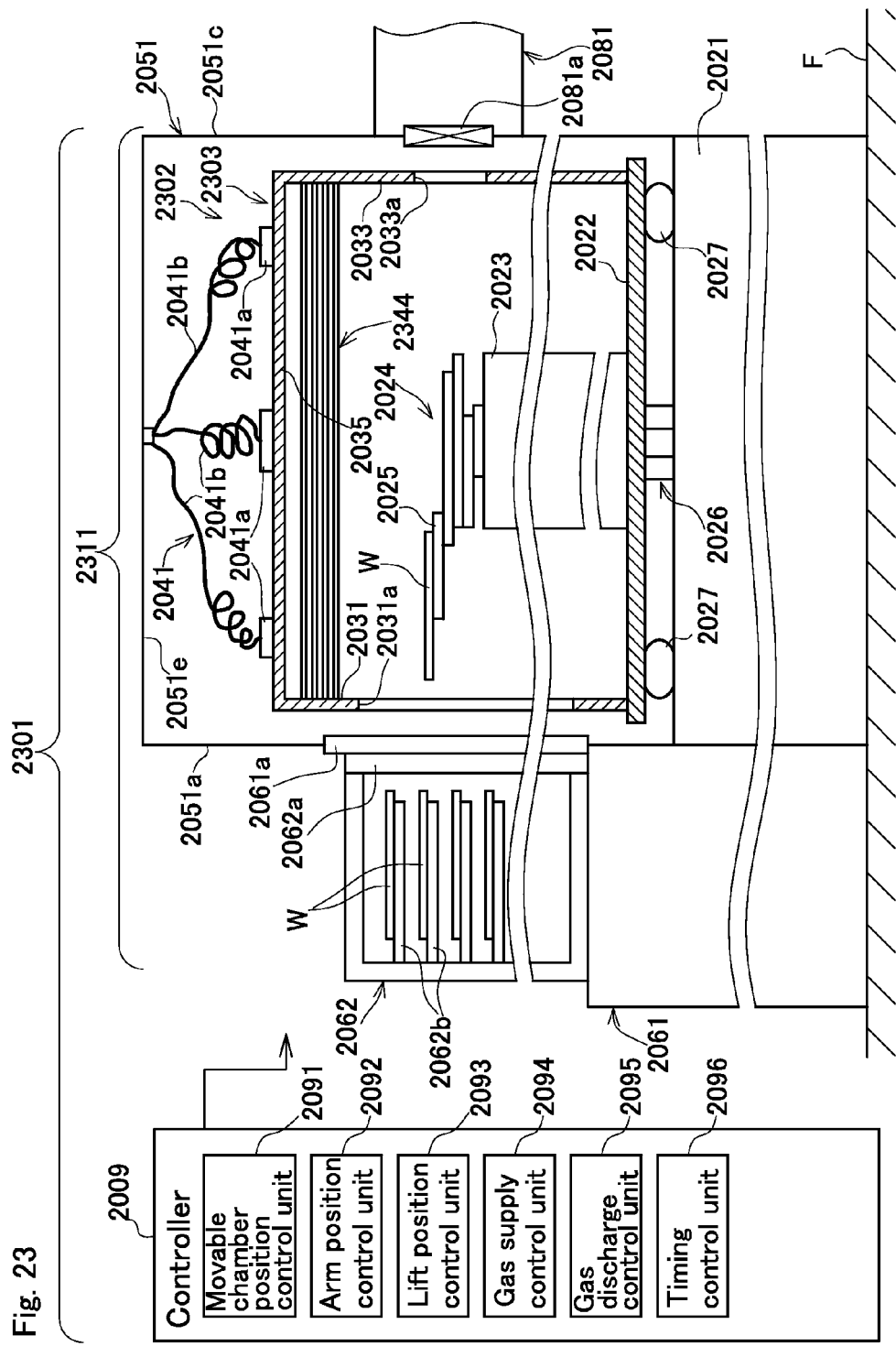
FIG. 23 is an explanatory diagram schematically showing an EFEM comprising a substrate transport apparatus according to a sixth embodiment of the invention.

FIG. 23 is a schematic diagram showing a wafer transport apparatus 2302 as a substrate transport apparatus of the sixth embodiment, and an EFEM 2301 including the same. In this diagram, the same parts as the third to fifth embodiments are denoted by the same reference numerals, and a description thereof will be omitted.

The EFEM 2301 comprises a main body 2311, and a controller 2009 that controls the same. The main body 2311 comprises a wafer transport apparatus 2302 including a movable chamber 2303. The wafer transport apparatus 2302 in this embodiment is based on the configuration of the third embodiment, and characterized in that a filter member 2344 is provided immediately below a ceiling wall 2035 of the movable chamber 2303.

The filter member 2344 is formed to substantially the size as the ceiling wall 2035, and is configured so that a gas supplied through the gas supply port 2041a constituting the gas supply means 2041 is supplied to the movable chamber 2303 through the filter member 2344.

Even in such a configuration, it is possible to obtain the same effects as the third embodiment. Further, even when particles are contained in the gas supplied from the gas supply means 2041, it is possible to further suppress contamination of a wafer W by introducing a clean gas with the particles eliminated to the movable chamber 2303.

Seventh Embodiment

Figure 24:
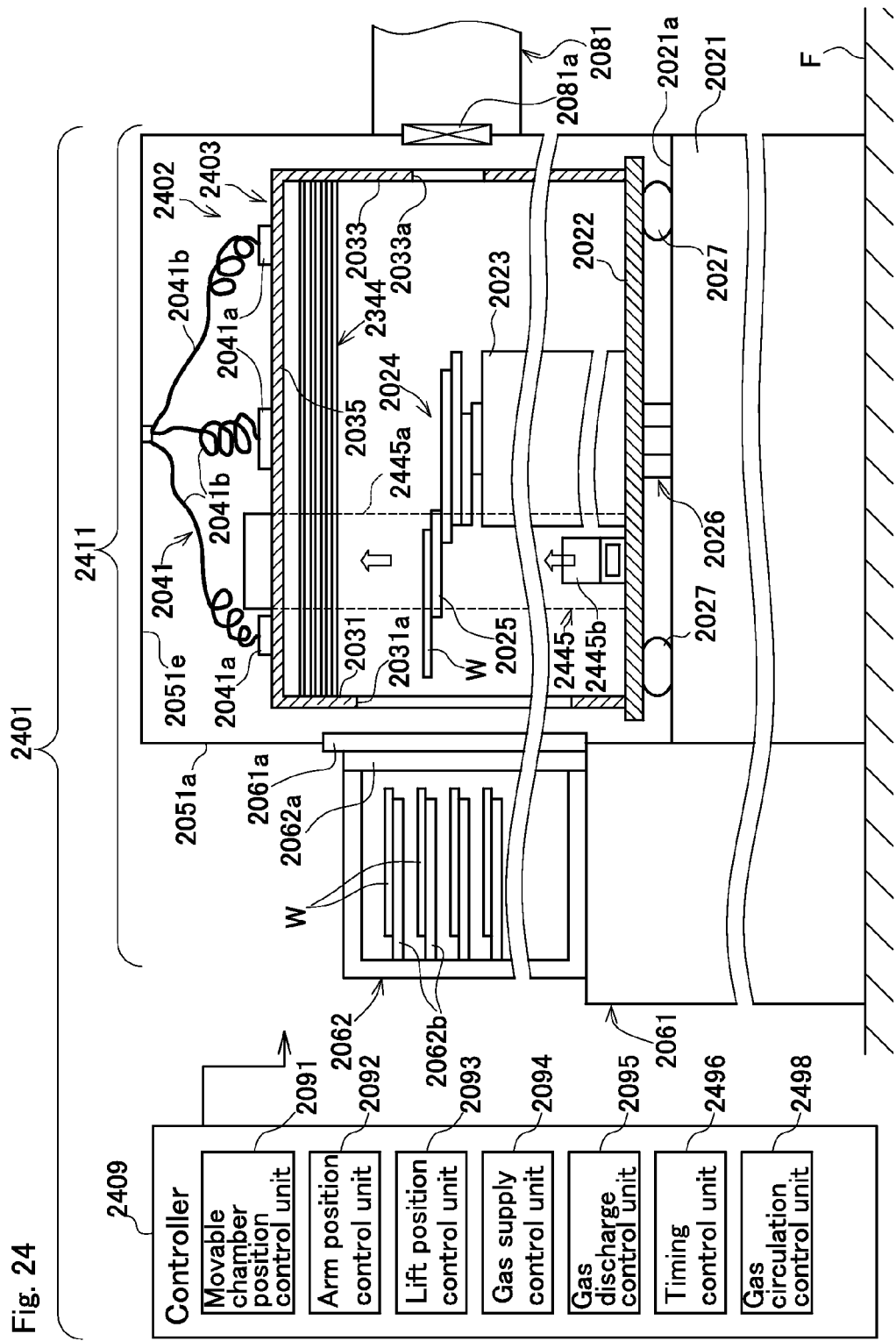
FIG. 24 is an explanatory diagram schematically showing an EFEM comprising a substrate transport apparatus according to a seventh embodiment of the invention.
Figure 25:
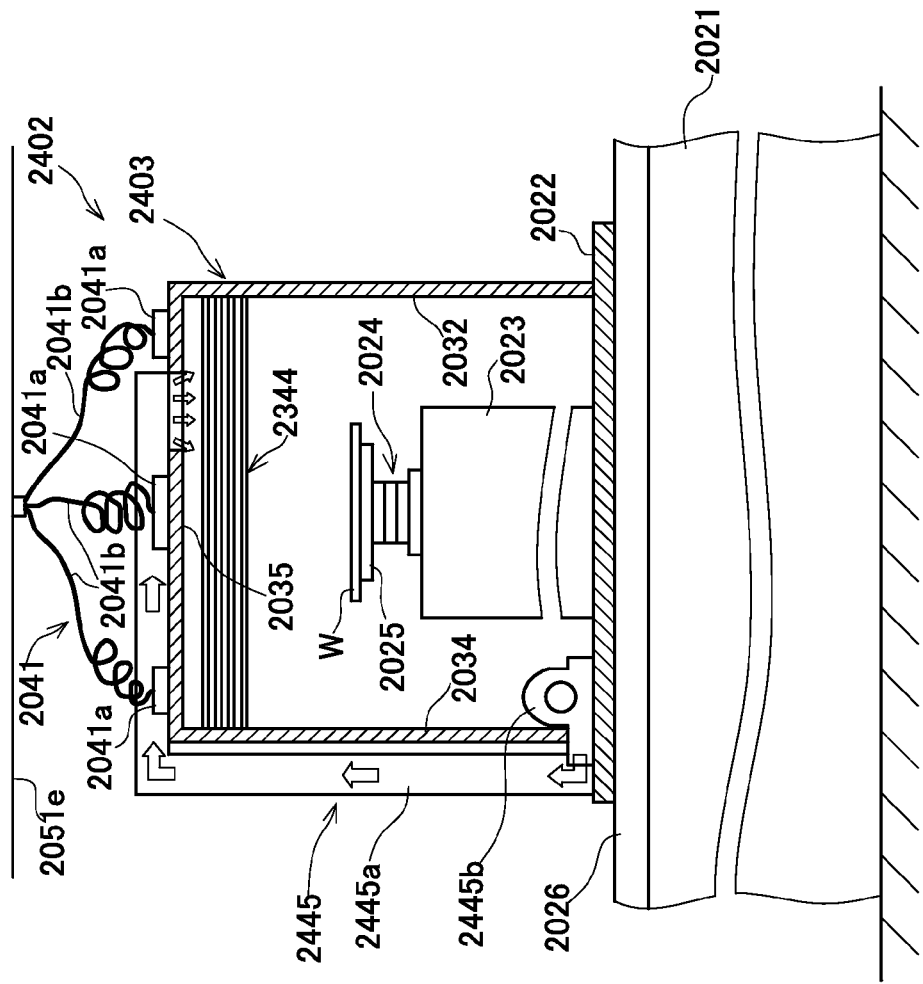
FIG. 25 is a side sectional view schematically showing a state of the substrate transport apparatus as viewed from the direction perpendicular to a guide rail.

FIG. 24 and FIG. 25 are schematic diagrams showing a wafer transport apparatus 2402 as a substrate transport apparatus of the seventh embodiment, and an EFEM 2401 including the same. In these diagrams, the same parts as the third to sixth embodiments are denoted by the same reference numerals, and a description thereof will be omitted.

The EFEM 2401 comprises a main body 2411, and a controller 2409 that controls the same. The main body 2411 comprises a wafer transport apparatus 2402 including a movable chamber 2403. The wafer transport apparatus 2402 in this embodiment is based on the configuration of the sixth embodiment, and characterized by a gas circulation means 2445 that takes in gas from the lower part of the movable chamber 2403, and introduces the gas again from the upper part of the movable chamber 2403.

The gas circulation means 2445, being comprised of a circulation duct 2445a provided along the outer periphery of the movable chamber 2403, and a fan 2445b, takes out the gas from the movable chamber 2403 through an opening provided in the lower part of the wall part 2034 by operating the fan 2445, and introduces the gas again through an opening provided in the ceiling wall 2035, by operating the fan 2445b. As the gas introduced from the ceiling wall 2035 is reintroduced to the movable chamber 2403 through the filter 2344, the gas is more cleaned. It is not indispensable to return all the gas taken out by the fan 2445 to the movable chamber 2403, and it is permitted to return a part of the gas taken out if necessary, and exhaust the rest to the outside.

To operate such a gas circulation means 2445, the controller 2409 includes a gas circulation control unit 2498. The fan 2445b operates according to a driving instruction from the gas circulation control unit 2498, and it is possible to start and stop the circulation of gas, and to change the flow rate of gas during circulation. In addition, a timing control unit 2496 of the controller 2409 governs the control timing of the gas circulation control unit 2498, in addition to the control timing of the gas supply control unit 2094 and the gas discharge control unit 2095.

Even in such a configuration, it is possible to obtain the same effects as the sixth embodiment.

Further, the wafer transport apparatus 2402 as a substrate transport apparatus in this embodiment is configured to include the gas circulation means 2445 that takes out the gas from the movable chamber 2403, and reintroduces at least a part of the gas to the movable chamber 2403 after passing through the filter 2344. Therefore, it is possible to clean the atmosphere in the movable chamber 2403, and suppress further adhesion of particles to the wafer W.

Eighth Embodiment

Figure 26:
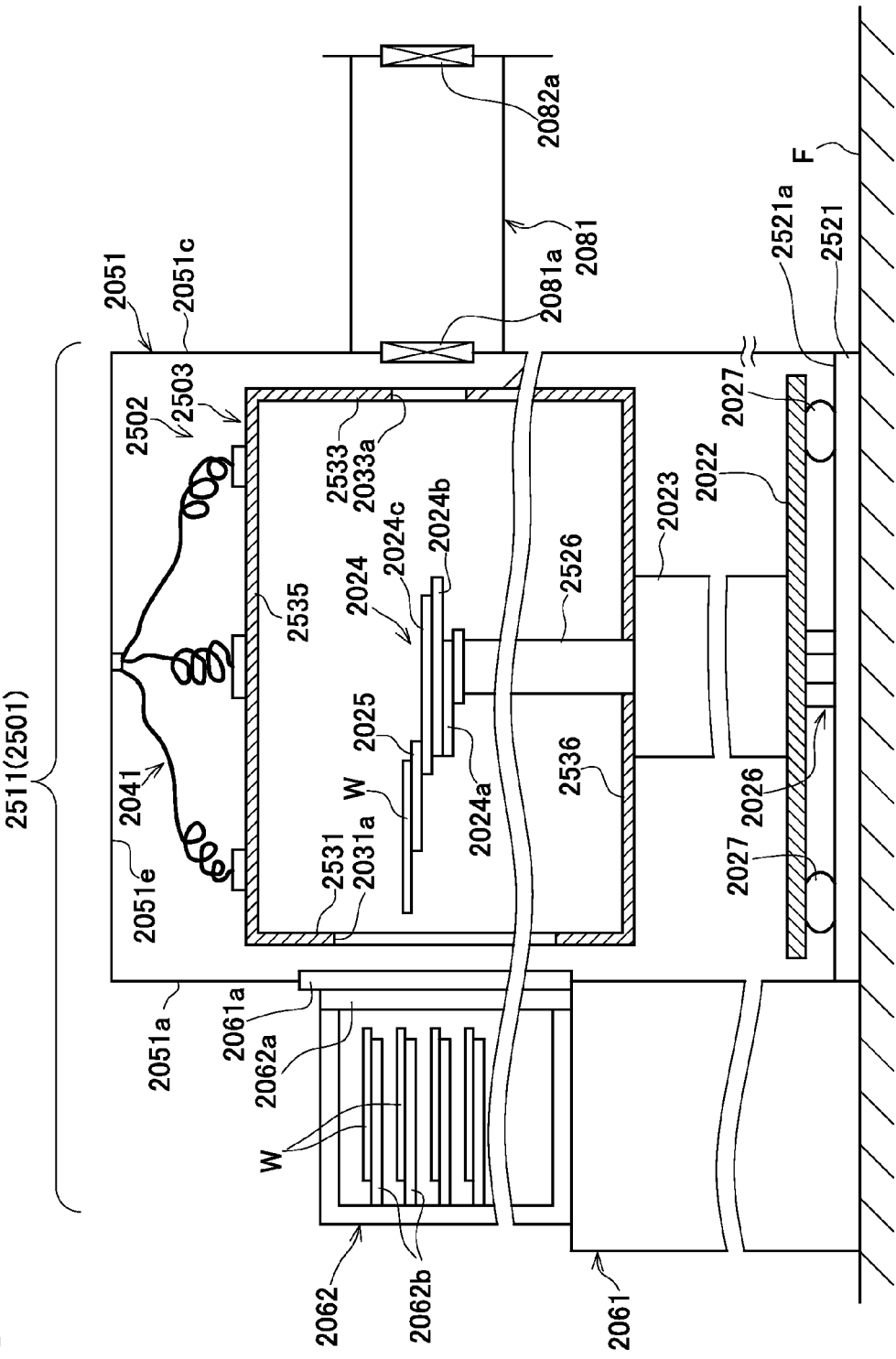
FIG. 26 is an explanatory diagram schematically showing an EFEM comprising a substrate transport apparatus according to an eighth embodiment of the invention.

FIG. 26 is a schematic diagram showing a wafer transport apparatus 2502 as a substrate transport apparatus of the eighth embodiment, and an EFEM 2501 including the same. In the diagram, the same parts as the third to seventh embodiments are denoted by the same reference numerals, and a description thereof will be omitted.

The EFEM 2501 comprises a main body 2511, and a controller 2009 (refer to FIG. 13) that controls the same. The main body 2511 comprises a wafer transport apparatus 2502 including a movable chamber 2503. The wafer transport apparatus 2502 in this embodiment is based on the configuration of the third embodiment, and changed into the shape of the movable chamber 2503 and its support structure.

In particular, in the wafer transport apparatus 2502 in this embodiment, a bottom wall part 2521 constituting the lower surface of the housing 2051 is placed on a floor F, and a movable table 2022 is provided on the bottom wall part 2521 via a guide rail 2026 and rollers 2027. In other words, in this embodiment, a bottom-up structure of the fixed base 2021 (refer to FIG. 16) in the third embodiment is not provided.

A base 2023 is provided on the movable table 2022. The movable chamber 2503 is provided on the base 2023. The movable chamber 2503 is configured of wall parts 2531, 2533 and the like surrounding the four sides of the transport arm 2024, in addition to a bottom wall 2536 and a ceiling wall 2535, forming a substantially closed space inside. A column 2526 stands upward from the upper part of the base 2023 through the opening provided in the bottom wall 2536, and supports the transport arm 2024 on the top of the column 2526. An appropriate transfer mechanism incorporated in the column 2526 transmits a driving force to the transport arm 2024 from the base 2023, enabling to extend and contact the transport arm 2024.

Generally, a part comprising the transport arm 2024 and the base having a mechanism for driving the same is often called a transport robot. According to this, the configuration in this embodiment can be said a configuration that the transport arm 2024 forming a part of a transport robot is housed in the movable chamber 2503, and the base 2023 forming the other part is provided outside the movable chamber.

It is possible to provide the base 2023 outside the movable chamber 2503 in this way. Even in such a configuration, it is possible to obtain the same effects as the third embodiment.

Ninth Embodiment

Figure 27:
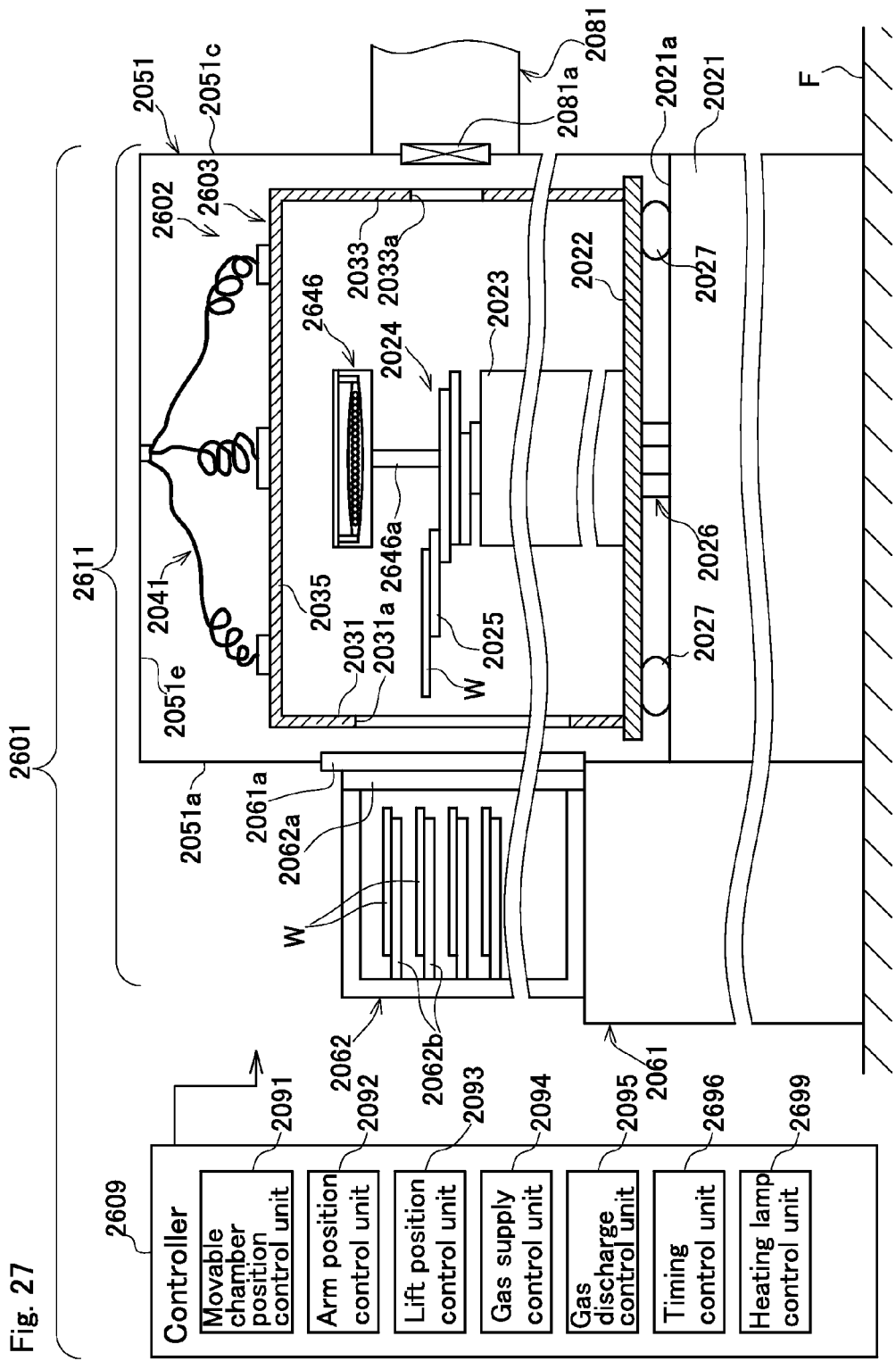
FIG. 27 is an explanatory diagram schematically showing an EFEM comprising a substrate transport apparatus according to a ninth embodiment of the invention.

FIG. 27 is a schematic diagram showing a wafer transport apparatus 2602 as a substrate transport apparatus of the ninth embodiment, and an EFEM 2601 including the same. In the diagram, the same parts as the third to eighth embodiments are denoted by the same reference numerals, and a description thereof will be omitted.

The EFEM 2601 comprises a main body 2611, and a controller 2609 that controls the same. The main body 2611 comprises a wafer transport apparatus 2602 including a movable chamber 2603. The wafer transport apparatus 2602 in this embodiment is based on the configuration of the third embodiment, and characterized by providing a heating lamp 2646 as a heating means inside the movable chamber 2603.

The heating lamp 2646 is supported by the support arm 2646a raised from a side of the base 2023, and provided in a position that can be opposed to the surface of the wafer W when the wafer W is placed on the base 2023. The support arm 2646a may be separated from the base 2023, and raised directly from the movable table 2022.

The controller 2609 includes a heating lamp control unit 2699. A current is applied to the heating lamp 2646 via the heating lamp control unit 2699, and the surface of the wafer W is heated by radiant heat emitted from the heating lamp 2646. As a heating means, it is possible to use various devices such as a generally known wire heater, other than the heating lamp 2646.

It is possible to evaporate and remove the moisture adhered to the wafer W surface by heating the wafer W surface by the heating amp 2646. It is also possible to use as preheating for the processing after the transfer to the processing apparatus 2008 (refer to FIG. 13). In addition, a timing control unit 2696 of the controller 2609 governs the control timing of the heating lamp control unit 2699, in addition to the control timing of the gas supply control unit 2094 and the gas discharge control unit 2095. By doing so, when the wafer W is taken into the movable chamber 2602, it is possible to perform the heating of the wafer W surface and the supply of gas to the wafer W surface at an appropriate timing enabling a preferable preliminary step to prepare for a post-process.

Even in the above configuration, it is possible to obtain the same effects as the third embodiment.

Further, the wafer transport apparatus 2602 in this embodiment is configured to locate the heating lamp 2646 as a heating means for heating the surface of the wafer W at a position in the movable chamber 2603 able to oppose the surface of the wafer W on the transport arm 2024. Thus, it is possible to heat the surface of the wafer W placed on the transport arm 2024 in the transport process by the heating lamp 2646, suppress a characteristic change of the surface of the wafer W caused by moisture, by removing the moisture, and perform preheating for the processing after the transfer.

In addition, the wafer transport apparatus is configured to include the gas supply means 2041, the exhaust duct 2042 as a gas exhaust means (refer to FIG. 13), and the controller 2609 for controlling the heating lamp 2646, wherein the controller 2609 includes the timing control unit 2696 that controls the operation timing of the gas supply means 2041, the exhaust duct 2042, and the heating lamp 2646. Thus, it is possible to heat the wafer W and to purge the gas in the movable chamber 2603 at an operation timing suitable for the other processing steps.

A specific configuration of each part is not limited only to the third to ninth embodiments.

For example, in the third to ninth embodiments, a nitrogen gas is used as a gas for replacing the atmosphere around the wafer W, but it is possible to use various gases such as air and ozone depending on the processing. It is also possible to use clean air with a higher degree of cleanliness than in the wafer transport chamber 2005, and use even air heated to a high temperature by a heating means.

Further, in the third to ninth embodiments, the wafer W is transported between the FOUPs 2062 provided on the load ports 2061 and the load lock chamber 2081, but the transportation may be performed between the FOUPs 2062. When the transportation is performed between the FOUPs 2062, it is sufficient to provide the opening 2031a only in one wall part 2031 of the movable chamber 2003.

In the third to ninth embodiments, the guide rail 2026 constituting a predetermined track is formed linearly, and the movable chamber 2003 is moved linearly along the guide rail. However, the shape of the guide rail 2026 is not limited to this, and it is possible to move the movable chamber 2003 in the other directions by combining a plurality of straight lines and curves. It is also possible to move the movable chamber 2003 in the vertical direction by arranging the guide rail 2026 to extend in the vertical direction. When the moving direction of the movable chamber 2003 can be controlled, it is possible to configure the track by the other means such as a guide roller and a wire, not limited to the guide rail 2026.

Figure 28:
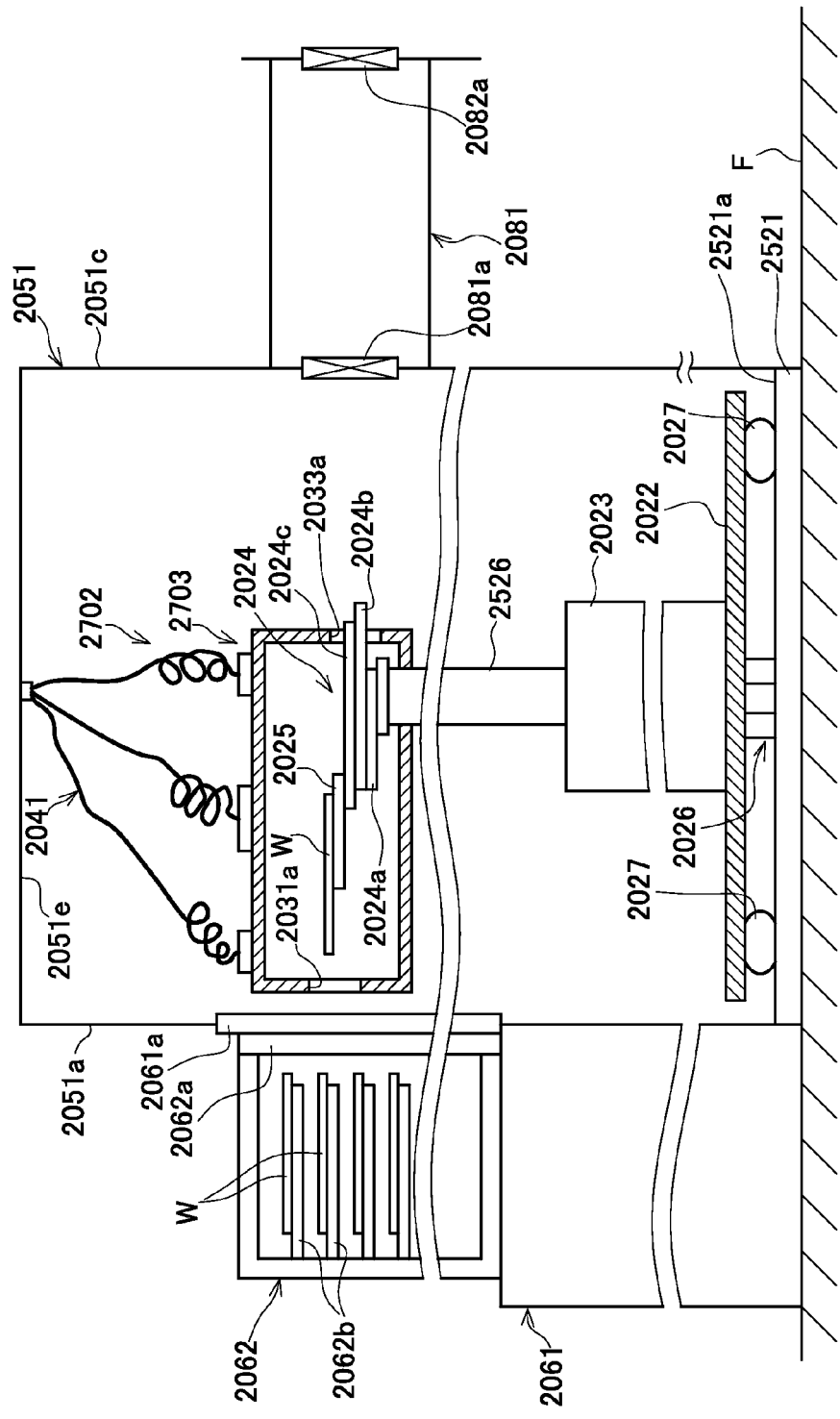
FIG. 28 is a diagram showing a modification of the substrate transport apparatus according to the eighth embodiment of the invention.

In the third to ninth embodiments, the entire transport arm 2024 is configured to be housed in the movable chamber 2003, when the pick 2025 is pulled into the movable chamber 2003. In order to maintain the appropriate atmosphere around the wafer W during transport, it is sufficient to make the pick 2025 at the distal end of the transport arm 2024 containable in the movable chamber 2003 together with the wafer W. In particular, based on the configuration according to the eighth embodiment, it is possible to configure the substrate transport apparatus 2702 modified as shown in FIG. 28. In this modification, the movable chamber 2703 is configured to be able to house only the part near the distal end of the transport arm 2024, and rotatable with the column 2526 as an axis. According to this configuration, it is possible to transport the wafer W between the FOUP 2062 and the lock chamber 2081 almost without exposing to the outside air, by changing the direction of the movable chamber 2703 to follow the transport of the wafer W by the transport arm 2024. Similarly, it is permitted to configure so that the movable chamber 2703 moves to follow the movement of the transport arm 2024. In such a case, it is possible to further reduce the size of the movable chamber 2703 compared with the aforementioned embodiments, and further reduce the use amount of gas.

Further, when the movable chamber 2003 is configured so that the wall parts 2031 and 2033 can be directly connected to the load port 2061, based on the configuration provided with the opening and closing doors 2136A, 2136B, 2137 and 2236 for closing the openings 2031a, 2033a, 2231a, and 2233a as described in the fourth or fifth embodiment, or when a seal member for closing the gap between them is provided, it is possible to communicate the interiors of the movable chamber 2003 and FOUP 2062 without being exposed to the outside air. In such a configuration, the housing 2051 is unnecessary, and the production cost can be further reduced.

A wafer W is assumed as a substrate in the third to ninth embodiments, but the present invention is applied to a substrate transport apparatus that handles various precision processed products such as a glass substrate.

Further, it is possible to use a variety of devices as the wafer transport arm 2024, not limited to the link type arm robot and SCRA type multi-joint robot.

Other configurations may be variously modified without departing from the scope of the invention.

Tenth Embodiment

In the tenth to fourteenth embodiments, it is an object to provide a substrate transport apparatus comprising a substrate transport apparatus, that is configured to be able to suppress adhesion of moisture to a substrate during transport, and optimize the surface properties of a substrate by using a means different from the first to ninth embodiments, and an EFEM provided with the substrate transport apparatus.

Figure 29:
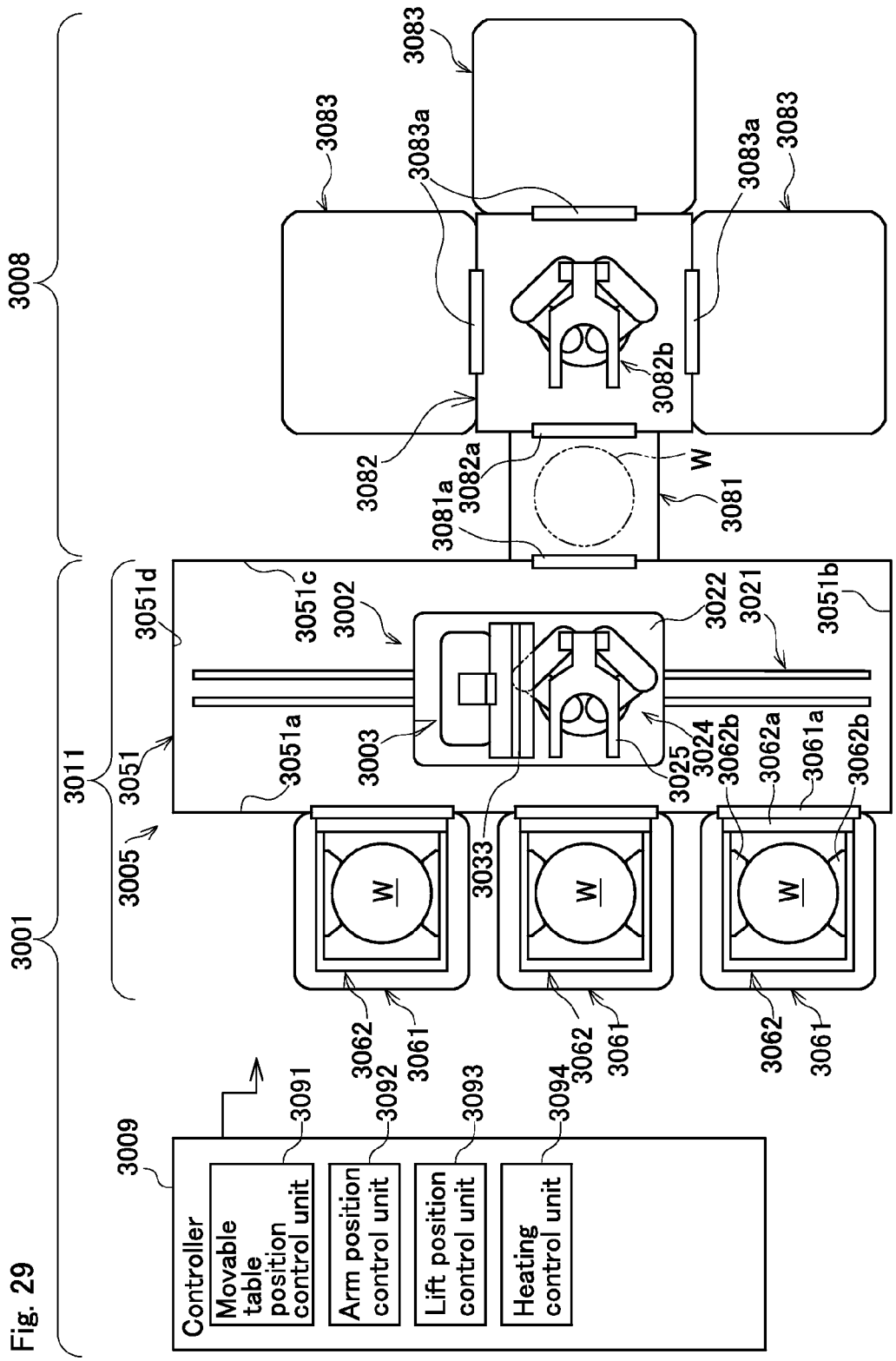
FIG. 29 is an explanatory diagram showing the relationship between an EFEM comprising a substrate transport apparatus according to a tenth embodiment of the invention, and a processing apparatus.

A substrate transport apparatus applied to an EFEM of the tenth embodiment is configured as a wafer transport apparatus 3002 that transports a wafer as a substrate, and is one of the components of an EFEM 3001 shown in FIG. 29. The EFEM 3001 comprises a main body 3011 that is a mechanism that is a mechanical part, and a controller 3009 for controlling the operation of the main body. The main body 3011 includes the wafer transport apparatus 3002 inside, and is able to transport a wafer W between predetermined transport positions by using it. A housing 3051 is provided so as to surround the wafer transport apparatus 3002. The housing 3051 includes housing walls 3051a to 3051d surrounding the four sides of the wafer transport apparatus 3002, and a not-shown ceiling wall, thereby forming a wafer transport chamber 3005 constituting a substantially closed space inside. A plurality of load ports 3061 (three in the drawing) is provided adjacent to the outside of one housing wall 3051a, configuring the main body 3011 of the EFEM 3001 together with the wafer transport chamber 3005, and the wafer transport apparatus 3002 provided therein.

The drawing shows schematically the state that the FOUP 3062 is mounted on the load port 3061. The load port 3061 has a door 3061a. When the door 3061a connects and moves with a lid 3062a of the FOUP 3062, the FOUP 3062 is opened to the wafer transport chamber 3005. Inside the FOUP 3062, a number of mounting parts 3062b to support one wafer W in pairs are provided in the vertical direction inside the FOUP 3062, thereby storing a number of wafers W. Further, the FOUP 3062 is usually filled with nitrogen, and the atmosphere in the FOUP 3062 can be replaced to nitrogen through the load port 3061.

A load lock chamber 3081 configuring a part of the processing apparatus 3008 can be connected adjacent to the outside of a housing wall 3051c opposing the load port 3061. Thus, it is possible to communicate the wafer transport chamber 3005 and a load lock chamber 3081 by opening a door 3081a of the load lock chamber 3081. A variety of devices can be used as the processing apparatus 3008, generally a transport chamber 3082 is provided adjacent to the load lock chamber 3081, and a plurality of processing units 3083 (three in the drawing) is provided adjacent to the transport chamber 3082. Doors 3082a and 3083a are provided between the transport chamber 3082, the load lock chamber 3081 and the processing units 3083. It is possible to communicate the load lock chamber and processing units by opening the doors. It is possible to move a wafer W between the load lock chamber 3081 and the processing units 3083 using a transport robot 3082b provided in the transport chamber 3082.

The wafer transport apparatus 3002 generally comprises a guide rail 3021 constituting a predetermined track, a movable chamber 3022 as a base movable along the guide rail 3021, a transport arm 3024 provided on the movable table 3022, and a heating means 3003 forming a characteristic part of the invention.

Figure 30:
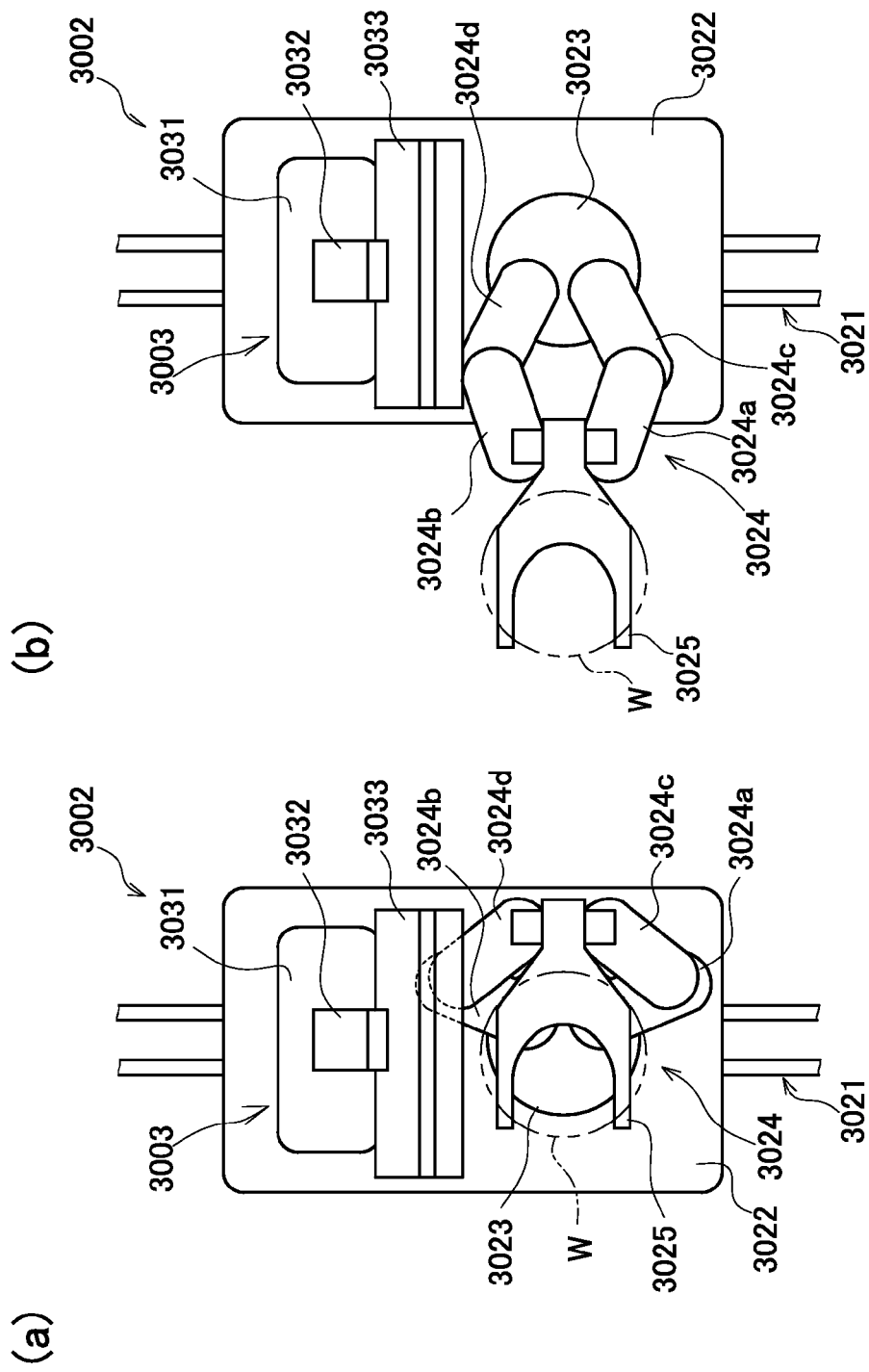
FIGS. 30(a) and (b) are explanatory diagrams showing a state that an essential part of the substrate transport apparatus is seen from a plane.
Figure 31:
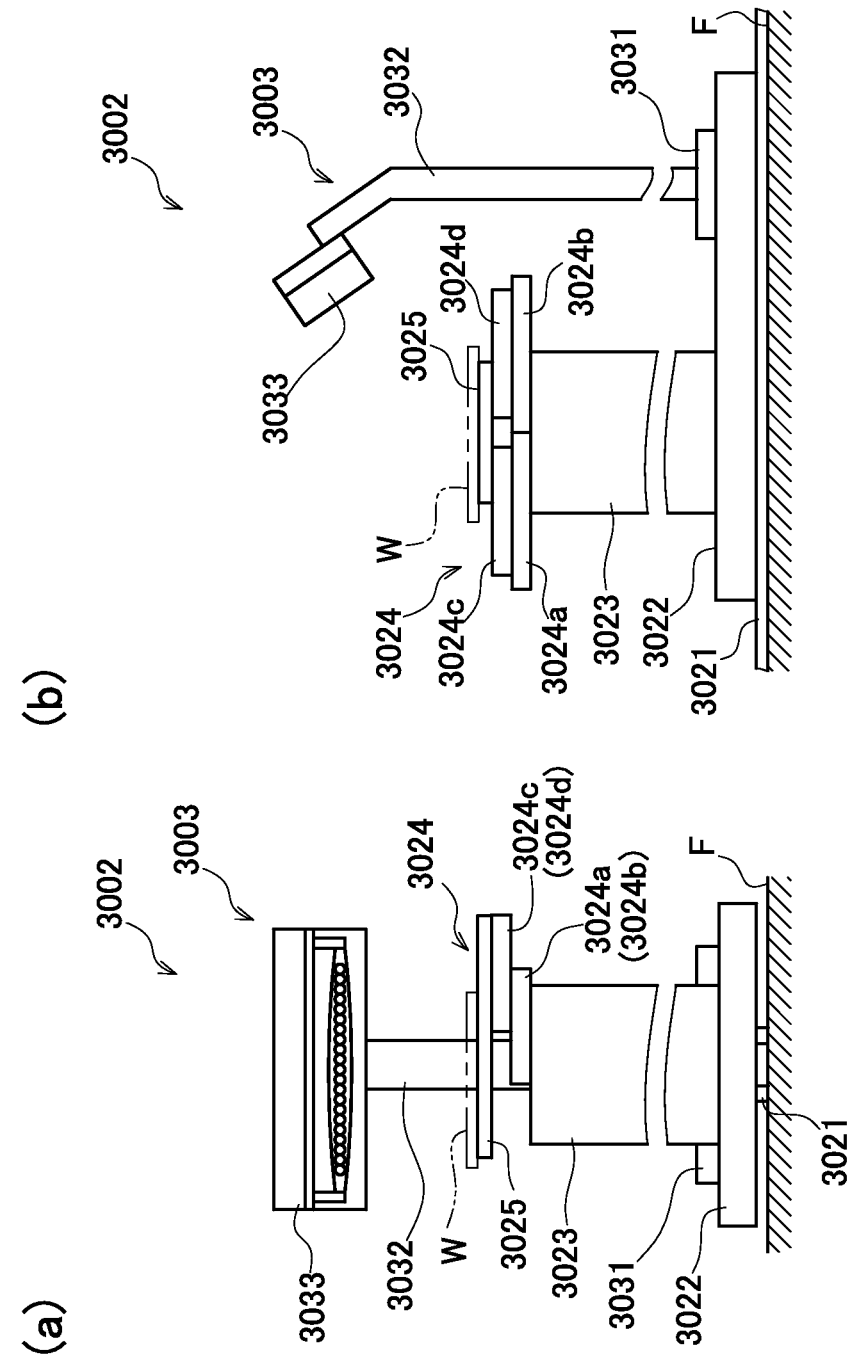
FIGS. 31(a) and (b) are explanatory diagrams showing a state that an essential part of the substrate transport apparatus is seen from a front and a side.

FIG. 30 is a plan view schematically showing an enlarged vicinity of the transport arm 3024 of the wafer transport apparatus 3002. FIG. 30 (a) shows the contracted state of the transport arm 3024. FIG. 30 (b) shows the extended state of the transport arm 3024. FIG. 31 (a) is a front view schematically showing the arm as viewed from the extending direction of the guide rail 3021. FIG. 31 (b) is a side view schematically showing the arm from the direction orthogonal to the guide rail 3021. Hereinafter, a description will be given to the detailed structure of the wafer transport apparatus 3002 with reference to FIG. 30 and FIG. 31.

First, the guide rail 3021 is installed on the floor F in the housing 3051 (refer to FIG. 29). The movable table 3022, as a base, that is formed in a rectangular plate shape is supported on the guide rail 3021. The guide rail 3021 is arranged linearly to be parallel to the housing walls 3051a and 3051c (refer to FIG. 29), thereby forming a linear track. The movable table 3022 is movable along the guide rail 3021 by a not-shown driving means.

A base 3023 that is configured in a substantially cylindrical shape is provided on the upper surface of the movable table 3022. The transport arm 3024 is supported on the base 3023. The transport arm 3024 can be of generally known various structures, for example, a SCRA type multi-joint robot, a multi-stage sliding arm robot, and a link type arm robot can be preferably used. In this embodiment, the transport arm 3024 is configured as an arm robot comprising the pick 3025 and a plurality of arm elements 3024a to 3024d.

In particular, the proximal end of the arm elements 3024a and 3024b are rotatably supported on the base 3023, and the proximal ends of the arm elements 3024c and 3024d are rotatably supported on the distal ends of the arm elements 3024a and 3024b. The distal ends of the arm elements 3024c and 3024d are connected to the proximal end of the pick 3025. The arm elements 3024a to 3024d are rotatable on a horizontal plane, and are coupled and cooperated to move the pick 3025. In such a configuration, it is possible to move the pick 3025 linearly by a not-shown actuator that is incorporated in the base 3023 (refer to FIG. 30 (b)).

The pick 3025 is formed as a plate-shaped member with a U-shaped end in a plan view. It is possible to mount a wafer W on the upper surface of the pick. The transport arm 3024 is configured to be able to horizontally revolve on the movable table 3022. It is possible to face the pick 3025 in any direction of the housing walls 3051a and 3051c (refer to FIG. 29).

In the above configuration, the wafer transport apparatus 3002 can move the wafer W mounted on the pick 3025 constituting the transport arm 3024 in two axes, a direction parallel to the housing walls 3051a and 3051c (refer to FIG. 29), and a direction orthogonal to them. Further, the base 3023 is able to move up and down. Combining these operations, it is possible to lift the wafer W by the pick 3025, and to move the wafer W placed on the pick 3025 to a predetermined transfer position. In the EFEM 3001 of this embodiment, the plurality of load ports 2061 with the FOUP 3062 mounted thereon, and the load lock chamber 3081 opposite thereto (refer to FIG. 29) are set as transfer positions for transferring the wafer W, and it is possible to transfer the wafer W between them using the wafer transport apparatus 3002.

Further, one the movable table 3022, the heating means 3003 is provided on the side of the transport arm 3024. The heating means 3003 comprises a rectangular support base 3031 that is provided on the rear side of the base 3023 on the movable 3022, a support arm 3032 that is brought upward from the support base 3031, and a heater 3022 that is provided at the upper end of the support arm 3022.

The support arm 3032 is arranged in proximity to the transport arm 3024 in a range there is no hindrance to the operation. The upper part of the support arm 3032 is bent substantially to a dogleg shape toward over the transport arm 3024 so that the heater 3033 provided in the upper end can face the wafer W held on the transport arm 3024. The heater 3033 is arranged in a direction as shown in FIG. 31 (a), and is formed in a shape extending in a direction the pick 3025 moves as the transport arm 3024 extends, that is a direction perpendicular to the guide rail 3021. Thus, it is possible to heat almost the entire transport arm 3024, when the transport arm 3024 is contracted and the pick 3025 is placed on the base 3023. It is preferable to make the bending angle of the support arm 3032 changeable from the viewpoint of facilitating adjustment of the heating amount.

As the heater 3033 in this embodiment, actually a heater 3033A shown in FIG. 37 (a) is used. Inside a rectangular parallelepiped heater main body 3033a, a substantially cylindrical heating lamp 3033b is provided along the extending direction of the heater main body 3033a. The heater generates heat by applying a current via a heating control unit 3094 to be described later, and heats the wafer W mainly by radiant heat.

It is also possible to use a heater 3033B shown in FIG. 37 (b) or a heater 3033C shown in FIG. 37 (c). The heater 3033B comprises a heater main body 3033b, and a plurality of bulb type small heating lamps 3033c arranged inside the heater main body along the extending direction. The heater 3033C comprises a heater main body 3033a, and a coiled heating wire 3033d arranged inside the heater main body along the extending direction. By using the heaters 3033B and 3033C having the above structures, similar to the above-mentioned heater 3033A, it is possible to generate heat by applying a current, and heat the wafer W. It is preferable to provide a reflector inside the heater main body 3033a, and improve the efficiency by heating only an object in a specific direction while preventing diffusion of the heat.

To control the main body 3011 of the EFEM 3001 including the wafer transport apparatus 3002, the EFEM 3001 has a controller 3009 as shown in FIG. 29. The controller 3009 is configured of an ordinary microprocessor or the like, comprising a CPU, a memory, and an interface. The memory previously stores a program necessary for processing, the CPU sequentially retrieves and executes a necessary program, and realizes an intended function by cooperating with peripheral hardware resources.

The controller 3009 is configured with a movable table position control unit 3091, an arm position control unit 3092, a lift position control unit 3093, and a heating control unit 3094.

The movable table position control unit 3091 can move the movable chamber 3003 along the guide rail 3021 and stop at any position, by giving a driving instruction to a not-shown driving means. The arm position control unit 3092 changes the direction of the transport arm 3024, and performs extension and contraction to any length, by giving a driving instruction to an actuator (not shown) provided in the base 3023. The lift position control unit 2093 performs a lifting operation, and can set the transport arm 3024 at any height position, by giving a driving instruction to an actuator for lifting (not shown) incorporated in the base 3023. The heating control unit 3094 energizes the heater 3033 constituting the heating means 3033, and controls the current or voltage. Thus, it is possible to change the heating amount per unit time, in addition to the stop of heating and heating of the heater 3033.

By operating the wafer transport apparatus 3002 configured as described above by the control of the controller 3009, it is possible to transport the wafer W as described below. Here, as an example, a description will be given to the case where the wafer W is transported to the load lock chamber 3081 from the FOUP 3062 connected to the load port 3061 that is one transfer position.

Figure 32:
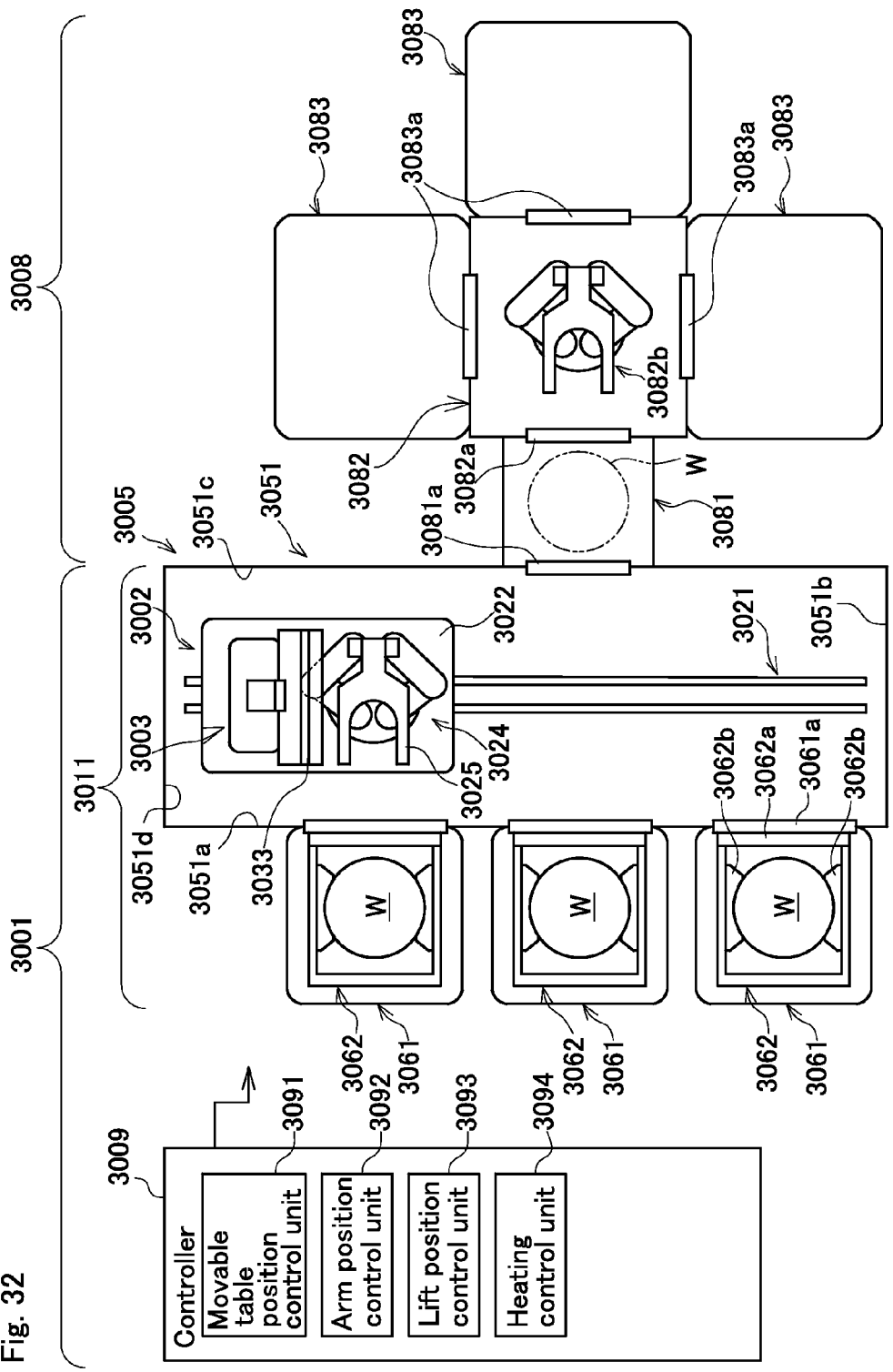
FIG. 32 is an explanatory diagram showing a state that a movable table of the substrate transport apparatus his moved from the state of FIG. 29.

First, as shown in FIG. 32, the wafer transport apparatus 3002 moves the movable table 3022 based on the driving instruction from the movable table position control unit 3091, and opposes the transport arm 3024 to the load port 3061, on which the FOUP 3062 for housing the wafer W as a transport object is mounted.

Figure 33:
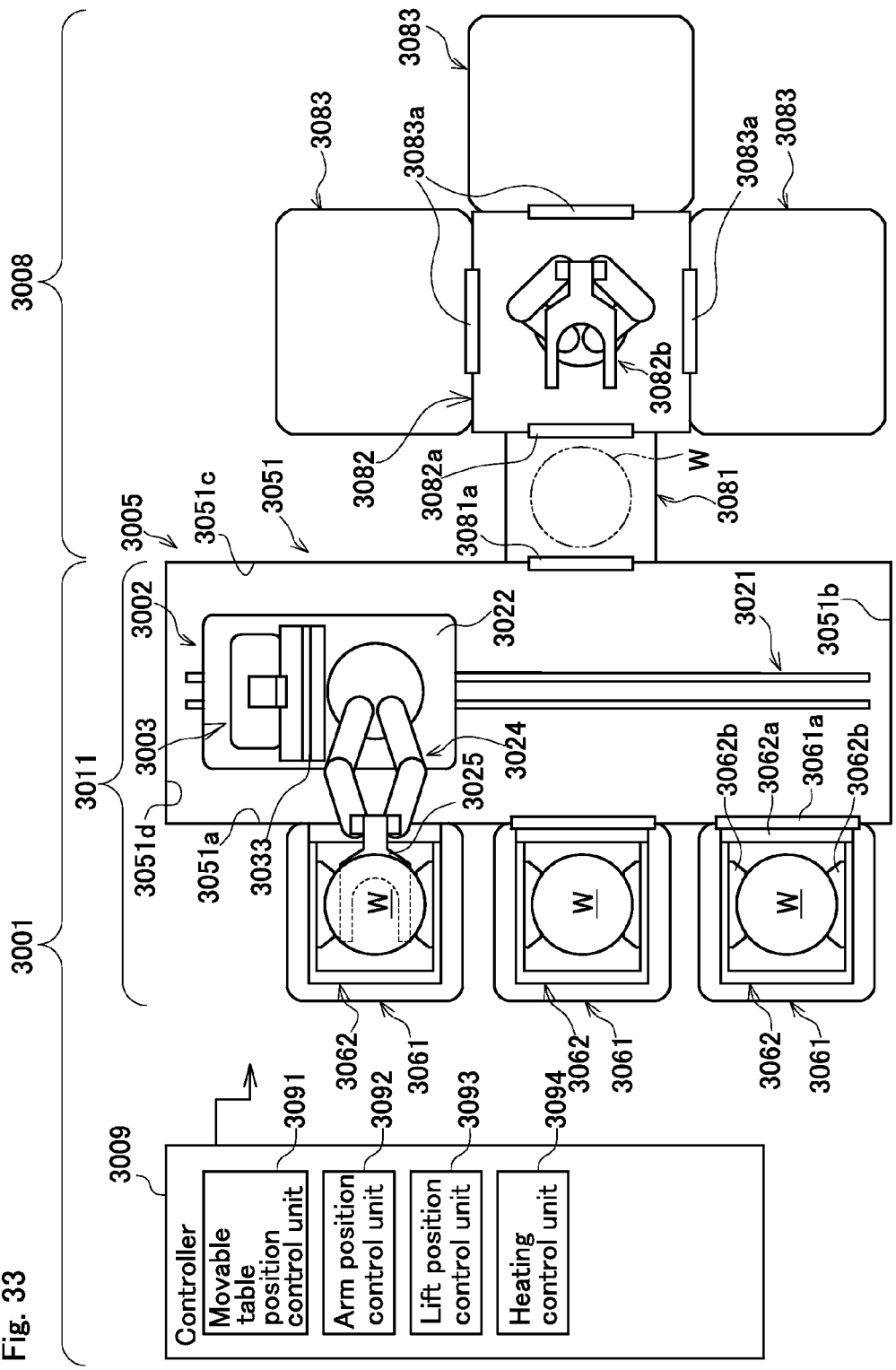
FIG. 33 is an explanatory diagram showing a state that a pick enters a FOUP from the state of FIG. 32.

Next, according to the instruction from the controller 3009, the door 3061a of the load port 3061 and the lid 3062a of the FOUP 3062 are opened, and the lift position control unit 3093 positions the pick 3025 at the end of the transport arm 3024 slightly lower than the wafer W as a transport object. And, as shown in FIG. 33, the arm position control unit 3092 extends the transport arm 3024, thereby entering the end of the transport arm 3024 into the FOUP 3062. At this time, the pick 3025 enters with a slight gap immediately below the wafer W. Further, the lift position control unit 3093 raises the transport arm 3024, thereby the wafer W is raised and supported on the pick 3025.

Figure 34:
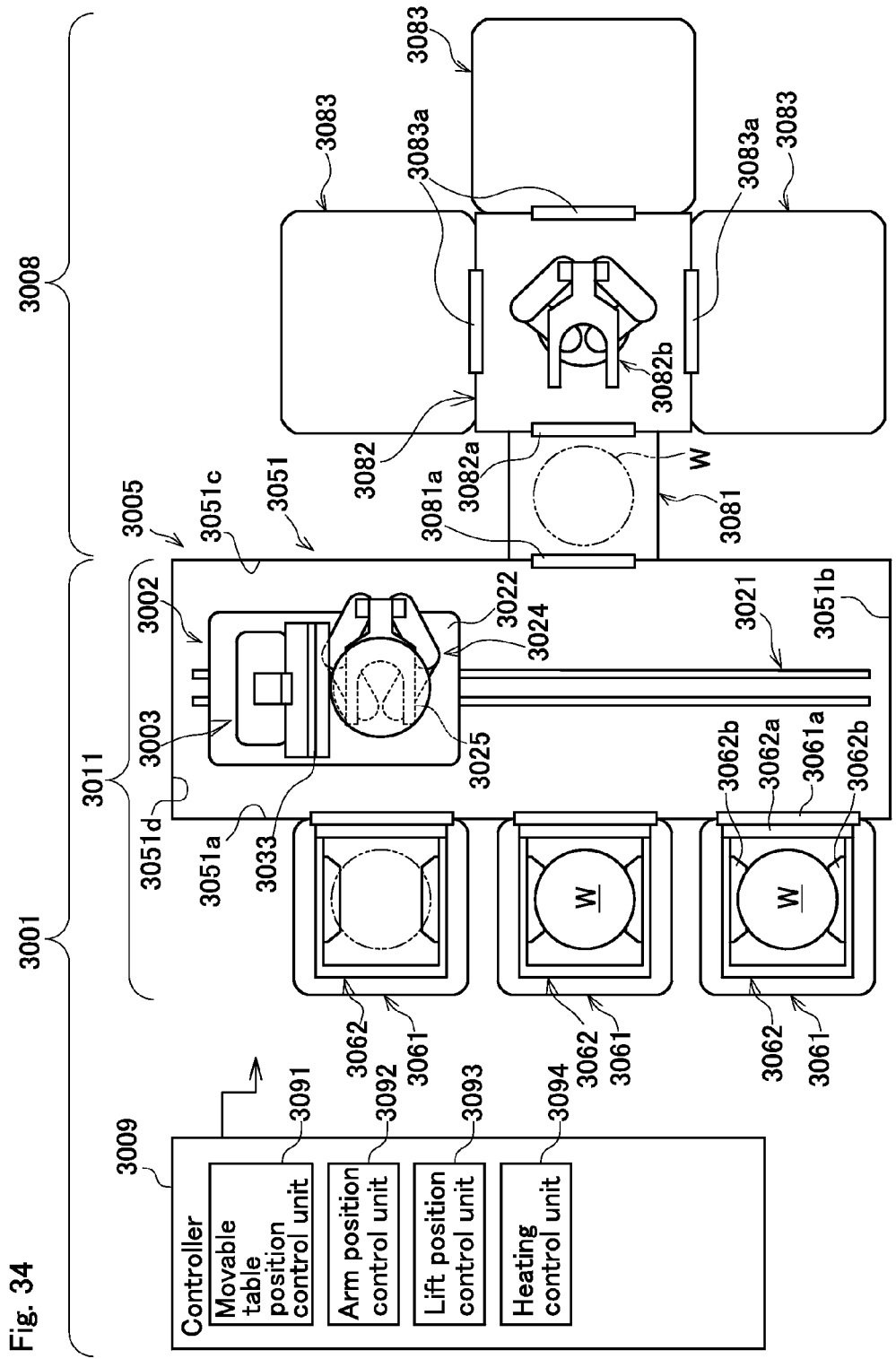
FIG. 34 is an explanatory diagram showing a state that a pick returns onto the movable table from the state of FIG. 33.

From this state, the arm position control unit 3092 contracts the transport arm 3024, thereby, as shown in FIG. 34, moving the pick 3025 and the wafer W mounted thereon to a position on the base 3023 opposite to the heater 3033. The heater 3033 is configured to be extended in the direction of moving the wafer W by the transport arm. Therefore, while the transport arm takes out the wafer W from the FOUP 3062, and moves the wafer to a position on the base 3023, the heating control unit 3094 energizes the heater 3033, and it is possible to heat the wafer W while moving under the heater 3033. This secures further the heating time. When it takes the time to raise the temperature of the heater 3033, the start of energization of the heater 3033 may be hastened in anticipation of the temperature raising time.

After taking out the wafer W from the FOUP 3062, the door 3061a of the load port 3061 and the lid 3062a of the FOUP 3062 are closed to keep the interiofd of the FOUP 3062 as clean as possible. To compensate for the nitrogen flowed out from the FOUP 3062, it is preferable to supply new nitrogen gas to the FOUP 3062 through the load port 3061.

Figure 35:
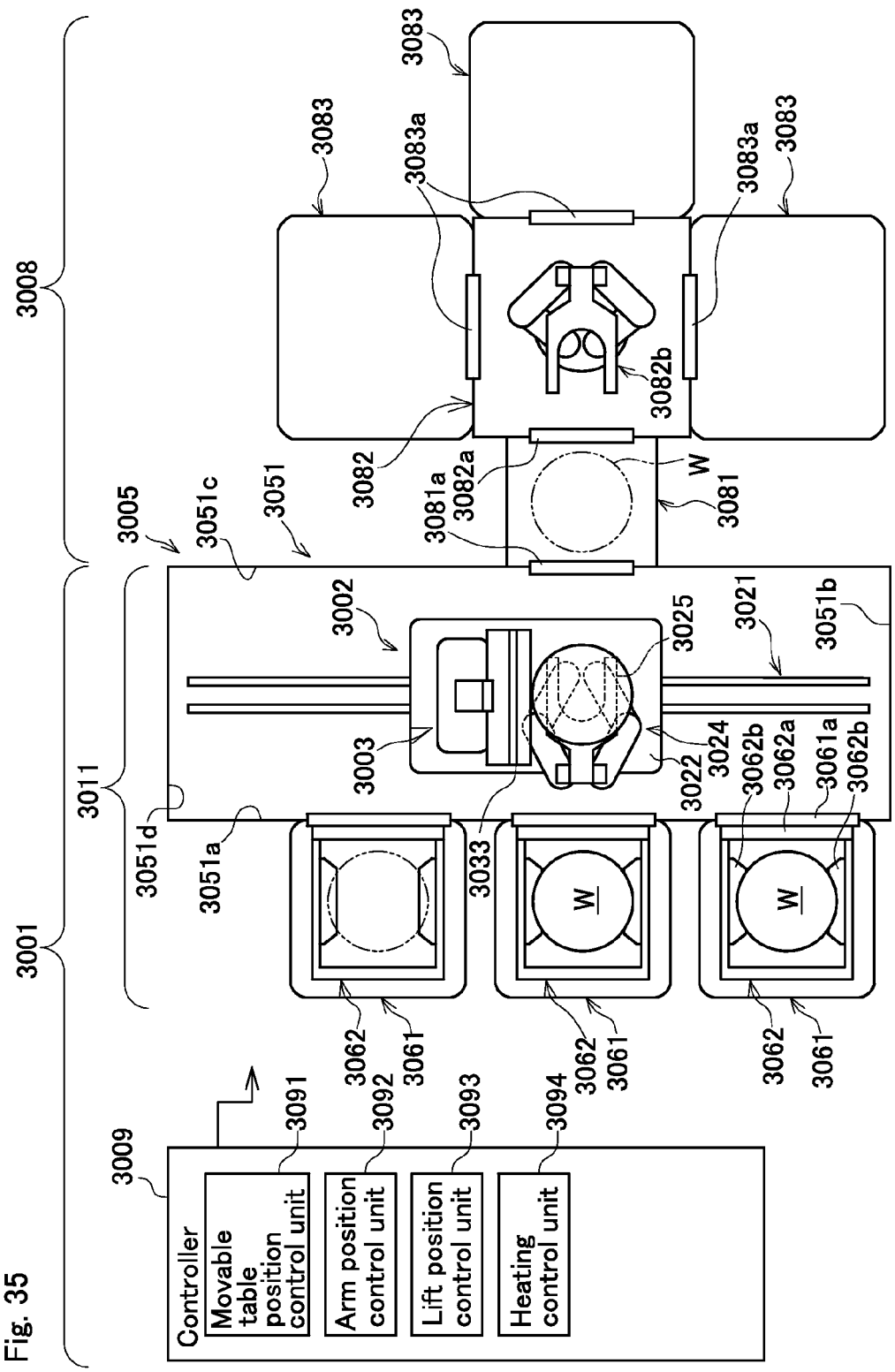
FIG. 35 is an explanatory diagram showing a state that a pick moves to the front of a load lock chamber from the state of FIG. 34.

While the heater 3033 continues heating, as shown in FIG. 35, the movable table 3022 moves based on the driving instruction from the movable table position control unit 3091, the arm position control unit 3092 changes the direction of the transport arm 3024, and the transport arm 3024 is opposed to the load lock chamber 3081. It is permitted to move the movable table 3022 simultaneously with changing the direction of the transport arm 3024. While moving the movable table 3022 and changing the direction of the transport arm 3024, the heater 3033 heats the surface of the wafer W, thereby increasing the temperature of the wafer W sufficiently to remove the moisture adhered to the surface. When enough heating is made at a midpoint of moving, the heater 3033 may stop heating the wafer W halfway, or the current value may be decreased to reduce the heating amount per unit time. Of course, when it is necessary to increase the temperature of the wafer W or to ensure the heating time, it is allowed not to move to the next operation until the predetermined amount of heating is made in the state that the wafer W is moved to under the heater 3033. To strictly manage the temperature of the wafer W, a non-contact temperature detector may be provided at a position opposite to the wafer W or a contact-type temperature detector may be provided in the pick 3025, and the controller 3009 may perform the control based on the temperature data detected by these temperature detectors.

Figure 36:
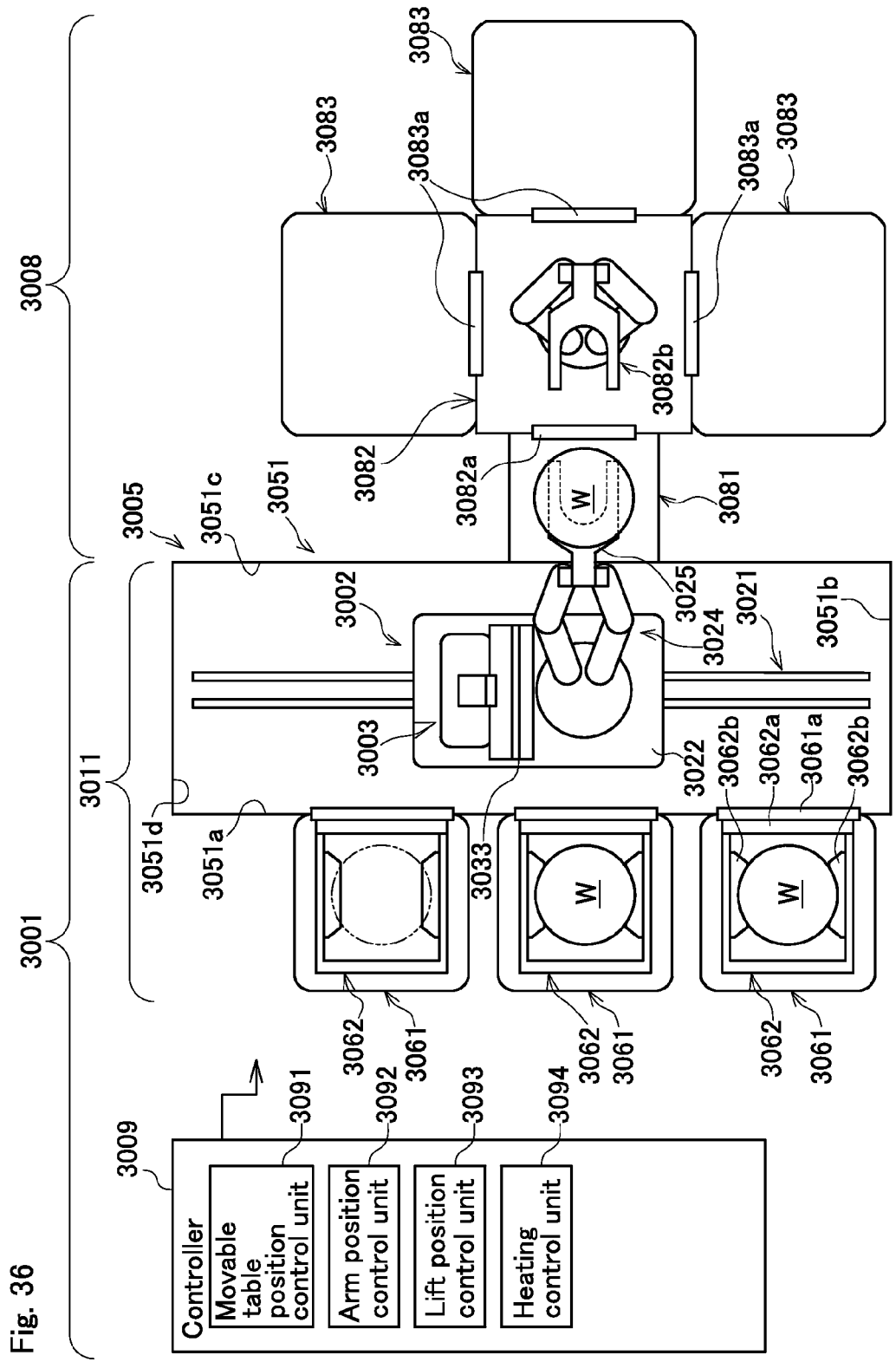
FIG. 36 is an explanatory diagram showing a state that a pick enters a load lock chamber from the state of FIG. 35.

From the above state, as shown in FIG. 36, the door 3081a (refer to FIG. 35) of the load lock chamber 3081 is opened, the transport arm 3024 extends into the load lock chamber 3081 based on the driving instruction from the arm position control unit 3092, and the pick 3025 and wafer W enter the load lock chamber 3081. Further, by the instruction from the lift position control unit 3093, the transport arm 3024 moves down, and the wafer W is transferred from the pick 3025 to a not-shown mounting base in the load lock chamber 3081.

As described above, by using the wafer transport apparatus 3002, the heater 3033 can heat the wafer W while the wafer is transported from the FOUP 3062 to the load lock chamber 3081. It is thus possible to remove moisture from the surface of the wafer W, suppress corrosion and oxidation of the wafer W due to moisture, and properly maintain the surface properties.

Further, when transporting the wafer W from the load lock chamber 3081 to the FOUP 3062, by performing the above operations in reverse, it is similarly possible to perform heating while transporting the wafer W. Thus, it is possible to remove moisture, suppress adhesion of new moisture, and optimize the surface properties of the wafer W.

Depending on the processing applied to the wafer W in the processing unit 3008, the heater 3033 is used for a heating process performed as pre-processing or post-processing, thereby optimizing the surface properties of the wafer W. In particular, when the processing temperature is high in the processing apparatus 3008, the wafer W is heated in advance, and it is thereby possible to reduce the processing time in the processing unit 3088, and increase the processing speed. When corrosive gas and contaminants or the likes are adhered to the surface of the wafer W by the processing of the processing apparatus 3008, it is possible to evaporate or remove them by heating the wafer W. Further, the surface state may be stabilized by heating as post-processing. By using as above, it is possible to reduce the processing time of the processing apparatus 3008, and reduce the installation space of the entire equipment including the processing apparatus.

As described above, the wafer transport apparatus 3002 as a substrate transport apparatus in this embodiment comprises the movable table 3022 as a base that is movable along the guide rail 3021 configuring a predetermined track, the transport arm 3024 that is indirectly supported on the movable table 3022, and holds and transport the wafer W as a substrate; and the heater 3033 that is supported on the movable table 3022, and arranged at a position able to oppose to the transport arm 3024, wherein when the transport arm 3024 transports the wafer, the heater 3033 can heat the surface of the wafer W.

In such a configuration, while transporting the wafer W, the heater 3033 can heat the wafer W held on the transport arm 3024, and it is thus possible to remove the moisture adhered to the surface of the wafer W, and suppress a change in the surface properties of the wafer W. Further, it is possible to use as a heating process before and after the processing applied to the wafer W in the processing apparatus 3008 as a transport destination, and it is possible to reduce the processing time of the wafer W, and reduce the installation space of the processing apparatus 3008.

Further, the heater 3033 is configured to extend along the wafer W moving direction of the transport arm 3024, and it is possible to efficiently heat the wafer W during transport.

Further, the wafer transport apparatus 3002, and the housing 3051 that lid the wafer transport apparatus are provided. The load port 3061 and the load lock chamber 3081, as transfer positions for transferring the wafer W, are set adjacent to the wall surfaces 3051a and 3051b of the housing 3051. Therefore, the EFEM 3001 is effectively configured. According to the EFEM 3001, the wafer transport apparatus 3002 provided in the housing 3051 heats the surface of the wafer, and removes the moisture during transport, thereby stabilizing the surface properties. When a heating process necessary before and after the processing applied to the wafer W, it is easily possible to perform it without adding special equipment.

Eleventh Embodiment

Figure 38:
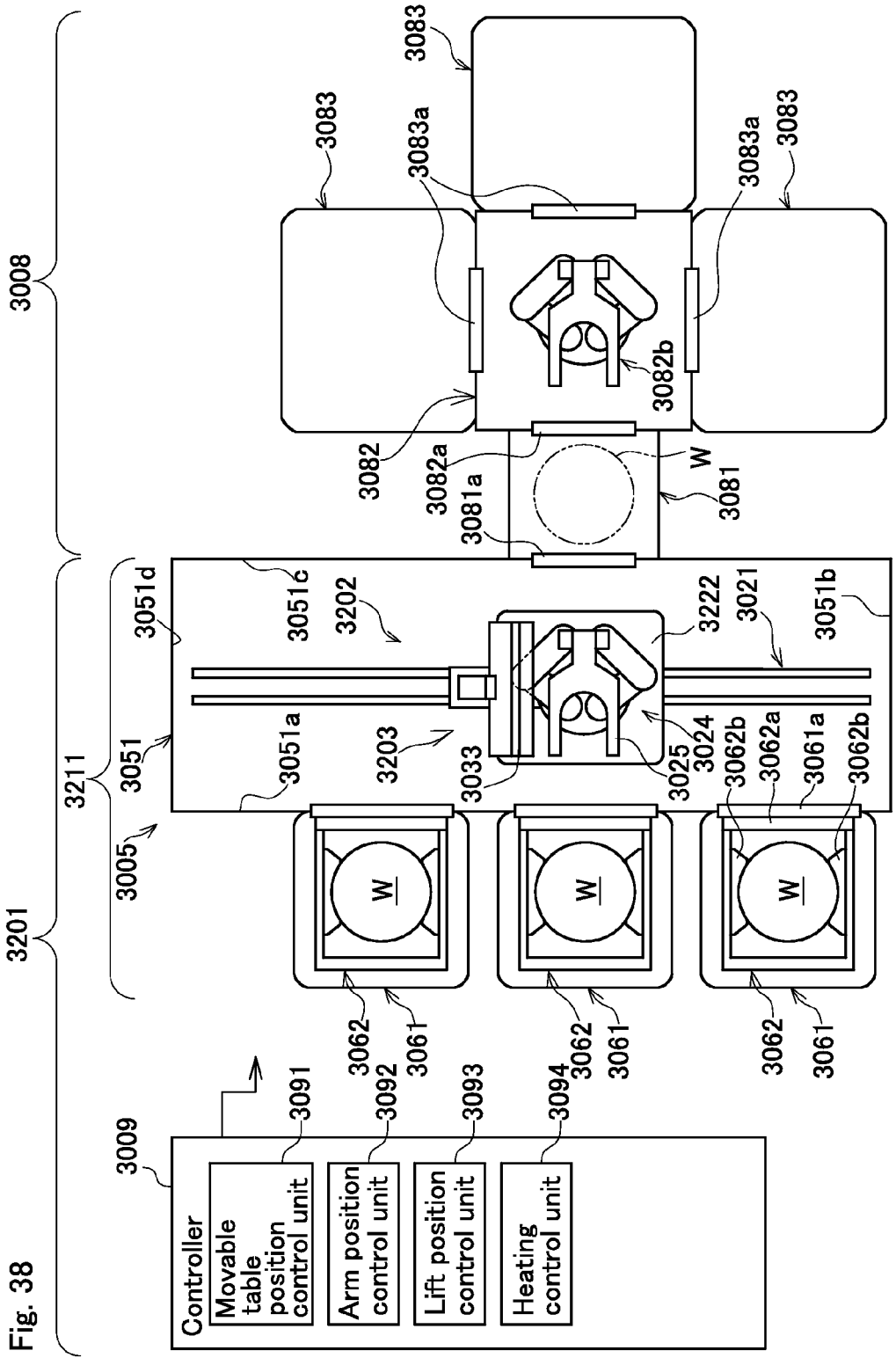
FIG. 38 is an explanatory diagram showing a relationship between an EFEM comprising a substrate transport apparatus according to an eleventh embodiment of the invention, and a processing apparatus.

FIG. 38 is a schematic diagram showing a wafer transport apparatus 3202 as a substrate transport apparatus of the eleventh embodiment, and an EFEM 3201 provided with the same. In this diagram, the same parts as the tenth embodiment are denoted by the same reference numerals, and a description thereof will be omitted.

The EFEM 3201 comprises a main body 3211, and a controller 3009 that controls the same. The wafer transport apparatus 3202 constituting the main body 3211 comprises a transport arm 3024 and a heating means 3203. The wafer transport apparatus 3202 in this embodiment is, compared with the tenth embodiment, different in the structure of mounting the heating means 3203 on the movable table 3222.

Figure 39:
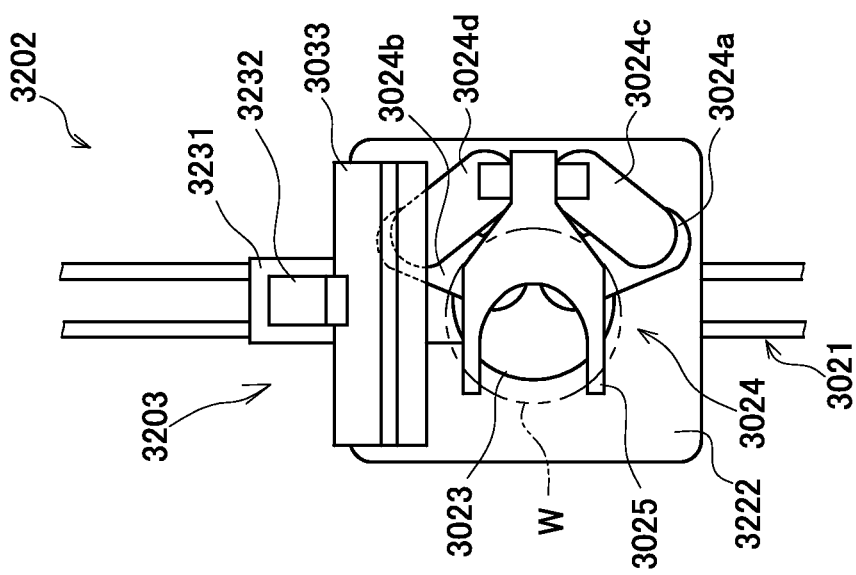
FIG. 39 is an explanatory diagram showing a state that an essential part of the substrate transport apparatus is seen from a plane.
Figure 40:
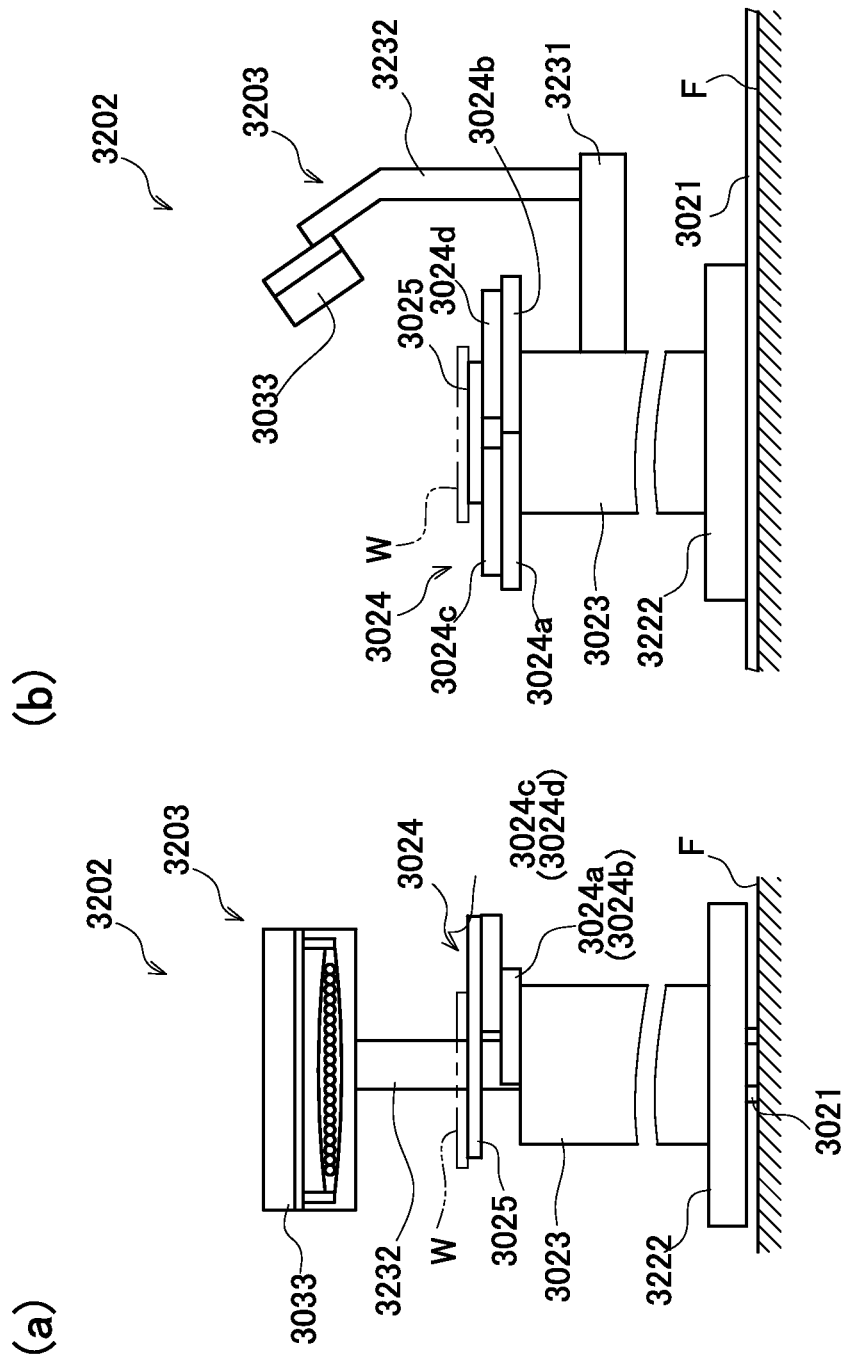
FIGS. 40(a) and (b) are explanatory diagrams showing a state that an essential part of a substrate transport apparatus is seen from a front and a side.

The concrete structure is shown in FIG. 39 and FIG. 40. FIG. 39 is a plan view showing an enlarged essential part. FIG. 40 (a) is a front view. FIG. 40 (b) is a side view. As shown in these drawings, in this embodiment, the movable table 3222 is made smaller than that in the tenth embodiment, and constructed in a substantially square shape in a plan view. A base 3023 is provided in the central part thereof. A support base 3231 is provided directly on the back side of the base 3023 so as to extend in a horizontal direction. A support arm 3232 stands on the support base. The upper part of the support arm 3032 is bent substantially into a dogleg shape toward above the transport arm 3024 so that the heater 3033 at the upper end can face the wafer W held on the transport arm 3024. In such a configuration, the heater 3033 is supported by the base 3023 via the support arm 3232, and indirectly supported by the movable table 3222 via the base 3023.

Even in such a configuration, it is possible to obtain the same effects as the tenth embodiment. Further, as the support arm 3232 moves vertically along with the vertical movement of the base 3023, even when the base 3023 is moved vertically, the relative positions of the wafer W and the heater 3033 do not change, the heating is possible under the same conditions, and the heating conditions can be easily set.

Twelfth Embodiment

Figure 41:
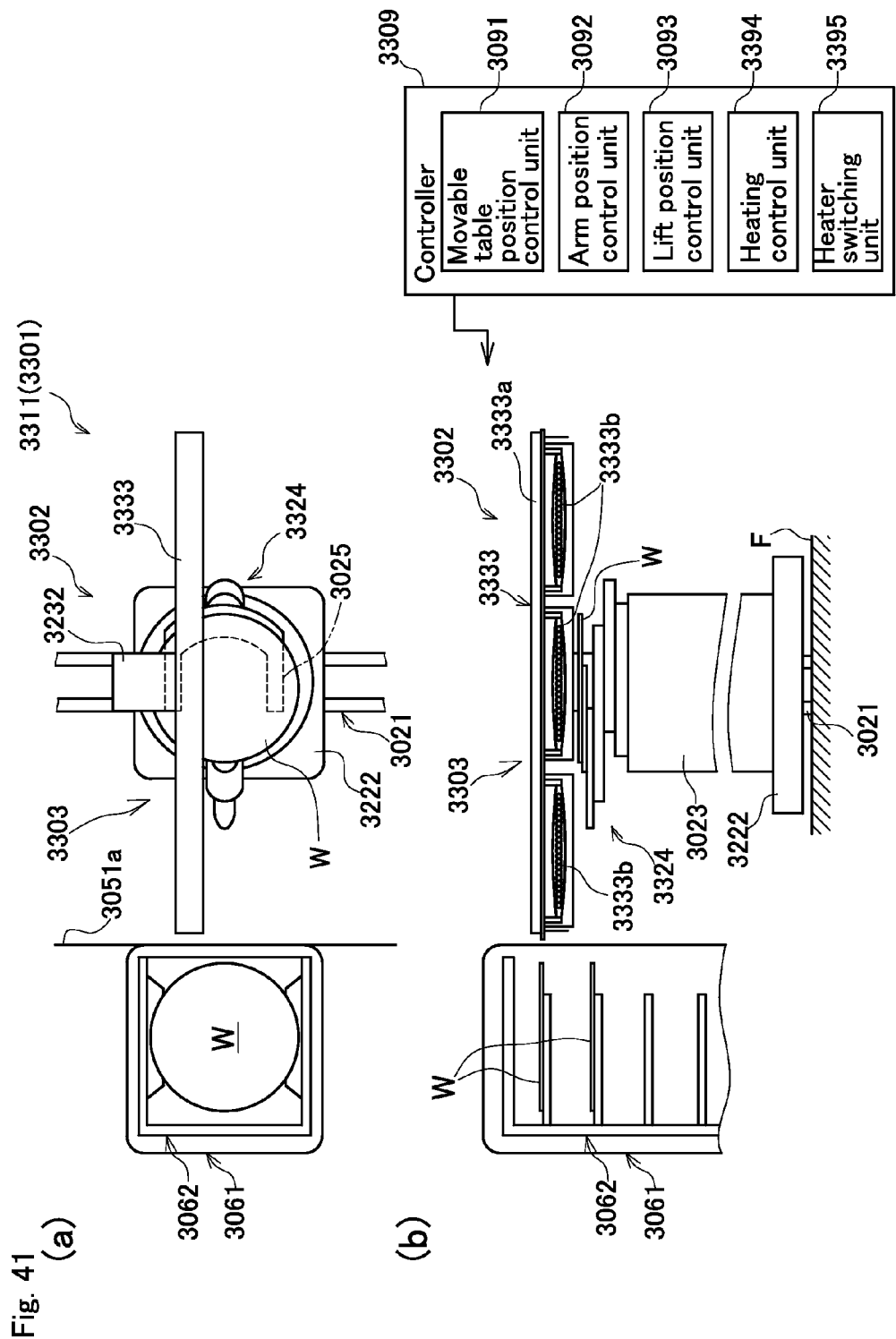
FIGS. 41(a) and (b) are explanatory diagrams showing a state that an essential part of a substrate transport apparatus according to a twelfth embodiment of the invention is seen from a plane and a front.
Figure 42:
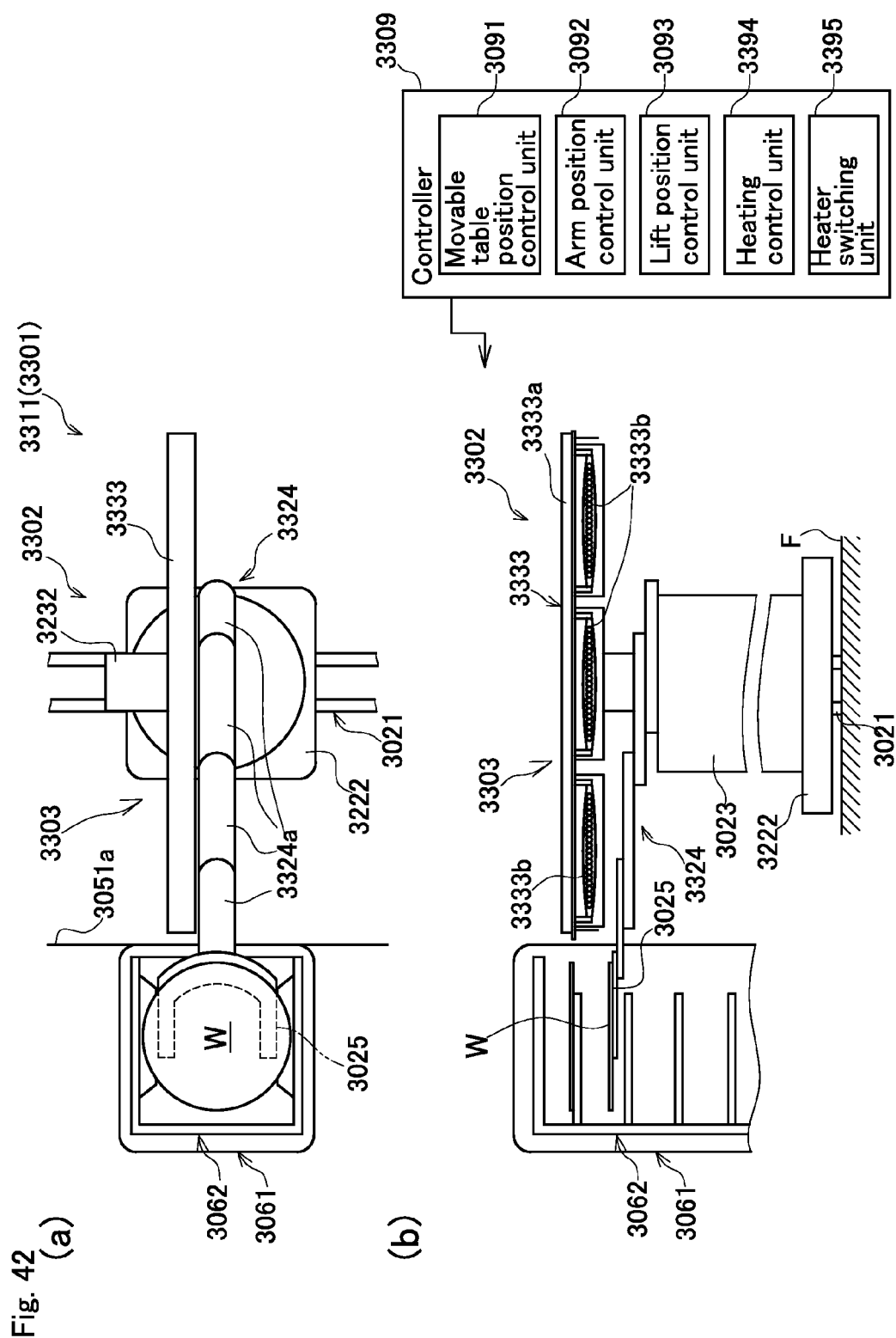
FIGS. 42(a) and (b) are explanatory diagrams showing a state that a pick enters a FOUP from the state of FIG. 41.

FIG. 41 and FIG. 42 are schematic diagrams showing a wafer transport apparatus 3302 as a substrate transport apparatus of the twelfth embodiment. It is possible to configure an EFEM 3301 based on this as in the tenth and eleventh embodiments. FIG. 41 (a) and FIG. 42 (a) are plan views showing an enlarged essential part. FIG. 41 (b) and FIG. 42 (b) are front views of them, showing the relationship with a controller 3309. In these drawings, the same parts as the tenth and eleventh embodiments are denoted by the same reference numerals, and a description thereof will be omitted.

The EFEM 3301 comprises a main body 3311, and a controller 3309 that controls the same. The wafer transport apparatus 3302 constituting the main body 3311 comprises a transport arm 3324 and a heating means 3303. The transport apparatus 3324 in this embodiment is sequentially connected to a plurality of arm elements 3324a, and configured as a multistage sliding arm robot provided with a pick 3025 in the end portion. The arm elements 3324a are configured slidable each other. The entire transport arm 3324 can be extended or contracted by giving a driving instruction to a not-shown actuator for driving them from the arm position controller 3092. Of course, it is no problem to use the transport arm 3025 (refer to FIG. 30) used in the tenth embodiment, instead of the transport arm 3324.

This embodiment is characterized in that the shape of the heater 3333 constituting the heating means 3303 is different compared with the tenth and eleventh embodiments. The support structure comprising the support arm 3233 and the likes for supporting the heater 3333 is the same as the eleventh embodiment.

The heater 3333 is formed in a shape extending in a direction the pick 3025 moves as the transport arm 3324 extends, that is a direction perpendicular to the guide rail 3021, and projects largely from the movable table 3222 in a plan view with one end close to the housing wall 3051a of the load port 3061 side. Although omitted in the drawing, the other end of the heater 3333 extends to a position close to the housing wall 3051c (refer to FIG. 29) of the load lock chamber 3081 side.

Thus, the main body 3333a constituting the heater 3333 has a length slightly shorter than the distance between the opposite housing walls 3051a and 3051c (refer to FIG. 29), and contains three heating lamps 3333b as heaters arranged side by side in the extending direction. Each heating lamp 3333b generates heat by a current supplied from the heating control unit 3394 constituting the controller 3309. The controller 3309 is provided with a heater switching unit 3395 for switching the heating lamp 3333b to be supplied with a current from the heating control unit 3394.

By configuring as above, as shown in FIG. 42, the pick 3025 enters the FOUP 3062, and takes out the wafer W from the FOUP 3062, and the heater 3333 can heat the wafer W immediately after being taken out. Since the heating can be continued while the wafer W is being transported along with the contraction of the transport arm 3324, it is possible to efficiently heat the wafer W by reducing the time that moisture adheres to the wafer W. Further, as the heater 3333 extends also to the load lock chamber 3081 (refer to FIG. 29), it is possible to continue the heating until immediately before the wafer W enters the load lock chamber 3081. These points are the same in the case where the wafer is taken out the load lock chamber 3081 and placed in the FOUP 3062. Since the wafer W can be heated in most of the time for transporting the wafer W between the FOUP 3062 and the load lock chamber 3081, it is possible to shorten the time by omitting waste time.

Further, since the heating switching unit 3395 switches the heating lamps 3333b to be supplied with a current depending on the operation of the transport arm 3324, when transporting the wafer W between the FOUP 3062 and the load lock chamber 3081, it is possible to reduce the consumption of energy while properly heating the wafer W.

Even in the above configuration, it is possible to obtain the same effects as the tenth and eleventh embodiments.

In particular, since the heater 3333 is configured to extend longer along the wafer W moving direction of the transport arm 3324, it is possible to heat the wafer more efficiently when transporting the wafer W.

Further, in the wafer transport apparatus 3302 as a substrate transport apparatus in this embodiment, the heater 3333 comprises the heating lamps 3333b as a plurality of heat generating parts that generate heat when energized, and the heating lamp 3333b to be energized can be switched depending on the wafer movement of the transport arm 3324. Thus, it is possible to efficiently heat the wafer W while saving the energy.

Thirteenth Embodiment

Figure 43:
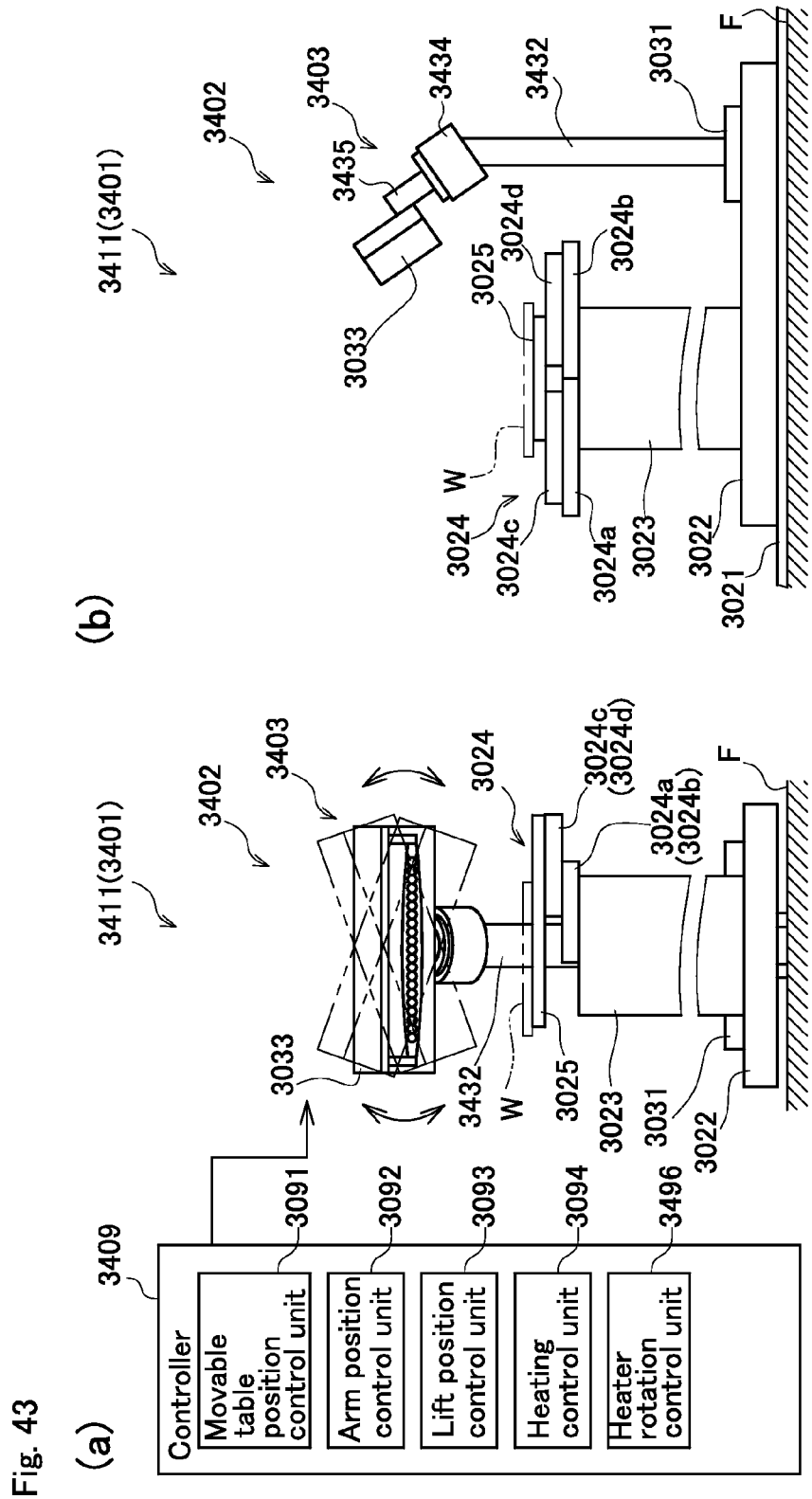
FIGS. 43(a) and (b) are explanatory diagrams showing a state that an essential part of a substrate transport apparatus according to a thirteenth embodiment of the invention is seen from a front and a side.

FIG. 43 is a schematic diagram showing a wafer transport apparatus 3402 as a substrate transport apparatus of the thirteenth embodiment. It is possible to configure an EFEM 3401 based on this apparatus as in the tenth to twelfth embodiments. FIG. 43 (a) shows the state of the apparatus viewed from a front, showing the relationship with a controller 3409. FIG. 43 (b) is a side view of the apparatus. In these drawings, the same parts as the tenth to twelfth embodiments are denoted by the same reference numerals, and a description thereof will be omitted.

The EFEM 3401 comprises a main body 3411, and a controller 3409 that controls the same. The wafer transport apparatus 3402 constituting the main body 3411 comprises a transport arm 3024 and a heating means 3403. The wafer transport apparatus 3402 in this embodiment is, compared with the tenth embodiment, different in the structure of mounting the heating means 3403 on the movable table 3022.

In particular, a support base 3031 is provided on a movable table 3022. A column 3432 stands on the support base 3031. In the upper part of the column, a rotation mechanism 3434 is provided obliquely at a predetermined angle. A support arm 3435 is provided to project from the rotation mechanism 3434 to be rotatable about its center axis. The heater 3033 is supported at the end of the support arm 3435. The column 3432, the rotation mechanism 3434, and the support arm 3435 are bent to substantially a dogleg shape in a plan view, and configured so that the heater 3033 can face a wafer W held on a pick 3025 at the end of the transport arm 3024.

The rotation mechanism 3434 includes a not-shown actuator, and can change the rotation angle of the support arm 3435 according to a driving instruction from a heater rotation control unit 3496 that constitutes the controller 3409. Thus, it is possible to change the direction of the heater 3033 as indicated by the arrow in the drawing.

Thus, it is possible to ensure the heating time of the wafer W even when a small heater 3033 is used, by changing the direction of the heater 3033 interlocking with the wafer W movement of the transport arm 3024 so as to face the heater 3033 to the wafer W.

In the above configuration, it is possible to obtain the same effects as the tenth and eleventh embodiments.

Further, in the wafer transport apparatus 3402 as a substrate transport apparatus in this embodiment, the heater 3033 is configured to be able to change the direction depending on the wafer W movement of the transport arm 3024. Thus, it is possible to heat the wafer W more efficiently when transporting the wafer W.

Fourteenth Embodiment

Figure 44:
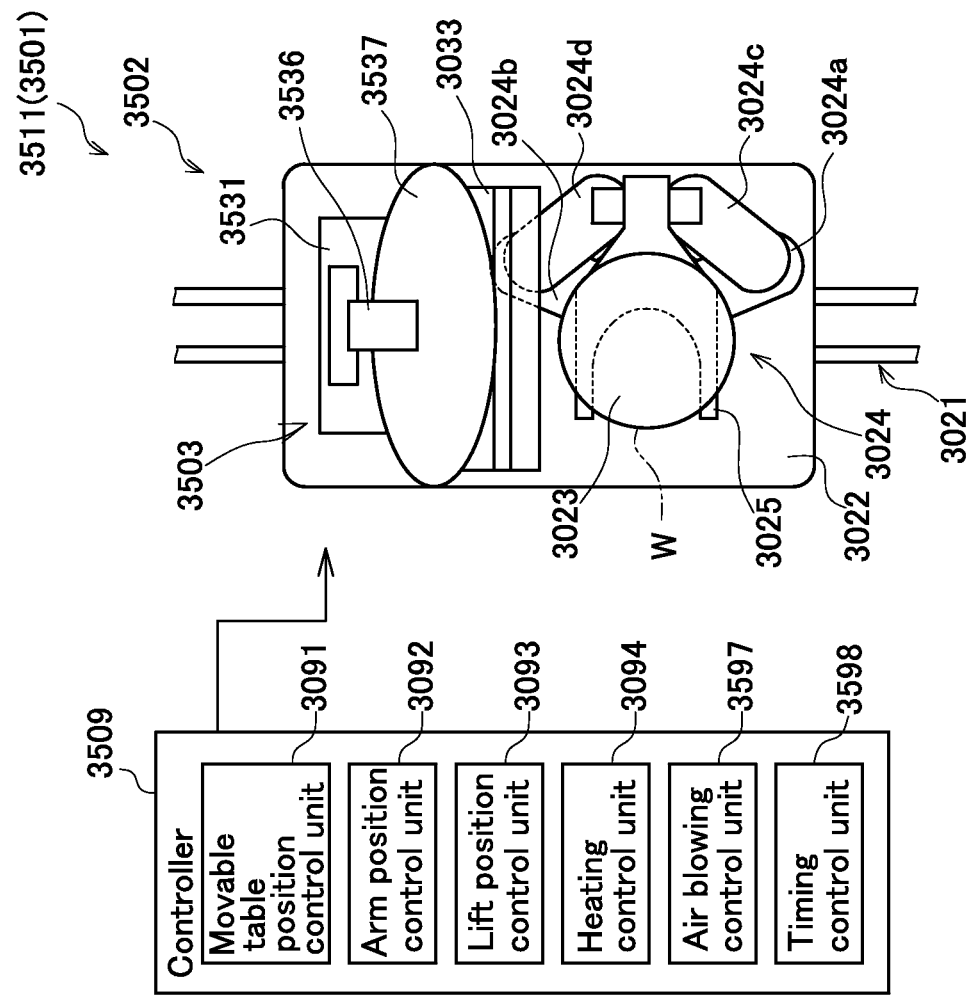
FIG. 44 is an explanatory diagram showing a state that an essential part of a substrate transport apparatus according to a fourteenth embodiment of the invention is seen from a plane.
Figure 45:
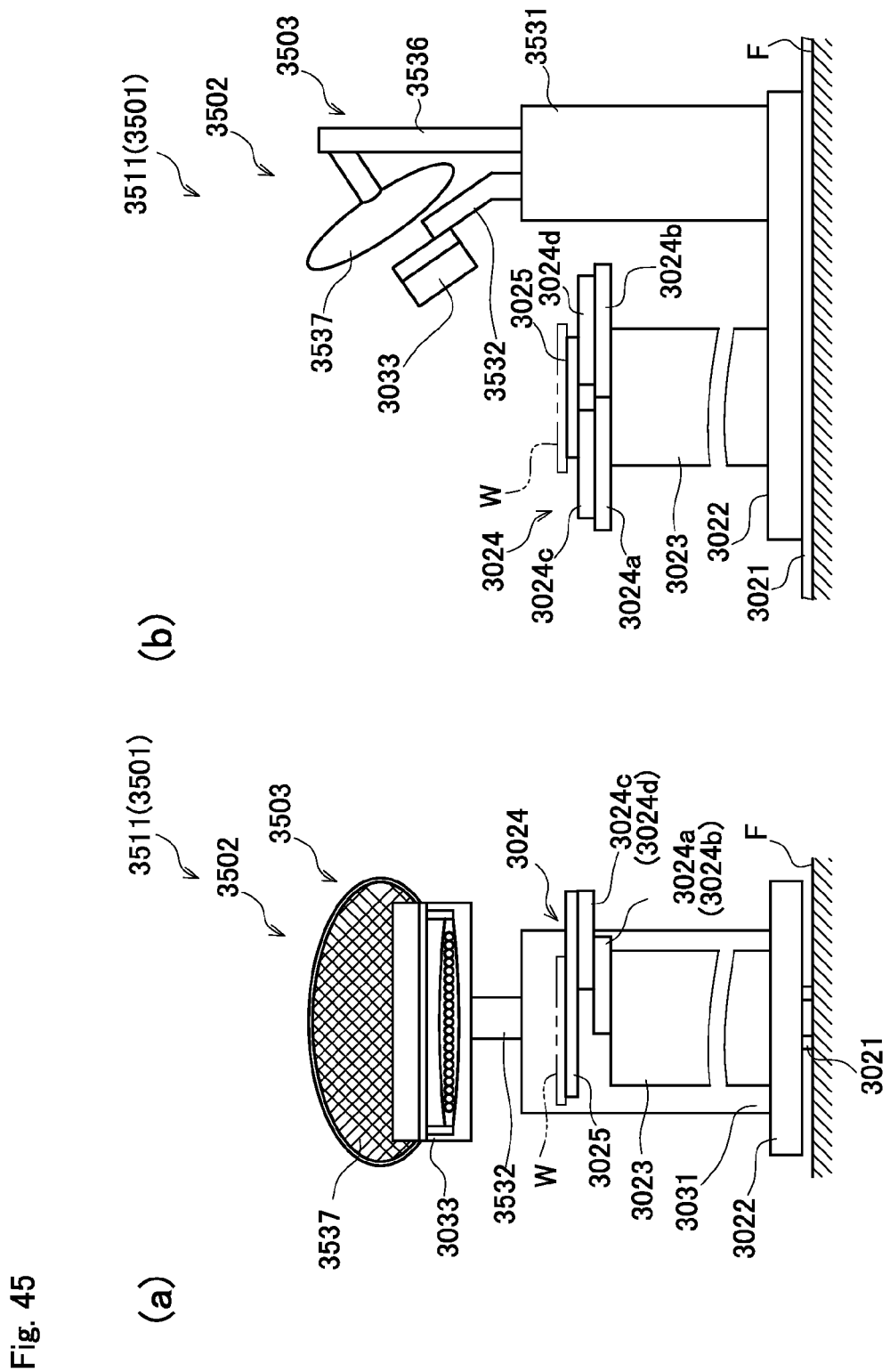
FIGS. 45(a) and (b) are explanatory diagrams showing a state that an essential part of the substrate transport apparatus is seen from a front and a side.

FIG. 44 and FIG. 45 are schematic diagrams showing a wafer transport apparatus 3502 as a substrate transport apparatus of the fourteenth embodiment. It is possible to configure an EFEM 3501 based on this apparatus as in the tenth to thirteenth embodiments. FIG. 44 shows the state of the apparatus viewed from a front, showing the relationship with a controller 3509. FIG. 45 (a) is a front view of the apparatus. FIG. 45 (b) is a side view of the apparatus. In these drawings, the same parts as the tenth to thirteenth embodiments are denoted by the same reference numerals, and a description thereof will be omitted.

The EFEM 3501 comprises a main body 3511, and a controller 3509 that controls the same. The wafer transport apparatus 3502 constituting the main body 3511 comprises a transport arm 3024 and a heating means 3503. The wafer transport apparatus 3502 in this embodiment is, compared with the tenth embodiment, different in the configuration of the heating means 3503.

In particular, a support base 3531 is provided on a movable table 3022. A support arm 3532 stands on the support base 3531. The heater 3033 is supported at the end of the support arm. A support arm 3532 is bent to substantially a dogleg shape in a plan view, and configured so that the heater 3033 can face a wafer W held on a pick 3025 at the end of the transport arm 3024.

A support arm 3536 is provided on the support base 3531. At the end of the support arm 3536, a blowing fan 3537 is provided as a blowing means. The blowing fan 3537 is elliptical with almost the same entire length as the heater 3033, and arranged with the longitudinal direction aligned with the extending direction of the heater 3033, so as to be able to face the transport arm 3024 across the heater 3033. By configuring so, it is possible to blow gas toward the wafer W held by the transport arm 3024 from behind the heater 3033.

In addition to the heating of the heater 3033, the blowing fan 3537 blows gas to the wafer W, thereby increasing the moisture removal effect from the wafer W. At the same time, by uniformizing the atmosphere around the wafer W, it is possible to improve the efficiency of heating the wafer W, and uniformize the temperature of the surface of the wafer W.

Further, the blowing fan 3537 can supply gas to the wafer W when connected to a gas supply source provided outside. By using a nitrogen gas as the gas, it is possible to further improve the moisture removal effect, and maintain the surface properties of the wafer W more properly by eliminating the residual gas of the processing apparatus 3008. Of course, it is possible to change the gas to be supplied depending on processing steps.

The blowing fan 3537 is controlled based on an operation instruction from a blowing control unit 3597 that constitutes the controller 3509. The blowing control unit 3597 can control the gas flow rate, and control on/off of the supply of gas from the outside, in addition to start and stop of the operation. The controller 3509 is provided with a timing control unit 3598 that controls the operation timing of the heater 3033 by the heating control unit 3094, and the operation timing of the blowing fan 3537 by the blowing control unit 3597. The timing control unit 3598 gives an operation instruction to the heating control unit 3094 and the blowing control unit 3597 to perform heating the wafer W, gas blowing to the wafer W, and supply the gas at the predetermined timing based on the timing data stored inside. The heating control unit 3094 and the blowing control unit 3597 start or stop the control, or change the control contents according to the given operation instruction, thereby enabling the interlocked control.

By the interlock control, it is possible to heat the wafer W and supply the gas at the timing suitable for the wafer W and the processing contents of the processing apparatus 3008 (refer to FIG. 29), thereby maintaining the surface properties of the wafer W more properly. Further, as the apparatus can be used for pre-processing or post-processing depending on processing steps, it is also possible to improve the processing efficiency.

Even configuring as above, it is possible to obtain the same effects as the tenth and eleventh embodiments.

In the wafer transport apparatus 3502 as a substrate transport apparatus in this embodiment, the blowing fan 3537 as a blowing means is provided at the position able to face the transport arm 3024 across the heater 3033, and it is possible to improve the efficiency of heating the wafer W, and uniformize the atmosphere around the wafer W, and uniformize the temperature of the wafer.

Further, the blowing fan 3537 is configured to be able to supply the gas obtained from a gas supply source to the transport arm 3024, and it is possible to optimize the surface properties of the wafer W more properly as well as hating by the heater 3033.

Since the heater 3033 and the timing control unit 3598 for controlling the operation timing of the blowing fan 3537 are provided, it is possible to optimize the surface properties of the wafer W more properly, while saving the energy, by performing the heating of the heater 3033 and the gas supply of the blowing fan 3537 at an appropriate timing.

The concrete configuration of each part is not limited only to the aforementioned embodiments.

For example, in the tenth to fourteenth embodiments, the wafer W is transported between the FOUP 3062 provided in the load port 3061 and the load lock chamber 3081. It is possible to transfer the wafer between the FOUPs 3062.

Further, in the tenth to fourteenth embodiments, the guide rail 3021 constituting a predetermined track is linearly formed, and the movable table 3022 is linearly moved along the guide rail. The shape of the guide rail 3021 is not limited to this. A plurality of straight lines and curves may be combined to move the movable table 3022 in other directions. By arranging the guide rail 3021 to extend in a vertical direction, the movable table 3022 can be moved in a vertical direction. When the moving direction of the movable table 3022 can be controlled, it is possible to configure the track not only by the guide rail 3021, but also by the other means such as a guide roller and a wire.

Based on the wafer transport apparatus 3402 in the thirteenth embodiment, instead of changing the direction of the heater 3033 along with the movement of the wafer W, it is possible to move the heater 3033 while maintaining the state facing the wafer W. Further, the same effect can be obtained by configuring to be able to move the heater 3033 and change the direction thereof.

In the fourteenth embodiment, a nitrogen gas is used as the gas to be supplied to the wafer W. It is possible to use various types of gas such as air and ozone depending on the processing. It is also possible to use clean air with a higher degree of cleanliness than the inside of the wafer transport chamber 3005.

Further, in the tenth to fourteenth embodiments, the heaters 3033 and 3333 are configured of a heating lamp and a heating wire as a device for heating an object. It is possible to use the other heat sources such as a ceramic heater, a heating element, or hot air to be introduced from the outside, or the like. Even in such a case, it is possible to obtain the effects similar to the aforementioned effects.

In the tenth to fourteenth embodiments, a wafer W is assumed as a substrate. The embodiments of the invention are applied to a substrate transport apparatus that handles various precision processed products such as a glass substrate.

The other configurations may be variously modified without departing from the scope of the invention.

DESCRIPTION OF REFERENCE NUMERALS

1 EFEM
2 Wafer transport apparatus
3 Housing
4-4 Load port
6 Processing apparatus
7 FOUP
8 Partition member
9 Wafer transport chamber
10 Gas feedback path
11 Gas delivery port
12 Gas suction port
13 FFU
13a Fan (First blowing means)
13b Filter
14 Chemical filter
15 Fan (Second blowing means)
16 Gas supply means
17 Gas discharge means
31 Front wall
32 Rear wall
31a, 32a Opening
W Wafer

What is claimed is:
1. An EFEM comprising:
a load port;

a load lock chamber including a processing apparatus;
a wafer transport chamber having a space inside a housing, the wafer transport chamber communicating with the load port through a first opening provided on a first side wall of the housing, and the wafer transport chamber communicating with the load lock chamber through a second opening provided on a second side wall of the housing;
a wafer transport apparatus provided in the wafer transport chamber, the wafer transport apparatus having a base part having a driving mechanism, the base part provided on the first wall, the base part moving inside the wafer transport chamber, the wafer transport apparatus transporting a wafer between a FOUP mounted on the load port and the load lock chamber;
a gas delivery port provided in an upper part of the wafer transport chamber, the gas delivery port delivering gas to the wafer transport chamber;
a gas suction port provided in a lower part inside the wafer transport chamber, the gas suction port sucking the gas in the wafer transport chamber;
a gas feedback path provided in the housing, the gas feedback path feeding back the gas taken in through the gas suction port to the gas delivery port; and
a filter provided in the gas delivery port, the filter eliminating particles included in the gas,
wherein the gas feedback path is provided in an area inside the housing, the area located between the second side wall having the second opening and a partition member provided inside the second wall, the area located outside an operating area of the wafer transport apparatus, and the area separated from the wafer transport chamber by the partition member,
wherein the gas in the wafer transport chamber is circulated by generating a downward gasflow in the wafer transport chamber and feeding back the gas through the gas feedback path.

2. The EFEM according to claim 1, wherein the housing includes columns that supports the first and second walls of the housing from the inside of the housing, and a part of the gas feedback path is formed by using the second wall, the column and the partition member.

3. The EFEM according to claim 2, wherein:
the first opening that connects the load port and the second opening that connects the load lock chamber of the processing apparatus are provided at opposite positions in the housing, and
the gas feedback path is configured to continue to the gas delivery port from the gas suction port via both sides of the second opening that connects the load lock chamber of the processing apparatus.

4. The EFEM according to claim 3, wherein a first blowing unit is connected to the gas delivery port, a second blowing unit is connected to the gas suction port, the first blowing unit sends gas to the wafer transport chamber through the gas delivery port, and the second blowing unit sucks the gas in the wafer transport chamber through the gas suction port.

5. The EFEM according to claim 4, further comprising a gas supply unit that supplies gas to the wafer transport chamber, and a gas discharge unit for discharging gas from the wafer transport chamber.

6. The EFEM according to claim 3, further comprising a gas supply unit that supplies gas to the wafer transport chamber, and a gas discharge unit for discharging gas from the wafer transport chamber.

7. The EFEM according to claim 3, wherein a chemical filter is provided in the gas suction port, and the gas in the wafer transport chamber flows into the gas feedback path through the chemical filter.

8. The EFEM according to claim 2, wherein a first blowing unit is connected to the gas delivery port, a second blowing unit is connected to the gas suction port, the first blowing unit sends gas to the wafer transport chamber through the gas delivery port, and the second blowing unit sucks the gas in the wafer transport chamber through the gas suction port.

9. The EFEM according to claim 8, further comprising a gas supply unit that supplies gas to the wafer transport chamber, and a gas discharge unit for discharging gas from the wafer transport chamber.

10. The EFEM according to claim 2, further comprising a gas supply unit that supplies gas to the wafer transport chamber, and a gas discharge unit for discharging gas from the wafer transport chamber.

11. The EFEM according to claim 2, wherein a chemical filter is provided in the gas suction port, and the gas in the wafer transport chamber flows into the gas feedback path through the chemical filter.

12. The EFEM according to claim 1, wherein a first blowing unit is connected to the gas delivery port, a second blowing unit is connected to the gas suction port, the first blowing unit sends gas to the wafer transport chamber through the gas delivery port, and the second blowing unit sucks the gas in the wafer transport chamber through the gas suction port.

13. The EFEM according to claim 12, further comprising a gas supply unit that supplies gas to the wafer transport chamber, and a gas discharge unit for discharging gas from the wafer transport chamber.

14. The EFEM according to claim 1, further comprising a gas supply unit that supplies gas to the wafer transport chamber, and a gas discharge unit for discharging gas from the wafer transport chamber.

15. The EFEM according to claim 1, wherein a chemical filter is provided in the gas suction port, and the gas in the wafer transport chamber flows into the gas feedback path through the chemical filter.

16. The EFEM according to claim 1, wherein the gas is an inert gas.

17. The EFEM according to claim 1, wherein the wafer transport apparatus is provided in the wafer transport chamber and directly below the gas delivery port.

* * * * *